(12) United States Patent
Shaikh et al.

(10) Patent No.: US 10,880,199 B2
(45) Date of Patent: Dec. 29, 2020

(54) DATA DRIVEN ORCHESTRATED NETWORK BEING RESPONSIVE TO ENVIRONMENTAL CONDITIONS USING A LIGHT WEIGHT DISTRIBUTED CONTROLLER

(71) Applicant: KN INSTALL SOLUTIONS (N.IRE) LIMITED, Tyrone (GB)

(72) Inventors: Nazneen Shaikh, Bangalore (IN); Murali Krishnan, Bangalore (IN); Girish Gulawani, Bangalore (IN)

(73) Assignee: DCB SOLUTIONS LIMITED

( * ) Notice: Subject to any disclaimer, the term of this patent is extended or adjusted under 35 U.S.C. 154(b) by 126 days.

(21) Appl. No.: 16/097,412

(22) PCT Filed: Apr. 28, 2017

(86) PCT No.: PCT/EP2017/060259
§ 371 (c)(1),
(2) Date: Oct. 29, 2018

(87) PCT Pub. No.: WO2017/186939
PCT Pub. Date: Nov. 2, 2017

(65) Prior Publication Data
US 2019/0166037 A1    May 30, 2019

Related U.S. Application Data

(63) Continuation of application No. PCT/EP2016/081921, filed on Dec. 20, 2016, and a
(Continued)

(51) Int. Cl.
*G06F 16/11*    (2019.01)
*H04L 12/24*    (2006.01)
(Continued)

(52) U.S. Cl.
CPC ............ *H04L 45/02* (2013.01); *G06F 16/122* (2019.01); *H03M 13/373* (2013.01);
(Continued)

(58) Field of Classification Search
CPC ......... H04L 29/00; H04L 29/06; H04L 29/12; H04L 9/00; H04L 9/32; H04L 43/16;
(Continued)

(56) References Cited

U.S. PATENT DOCUMENTS 9,038,151 B1 *  5/2015  Chua ..................... H04L 63/02
                                                    726/6
9,111,221 B1 *  8/2015  Kelly ..................... G08B 5/22
(Continued)

FOREIGN PATENT DOCUMENTS

WO    2015071888 A1    5/2015

OTHER PUBLICATIONS

International Search Report and Written Opinion for corresponding International Application No. PCT/EP2017/060259, dated Jul. 27, 2017.

*Primary Examiner* — Mohamed A Kamara
(74) *Attorney, Agent, or Firm* — Tarolli, Sundheim, Covell & Tummino LLP

(57) ABSTRACT

A computer implemented method for controlling a device on a software defined network (SDN) in response to environmental data. The method comprises receiving environmental data. A master SDN controller is provided for controlling the SDN network. Control data is generated by the master SDN controller in response to the environmental data. A co-controller is generated by the master SDN controller containing the control data. The co-controller is dispatched to the device for residing thereon. The device is controlled in response to the control data.

23 Claims, 33 Drawing Sheets

Related U.S. Application Data continuation-in-part of application No. 15/179,726, filed on Jun. 10, 2016, now Pat. No. 9,948,606, and a continuation-in-part of application No. 15/142,748, filed on Apr. 29, 2016, now Pat. No. 10,355,969.

(51) Int. Cl.

| | | |
|---|---|---|
| *H04L 12/751* | (2013.01) | |
| *H03M 13/37* | (2006.01) | |
| *H04B 3/32* | (2006.01) | |
| *H04L 12/721* | (2013.01) | |
| *H04L 12/715* | (2013.01) | |

(52) U.S. Cl.
CPC .......... *H03M 13/3761* (2013.01); *H04B 3/32* (2013.01); *H04L 41/042* (2013.01); *H04L 41/08* (2013.01); *H04L 41/083* (2013.01); *H04L 41/0833* (2013.01); *H04L 41/0893* (2013.01); *H04L 41/18* (2013.01); *H04L 41/5025* (2013.01); *H04L 45/38* (2013.01); *H04L 45/64* (2013.01); *H04L 41/12* (2013.01); *H04L 41/22* (2013.01)

(58) Field of Classification Search
CPC ... H04L 43/0894; H04L 45/124; H04L 63/00; H04L 63/02; H04L 63/0263; H04L 63/10; H04L 63/1408; H04L 63/20; H04L 63/1416; H04L 63/104; H04L 63/0281; H04L 63/1458; H04L 47/32

See application file for complete search history.

(56) References Cited

U.S. PATENT DOCUMENTS

| | | | | |
|---|---|---|---|---|
| 9,948,606 | B2* | 4/2018 | Shaikh | H04L 63/1408 |
| 10,355,969 | B2* | 7/2019 | Shaikh | H04L 45/02 |
| 2014/0185450 | A1* | 7/2014 | Luo | H04L 47/35 |
| | | | | 370/236 |
| 2015/0317169 | A1* | 11/2015 | Sinha | H04L 61/2076 |
| | | | | 713/2 |
| 2015/0338447 | A1* | 11/2015 | Gallo | G01T 1/247 |
| | | | | 340/600 |
| 2016/0073278 | A1* | 3/2016 | Roessler | H04L 45/64 |
| | | | | 370/252 |
| 2017/0345281 | A1* | 11/2017 | Shaw | H04L 41/0681 |

* cited by examiner

DATA DRIVEN ORCHESTRATED NETWORK BEING RESPONSIVE TO ENVIRONMENTAL CONDITIONS USING A LIGHT WEIGHT DISTRIBUTED CONTROLLER

RELATED APPLICATIONS

The present invention is a U.S. National Stage under 35 USC 371 patent application, claiming priority to Serial No. PCT/EP2017/060259, filed on 28 Apr. 2017; which claims priority of International Application No. PCT/EP2016/081921 filed on 20 Dec. 2016; U.S. Ser. No. 15/179,726, filed on 10 Jun. 2016; U.S. Ser. No. 15/142,748, filed on 29 Apr. 2016, the entirety of each are incorporated herein by reference.

FIELD OF THE INVENTION

The present disclosure relates to software defined networks (SDN) and a method of controlling thereof. In particular, but not exclusively, the disclosure relates to an SDN platform and related architecture. The disclosure relates to an SDN network with device installation control using a light weight distributed controller. The disclosure further relates to an data driven orchestrated network being responsive to environmental conditions using a light weight distributed controller.

BACKGROUND

Networks become increasingly more complicated as they expand in size and much more difficult to manage and control. In a traditional network considerable IT resources are required to implement processes such as configuration and provisioning. Traditionally these tasks were manually implemented by a network administrator. The SDN approach automated these processes via software.

An SDN controller comprises a repository of control and policy instructions for the network. The SDN controller has an end-to-end view of the entire network, and information of all network paths and device capabilities. As a consequence, the SDN controller may calculate paths based on both source and destination addresses; use different network paths for different traffic types and react to the condition of the network changes. While a centralised control approach allows a network to be managed more efficiently that the conventional approach, delays may occur in view of huge volume of routing decisions that need to be centrally processed. Furthermore, the centralised control approach fails to address the individual granularity of setting specific policies for end users across millions of devices, as to how their devices should be controlled. The centralised approach fails to take account of how to scale the centrally operated SDN controller which controls very large numbers of distributed users with granular preferences and very large numbers of end devices. These limitations are inherent in the fully centralised approach and are specifically undesirable when SDN control is being used to manage millions of devices connected residential internet subscribers or businesses.

In addition this centralised approach fails to take into consideration the full scale and use of the analytics that are possible to be gathered. This approach fails to make use of the valuable historical reference capabilities of this data and its ability to be used to drive pro-active network management and control, to drive security applications, to compute infrastructure planning applications or to create automatic fault resolution.

There is therefore a need for a method of controlling a software defined network (SDN), and an SDN controller which addresses at least some of the drawbacks of the prior art.

Many applications have been created to breach security on a network, to do damage to another parties connectivity or systems, to steal data, to threaten or block systems and to invade the privacy of others. Their evolution started soon after the beginning of the computer age and include multiple types of viruses, malware, adware, trojans, denial of service (DOS), distributed DOS, spyware, etc.

In addition the shifting business models of companies now means that when a customer purchases a software product or even uses what is considered to be legitimate software that this permits both legitimate and nefarious companies to gather very significant amounts of personal data on the user. The consumer is generally unaware of the level of tracking and monitoring taking place by what they consider to be legitimate products because the consumer has inadvertently agreed to terms and conditions which may not be valid under their local country regulations where they reside.

Most of these security breach and privacy violation developments are being used for some form of malicious purpose on a varying scale. The evolving and changing problems faced by the consumer in relation to both security violation and privacy violation can be considered against the historic way viruses evolved. Some years ago it was obvious when a virus infection was present. The viruses of the past were largely written by amateurs and tended to be obvious, in that they exhibited destructive behaviour or pop-ups. Modern viruses however, are often written by professionals and are financed by nefarious organizations. With this levels of nefarious activities being experienced by end users a new approach is required to address security and privacy concerns for end users.

Traditionally ISPs have supplied the access network connected CPE to the consumer. These were traditionally rented to the consumer using a monthly charge. However new regulation being introduced by regulators now demands that a consumer can purchase their own CPE. This introduces significant problems for the ISP as they will now have to enable a much greater range of vendors equipment, all which have their own limitations, constraints and protocol support. In addition this brings considerable extra complexity for the consumer as they now need to be considerably more technology savvy when purchasing such a device and they will now have to enter considerably more information during provisioning which brings with it the problems associated with typing mistakes and incorrect information being entered. In general the industry has not had to address this problem.

There is therefore a need for a method for providing security on a software defined network (SDN) which addresses at least some of the drawbacks of the prior art. Additionally, their is a need a network security controller which also overcomes at least some the drawbacks of the prior art.

SUMMARY

The present disclosure relates to a computer implemented method for controlling a device on a software defined network (SDN) in response to environmental data; the method comprising:
receiving environmental data;
providing a master SDN controller for controlling the SDN network;
generating control data by the master SDN controller in response to the environmental data;
generating a co-controller by a master SDN controller containing the control data;
dispatching the co-controller to the device for residing thereon; and
controlling the device in response to the control data.

In one aspect; the environmental data is provided by one or more sensors.

In an exemplary aspect; the environmental data comprises at least one of temperature data; atmospheric pressure; moisture data; gas data; airborne pollutants data; radiation data; water quality data; audio noise data; electrical noise data; electromagnetic data; hazardous data; lighting data; chemical data; smoke detection data; pressure data; fire detection data; audio data; PH data.

In another aspect, the environmental data is associated with an area in which the device is located.

The present disclosure also relates to a network controller for a software defined network (SDN), the network controller comprising one or more modules operable to:
receive environmental data;
providing a master SDN controller for controlling the SDN network;
generating control data by the master SDN controller in response to the environmental data;
generating a co-controller by a master SDN controller containing the control data;
dispatching the co-controller to the device for residing thereon; and
controlling the device in response to the control data.

In one aspect; the environmental data is provided in a machine readable format.

Additionally; the present disclosure relates to an article of manufacture comprising a processor-readable medium having embodied therein executable program code that when executed by the processing device causes the processing device to perform:
receive environmental data;
providing a master SDN controller for controlling the SDN network;
generating control data by the master SDN controller in response to the environmental data;
generating a co-controller by a master SDN controller containing the control data;
dispatching the co-controller to the device for residing thereon; and
controlling the device in response to the control data.

The present disclosure relates to a computer implemented method for validating a device during installation to a software defined network (SDN); the method comprising:
receiving data associated with the device during installation;
validating the device using the received data;
providing a master SDN controller for controlling the SDN network;
generating a co-controller by a master SDN controller containing device validation data;
dispatching the co-controller to the device during installation; and
controlling installation of the device to the software defined network based on the device validation data.

In one aspect; the device validation data includes machine readable instructions for denying the device access to one or more services associated with the SDN network.

In another aspect; the device validation data includes machine readable instructions for allowing the device access to one or more services associated with the SDN network.

In a further aspect; the device validation data includes machine instructions for powering off the device.

In one aspect; the device validation data includes machine readable instructions for preventing the exchange of data between the device to the SDN network.

In another aspect; the device validation data includes machine readable instructions for preventing the exchange of data from the device to the SDN network.

In a further aspect; the received data comprises video data.

In one aspect; the received data comprises at least one of brand type, model serial number, identifier; or media access control address (MAC) address.

In another aspect; validating the device comprises comparing the brand type against pre-stored brand type data.

In one aspect; validating the device comprises comparing the model type against pre-stored model type data.

In a further aspect; validating the device comprises comparing the model serial number against prestored serial number data.

In another aspect; validating the device comprises comparing the MAC address against pre-stored MAC address data.

In one aspect; the co-controller limits access to at least some services if a positive match is not determined during the brand data comparison.

In another aspect; the co-controller limits access to at least some services if a positive match is not determined during the model data comparison.

In an exemplary aspect; the co-controller limits access to at least some services if a positive match is not determined during the serial data comparison.

In a further aspect; the co-controller limits access to at least some services if a positive match is not determined during the MAC address data comparison.

In one aspect; further comprising recording a geo-location of the electronic device.

In another aspect; further comprising storing a telephone number associated with a user.

In a further aspect; further comprising comparing the recorded geo-location against pre-stored geo location data.

In another aspect; the co-controller limits access to at least some services if a positive match is not determined during the geo-location comparison.

In one aspect; further comprising detecting the device in a video stream.

In a further aspect; further comprising receiving the video data using an image capture device.

In one aspect; the received data comprises at least one of machine readable data; voice data; alphanumeric data; or text data.

Further the present disclosure relates to a network controller for a software defined network (SDN), the network controller comprising one or more modules operable to:
receive data associated with the device during installation;
validating the device using the received data;
provide a master SDN controller for controlling the SDN network;
generate a co-controller by a master SDN controller containing device validation data;

dispatching the co-controller to the device during installation; and controlling installation of the device to the software defined network based on the device validation data.

The present disclosure also relates to an article of manufacture comprising a computer readable medium having embodied therein executable program code that when executed by the processing device causes the processing device to perform:

receive data associated with the device during installation;

validating the device using the received data;

provide a master SDN controller for controlling the SDN network;

generating a co-controller by a master SDN controller containing device validation data;

dispatching the co-controller to the device during installation; and controlling installation of the device to the software defined network based on the device validation data.

An aspect of the present teaching is to ensure the correct identification, approval and set up of an device without the need or cost to send an engineer to the consumers premises and to ensure the optimal serving of the consumer through the self install process. In addition an aspect of this teaching relates to ensuring that the consumer is able to easily achieve the optimal installation for the device.

In one aspect, a provisioning application uses a captured video stream to identify the information device relevant information such as brand, make, model, serial number, MAC address, etc. that an ISP requires to set in motion a commissioning process. Through the accurate gathering of this information and by removing the consumer from having to enter data the commissioning process complexity for the consumer is much reduced and the opportunity for incorrect data to be entered is reduced.

In addition it gathers the geo-location information of the point of installation of the device for the purposes of security. This data is captured and then reported to the ISP orchestration solution where the customer addressed is confirmed against existing GPS databases to confirm the location. This reduces the risk of theft of service especially for Cable Operators who operate DOCSIS networks which function in a broadcast mode.

In one aspect; data is recorded and reported back to an ISP orchestration system for analysis and storage. The data gathered is then processed to identify if the device is suitable for connection to the network.

The disclosed systems and methods are described herein primarily with reference to implementation within a mobile wireless device like a mobile phone. Although typical embodiments will utilize mobile devices, those of ordinary skill in the art will recognize that the disclosed systems and methods are not limited to mobile devices and may be implemented in many different types of data processing systems that have sufficient resources to perform the disclosed functions.

In another aspect, the mobile device is configured to report the video stream to the ISP orchestration system for analysis of make, model, serial number, vendor, mac address In a further aspect, the orchestration system validates that the CPE is a suitable model to be connected to the network In a further aspect, the orchestration system validates that a consumer has placed an order from a geo-location.

In a further aspect, the orchestration system identifies the product that the consumer has ordered and queries the vendors records as to the suitability of the CPE to support the product the purchased by the consumer In a further aspect, the orchestration system reports to the consumer the suitability of the device they have purchased In another aspect the present disclosure relates to a method for identifying the suitability of the CPE for the services to be purchased in an off-line manner.

In a further aspect, the consumer loads an app onto their mobile device and when in the shop they capture a video stream of the device on the shelf of the shop In a further aspect, when the consumer loads the app on their mobile device they then can select a ISPs product and advice is then published to the app as to whether the device meets the requirements of the operator based upon them entering their address and the app communicating with the ISPs systems so as to identify if the CPE meets the needs of the product. This protects the consumer from purchasing an unsuitable CPE.

In another aspect the present disclosure relates to a method of securing the installation for the ISP by confirming that the CPE is being installed at the location the consumer has said they live.

In a further aspect, the orchestration system validates that a consumer has placed an order from an address.

In a further aspect, the orchestration system does not connect the device to the network if there is no consumer order.

In another aspect the present disclosure relates to a method of restricting the installation of a non-compatible devices to the network.

In a further aspect, the orchestration system validates using the generated data whether the device is suitable for connecting to the network In a further aspect, if the orchestration system identifies that the device is unsuitable e.g. uses old technology such as DOCSIS 1.1 on a DOCSIS 3.1 network then the orchestration system triggers the isolation of the device on the network in order to avoid it causing a negative impact to the network.

In one aspect there is provided a computer implemented method for controlling a software defined network (SDN); the method comprising:

providing one or more client portals which are configured for facilitating users controlling networked devices;

generating configuration data based on input received from users via the client portals;

providing a master SDN controller for managing data flow control on the SDN network; the master SDN controller being operable to generate routing data for the networked devices;

generating by the master SDN controller a plurality of discrete co-controllers each associated with a particular end user; each SDN co-controller including configuration data and routing data for an associated networked device;

dispatching the SDN co-controller by the master SDN controller to the networked devices associated with the respective end users for controlling thereof;

installing the SDN co-controllers on the networked devices; and registering the installed SDN co-controllers with the master SDN controller for controlling the routing of data from the networked devices and for controlling the configuration of the networked devices.

The present disclosure also relates to a computer implemented method for providing security and privacy on a software defined network (SDN); the method comprising:
- providing a master SDN controller for managing data flow control on the SDN network; the master SDN controller being operable to generate routing data for the networked devices;
- generating by the master SDN controller a plurality of discrete co-controllers each associated with a particular end user; each SDN co-controller including routing data for an associated networked device;
- dispatching the SDN co-controller by the master SDN controller to the networked devices associated with the respective end users for controlling thereof;
- requesting access to a destination on the SDN network from a requesting networked device;

In a further aspect, the operational configuration of the networked devices are updated by changing to an alternative communication channel to avoid cross-talk from neighbouring devices.

In one aspect, the communication channel includes a WIFI channel.

In a further aspect, the operational configuration of the networked device is changed to reduce power consumption.

In one aspect, the operation configuration of the networked device is changed by reprogramming a power interface.

In another aspect, the operational configuration of the networked device is changed to increase priority to available bandwidth.

In one aspect, the operational configuration of the networked device is changed to decrease priority to available bandwidth.

In a further aspect, the SDN co-controllers are operable for assigning a first priority setting to a first set of network devices and assigning a second priority setting a second set of network devices.

In one aspect, the first priority setting is associated with a first bandwidth limit, and the second priority setting is associated with a second bandwidth limit.

In another aspect, the master SDN controller implements SDN orchestration in response to a resource request received on the client portals. Advantageously, SDN orchestration includes coordinating the required networking hardware and software elements to support applications associated with the resource request. Preferably, SDN orchestration includes generating an instance of one or more applications in the cloud. In one example, SDN orchestration generates a network-function virtualisation (NFV) instance.

In one aspect, a user profile is generated for each end user.

In another aspect, a user is authenticated.

In one exemplary aspect, the SDN co-controllers are installed on a system on chip (SOC) of the respective networked devices.

In another aspect, the SDN co-controllers are loaded to firmware contained on the respective networked devices.

In a further aspect, the SDN co-controllers are binary deployable.

In one aspect, the master SDN controller generates a configuration file for each resource selected by the end user on the client portal.

In a further aspect, the SDN co-controllers are dispatched to an in-home network for the gathering of transport protocol related information.

In one aspect, the networked devices are compatible with at least one of Data Over Cable Service Interface Specification (DOCSIS), Fiber to the X (FTTx), xDSL, Asymmetric digital subscriber line (DSL), and Wi-Fi.

In another aspect, the client portals are web based interfaces.

The present teaching also relates to a network controller for a software defined network (SDN), the network controller comprising one or more modules operable to:
- provide one or more client portals which are configured for facilitating users controlling networked devices;
- generate configuration data based on input received from users via the client portals;
- provide a master SDN controller for managing data flow control on the SDN network; the master SDN controller being operable to generate routing data for the networked devices;
- generate by the master SDN controller a plurality of discrete co-controllers each associated with a particular end user; each SDN co-controller including configuration data and routing data for an associated networked device;
- dispatch the SDN co-controller by the master SDN controller to the networked devices associated with the respective end users for controlling thereof;
- install the SDN co-controller on the networked devices; and
- register the installed SDN co-controllers with the master SDN controller for controlling the routing of data from the networked devices and for controlling the configuration of the networked devices.

Furthermore, the present disclosure relates an article of manufacture comprising a processor-readable medium having embodied therein executable program code that when executed by the processing device causes the processing device to perform:
- providing one or more client portals which are configured for facilitating users controlling networked devices;
- generating configuration data based on input received from users via the client portals;
- providing a master SDN controller for managing data flow control on the SDN network; the master SDN controller being operable to generate routing data for the networked devices;
- generating by the master SDN controller a plurality of discrete co-controllers each associated with a particular end user; each SDN co-controller including configuration data and routing data for an associated networked device;
- dispatching the SDN co-controller by the master SDN controller to the networked devices associated with the respective end users for controlling thereof;
- installing the SDN co-controller on the networked devices; and
- registering the installed SDN co-controllers with the master SDN controller for controlling the routing of data from the networked devices and for controlling the configuration of the networked devices.

Additionally, the present teaching relates to a software defined network (SDN); the method comprising:
- providing one or more client portals which are configured for facilitating users controlling networked devices;
- generating configuration data based on input received from users via the client portals;
- providing a master SDN controller for managing data flow control on the SDN network; the master SDN controller being operable to generate routing data for the networked devices;

generating by the master SDN controller a plurality of discrete co-controllers each associated with a particular end user; each SDN co-controller including configuration data and routing data for an associated networked device;

dispatching the SDN co-controller by the master SDN controller to the networked devices associated with the respective end users for controlling thereof; and installing the SDN co-controller on the networked devices.

In one aspect there is provided a computer implemented method for controlling a software defined network (SDN); the method comprising:

providing a plurality of client portals which are configured for facilitating end users selecting resources via local user interfaces;

providing a master control module in communication with the client portals and configured for managing flow control on the SDN network;

generating by the master control module a plurality of discrete control agents each associated with a particular end user and configured based on the resources selected by the particular end user; and dispatching the discrete control agents to the local devices of the respective end users for controlling thereof.

In another aspect, the end users are authenticated prior to the dispatching of the control agents.

In one aspect, the master control agent generates a configuration file for each resource which forms part of the services selected by the end user.

In another aspect, the configuration file is incorporated into the control agent.

In another aspect localised control is enabled for services specifically in relation to the services that the customer has selected In another aspect the end device is not dumbed down but is instead programmable control is enabled locally and specifically enabled for the individual customer In another aspect detailed low level analytics are gathered directly from the device and are transmitted over to the orchestration solution to support customer management and control.

In one aspect discrete control agents are dispatched to an in-home network for the gathering of transport protocol related information to ensure accurate delivery of the services in accordance with the control criteria selected by the end user.

In another aspect, a unified control plane is dispatched across multiple access technologies e.g. DOCSIS, FTTx, xDSL, Wi-Fi etc. but not limited to the technologies which are provided by way of example only, thereby enabling operators to singularly deploy and control services in a unified fashion.

In a further aspect, granular control of the end device is provided so that unlike vCPE it is not dumbed down but instead programmable control is enabled locally and specifically for the individual device in relation to customer service requirements.

In one aspect, an instance of each resource in created on the cloud.

In a further aspect, the requested resource is accessible via the client portal.

In another aspect, a network-function virtualisation (NFV) instance is configured.

The present disclosure also relates to a network controller for a software defined network (SDN), the network controller comprising:

a plurality of client portals configured for facilitating end users selecting network resources via local user interfaces;

a master control module in communication with the client portals and configured for managing flow control on the SDN network; the master control module being operable to generate a plurality of discrete control agents each associated with a particular end user and configured based on the network resources selected by the particular end user; and a communication module configured for dispatching or control of embedded discrete control agents to one or more local devices of the respective end user for controlling thereof.

Additionally, the present disclosure relates to a computer implemented method for controlling an SDN network; the method comprising:

providing a plurality of client portals which are configured for facilitating end users selecting network resources of the SDN network via local user interfaces;

providing a master control module in communication with the client portals and configured for managing flow control on the SDN network;

generating a plurality of discrete control agents each associated with a particular end user and configured based on the network resources selected by the particular end user; and dispatching the discrete control agents to one or more local devices of the respective end user for locally controlling thereof.

Furthermore, the present disclosure relates to a computer-readable medium comprising non-transitory instructions which, when executed, cause a processor to carry a method for controlling an SDN network; the method comprising:

providing a plurality of client portals which are configured for facilitating end users selecting network resourses of the SDN network via local user interfaces;

providing a master control module in communication with the client portals and configured for managing flow control on the SDN network;

generating a plurality of discrete control agents each associated with a particular end user and configured based on the network resources selected by the particular end user; and dispatching the discrete control agents to one or more local devices of the respective end user for locally controlling thereof.

The present disclosure also relates to a computer implemented method for controlling a software defined network (SDN); the method comprising:

providing a plurality of client portals which are configured for facilitating end users selecting resourses via local user interfaces;

providing a master control module in communication with the client portals and configured for managing flow control on the SDN network;

generating by the master control module a plurality of discrete control agents each associated with a particular end user and configured based on the resources selected by the particular end user; and dispatching the discrete control agents to the local devices of the respective end users for controlling thereof.

Additionally, the disclosure relates to a computer implemented method for controlling access in a software defined network (SDN); the method comprising:

providing a master control module configured for managing flow control on the SDN network;

generating by the master control module a plurality of discrete access control agents each associated with particular nodes of the SDN network node for controlling access thereto; and dispatching the discrete access control agents to devices associated with the respective nodes for dynamically programming the devices with access control criteria.

The present disclosure also relates to a computer implemented method for controlling an in-home network in communication with a software defined network (SDN); the method comprising:

providing a client portal for facilitating an end user interfacing with the in-home network for selecting local control criteria;

providing a master control module associated with the SDN network which in communication with the in-home network and configured for managing flow control;

generating by the master control module a plurality of discrete control agents each associated with a particular end user and configured based on the control criteria selected by the end user on the client portal; and dispatching the discrete control agents to the in-home network for controlling the devices of the in-home network in accordance with the control criteria selected by the end user.

In one aspect, discrete control agents are dispatched to the in-home network for the gathering of transport protocol related information to ensure accurate delivery of the services in accordance with the control criteria selected by the end user.

The present disclosure enables security threats and privacy violations to be addressed by leveraging the programmability of flow control on SDN devices to identify and to not forward identified traffic which contain threats or privacy violations. Flow based forwarding is programmed on the end user device to limit the forwarding of threat traffic or privacy violation traffic.

Accordingly, the present disclosure relates to a computer implemented method for providing security on a software defined network (SDN); the method comprising:

providing a master SDN controller for managing data flow control on the SDN network; the master SDN controller being operable to generate routing data for the networked devices;

generating by the master SDN controller a plurality of discrete co-controllers each associated with a particular end user; each SDN co-controller including routing data for an associated networked device;

dispatching the SDN co-controller by the master SDN controller to the networked devices associated with the respective end users for controlling thereof;

requesting access to a destination on the SDN network from a requesting networked device;

initiating a domain name system (DNS) interaction with the requesting networked device;

relaying by the DNS data associated with the requested destination to a threat management control system (TMCS);

determining by the TMCS if the requested destination has an associated security criteria;

communicating a threat status by the TMCS to the SDN co-controller associated with the requesting networked device; and generating routing data by the SDN co-controller associated with the requesting networked device based on the threat status to allow or deny access to the requested destination.

Additionally, the present disclosure relates to a computer implemented method for providing security on a software defined network (SDN); the method comprising:

providing a master SDN controller for managing data flow control on the SDN network; the master SDN controller being operable to generate routing data for the networked devices;

generating by the master SDN controller a plurality of discrete co-controllers each associated with a particular end user; each SDN co-controller including routing data for an associated networked device;

dispatching the SDN co-controller by the master SDN controller to the networked devices associated with the respective end users for controlling thereof;

requesting access to a uniform resource locator (URL) from a requesting networked device;

initiating a domain name system (DNS) interaction with the requesting networked device;

relaying by the DNS data associated with the requested URL to a threat management control system (TMCS);

determining by the TMCS if the requested URL has an associated security criteria;

communicating a threat status by the TMCS to the SDN co-controller associated with the requesting networked device; and generating routing data by the SDN co-controller associated with the requesting networked device based on the threat status to allow or deny access to the requested URL.

In one aspect, the TMCS is in communication with at least one data repository that contain details of URLs which have predetermined security criteria associated with them.

In another aspect, the at least one data repository is updated once an URL becomes known as having a malicious security criteria.

In a further aspect, the at least one data repository is hosted by a third party entity. Advantageously, the at least one data repository comprises a classification of multiple risk types. In one example, the at least one data repository comprises a classification of multiple user profiles. Preferably, each user profile has an associated routing action based on it's classification. In an exemplary arrangement, the at least one data repository comprises a first data set associated with destinations having pre-identified security threats. In a further example, the at least one data repository comprises a second data set associated with destinations that are known to harvest privacy related data from users.

In one aspect, the first data set is stored in a first data repository; and the second data set is stored in a second data repository.

In another aspect, each SDN co-controller has an associated security match module which is operable to define an appropriate forwarding decision based on the threat status received from the TMCS. In one example, the forwarding decision is based on a user profile associated with the requesting networked device. In another aspect, the forwarding decision is based on a risk classification. Advantageously, the forwarding decision results in traffic being sent to a quarantine destination. In one example, forwarding decision results in traffic being forwarded to the requested URL.

In a further aspect, the SDN co-controller on the requesting networked device enters a forwarding entry in a flow routing table based on the forwarding decision of security match module.

In one aspect, the TMCS is operable to populate an open database accessible by an SDN orchestrator. Advantageously, the TMCS is operable to populate the open database with the status of identified threats.

In another aspect, the open database is accessible from at least one remote portal. Advantageously, the status of the identified threats are viewable from the at least one remote portal.

In a further aspect, the TMCS is operable to relay an IP address of a user; a user profile identifier and a risk classification identifier to the open database. Advantageously, the IP address of the user is used to map a security alert report to a customer record. In one aspect, the security alert report details actions required to be taken by the user to alleviate the threat.

In another aspect, the user selects a security setting from a plurality of available security settings. Advantageously, a security policy is generated based on the selected security setting. In one aspect, an identifier of the requesting networked device is extracted from the open database. Preferably, a list of commonly used sites by the user are extracted from the open database.

In a further aspect, the method further comprises extracting analytical data by the SDN co-controllers from the networked devices. Advantageously, the method includes routing the extracted analytical data to an open database.

In one aspect, the extracted analytical data is routed by the SDN co-controllers to the open database via the master SDN controller.

In a further aspect, an analytics engine is in communication with the open database being operable to analyse the extracted analytics to generate an analytics output.

In a another aspect, the analytics output is accessible via one or more client portals.

In one exemplary arrangement, one or more performance enhancing options are made available to the end user via the client portals for selection based on the analytics output. Advantageously, configuration data is updated in response to the end user selecting one or more performance enhancing options.

In one aspect, the method further comprises updating the installed SDN co-controller with the updated configuration data for modifying operational configuration of the networked devices.

In another aspect, the operational configuration of the networked devices are modified to increase a quality of service parameter. Advantageously, the operational settings of the networked devices are updated in real-time while being online. In one example, the operational configuration of the networked devices are updated while in a sleep-mode.

In a further example, the SDN co-controllers are installed on a system on chip (SOC) of the respective networked devices. Advantageously, the SDN co-controllers are loaded to firmware contained on the respective networked devices. In an exemplary aspect, the SDN co-controllers are binary deployable.

In one aspect, the SDN co-controllers register with the master SDN controller after being installed on the respective networked devices for controlling the routing of data from the networked devices and for controlling the configuration of the networked devices.

The present disclosure also relates to a network security controller for a software defined network (SDN), the network security controller comprising one or more modules operable to:
provide a master SDN controller for managing data flow control on the SDN network; the master SDN controller being operable to generate routing data for the networked devices;
generate by the master SDN controller a plurality of discrete co-controllers each associated with a particular end user; each SDN co-controller including routing data for an associated networked device;
dispatch the SDN co-controller by the master SDN controller to the networked devices associated with the respective end users for controlling thereof;
request access to a uniform resource locator (URL) from a requesting networked device;
initiate a domain name system (DNS) interaction with the requesting networked device;
relay by the DNS data associated with the requested URL to a threat management control system (TMCS);
determine by the TMCS if the requested URL has an associated security criteria;
communicate a threat status by the TMCS to the SDN co-controller associated with the requesting networked device; and
generate routing data by the SDN co-controller associated with the requesting networked device based on the threat status to allow or deny access to the requested URL.

Additionally, the present disclosure relates to a computer-readable medium comprising non-transitory instructions which, when executed, cause a processor to carry out a method according to any one of steps as previously described. For example; the non-transitory instructions which, when executed, cause a processor to carry out a method comprising:
providing a master SDN controller for managing data flow control on the SDN network; the master SDN controller being operable to generate routing data for the networked devices;
generating by the master SDN controller a plurality of discrete co-controllers each associated with a particular end user; each SDN co-controller including routing data for an associated networked device;
dispatching the SDN co-controller by the master SDN controller to the networked devices associated with the respective end users for controlling thereof;
requesting access to a uniform resource locator (URL) from a requesting networked device;
initiating a domain name system (DNS) interaction with the requesting networked device;
relaying by the DNS data associated with the requested URL to a threat management control system (TMCS);
determining by the TMCS if the requested URL has an associated security criteria;
communicating a threat status by the TMCS to the SDN co-controller associated with the requesting networked device; and
generating routing data by the SDN co-controller associated with the requesting networked device based on the threat status to allow or deny access to the requested URL.

The present disclosure also relates to a computer implemented method for controlling a DOCSIS compatible network; the method comprising:
  providing a master control module on a cable modem termination system (CMTS) which is configured for controlling DOCSIS cable modems;
  generating by the master control module a plurality of discrete control agents each associated with a particular DOCSIS cable modem; and
  dispatching the discrete control agents to the DOCSIS cable modems for dynamically programming the DOCSIS cable modem with a boot-file from the CMTS without having to read a kernel daemon.

Additionally, the present disclosure relates to a computer implemented method for controlling a software defined network (SDN); the method comprising:
  providing one or more video-user interfaces which are configured for facilitating users controlling networked devices;
  generating control data based on speech input received from users via the video-user interfaces;
  providing a master SDN controller for managing data flow control on the SDN network; the master SDN controller being operable to generate control data for the networked devices;
  generating by the master SDN controller a plurality of discrete co-controllers each associated with a particular end user; each SDN co-controller including at least one of control data and routing data for an associated networked device;
  dispatching the SDN co-controller by the master SDN controller to the networked devices associated with the respective end users for controlling thereof;
  installing the SDN co-controllers on the networked devices; and
  registering the installed SDN co-controllers with the master SDN controller for controlling the networked devices.

In one aspect, the analytics output is accessible via the video-user interfaces.

In a further aspect, one or more performance enhancing options are made available to the end user via the video-user interfaces for selection based on the analytics output.

In another aspect, the master SDN controller implements SDN orchestration in response to a resource request received on the video-user interfaces.

In an exemplary aspect, the master SDN controller generates a configuration file for each resource selected by the end user on the video-user interfaces.

In a further aspect, the video-user interfaces are web based interfaces.

The present disclosure is also relates to a network controller for a software defined network (SDN), the network controller comprising one or more modules operable to:
  provide one or more video-user interfaces which are configured for facilitating users controlling networked devices;
  generate control data based on speech input received from users via the client portals;
  provide a master SDN controller for managing data flow control on the SDN network; the master SDN controller being operable to generate control data for the networked devices;
  generate by the master SDN controller a plurality of discrete distributed co-controllers each associated with a particular end user; each SDN co-controller including at least one of control data and routing data for an associated networked device;
  dispatch the SDN co-controller by the master SDN controller to the networked devices associated with the respective end users for controlling thereof;
  install the SDN co-controller on the networked devices; and
  register the installed SDN co-controllers with the master SDN controller for controlling the networked devices.

Furthermore the present disclosure relates to an article of manufacture comprising a processor-readable medium having embodied therein executable program code that when executed by the processing device causes the processing device to perform:
  providing one or more video-user interfaces which are configured for facilitating users controlling networked devices;
  generating control data based on speech input received from users via the client portals;
  providing a master SDN controller for managing data flow control on the SDN network; the master SDN controller being operable to generate the control data for the networked devices;
  generating by the master SDN controller a plurality of discrete co-controllers each associated with a particular end user; each SDN co-controller including at least one of control data and routing data for an associated networked device;
  dispatching the SDN co-controller by the master SDN controller to the networked devices associated with the respective end users for controlling thereof;
  installing the SDN co-controllers on the networked devices; and
  registering the installed SDN co-controllers with the master SDN controller for controlling the networked devices.

Additionally, the present disclosure relates to a computer implemented method for controlling a software defined network (SDN); the method comprising:
  providing one or more interfaces which are configured for facilitating users controlling networked devices;
  generating control data based on input received from users via the video-user interfaces;
  providing a master SDN controller for managing data flow control on the SDN network; the master SDN controller being operable to generate the control data for the networked devices;
  generating by the master SDN controller a plurality of discrete co-controllers each associated with a particular end user; each SDN co-controller including at least one of control data and routing data for an associated networked device;
  dispatching the SDN co-controller by the master SDN controller to the networked devices associated with the respective end users for controlling thereof;
  installing the SDN co-controllers on the networked devices; and
  registering the installed SDN co-controllers with the master SDN controller for controlling the networked devices.

The foregoing and other features and advantages of preferred embodiments of the present disclosure are more readily apparent from the following detailed description. The detailed description proceeds with reference to the accompanying drawings.

BRIEF DESCRIPTION OF THE DRAWINGS

The present disclosure will now be described with reference to the accompanying drawings in which.

DETAILED DESCRIPTION

Embodiments of the present disclosure will now be described with reference to some exemplary SDN platforms. It will be understood that the exemplary architecture is provided to assist in an understanding of the present teaching and is not to be construed as limiting in any fashion. Furthermore, modules or elements that are described with reference to any one Figure may be interchanged with those of other Figures or other equivalent elements without departing from the spirit of the present teaching.

Figure 1:
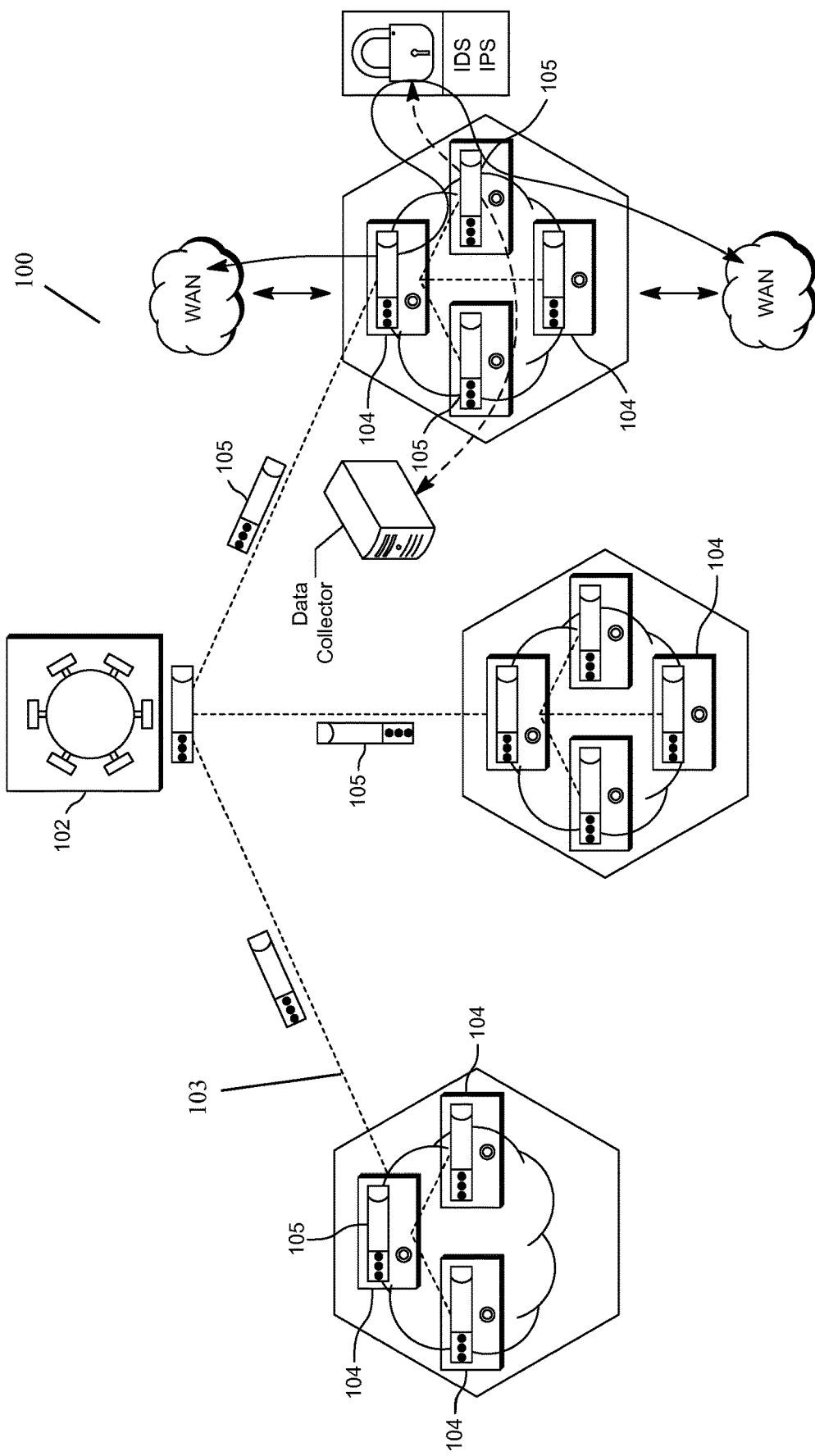
FIG. 1 is a block diagram illustrating an exemplary SDN platform in accordance with the present teaching.
Figure 2:
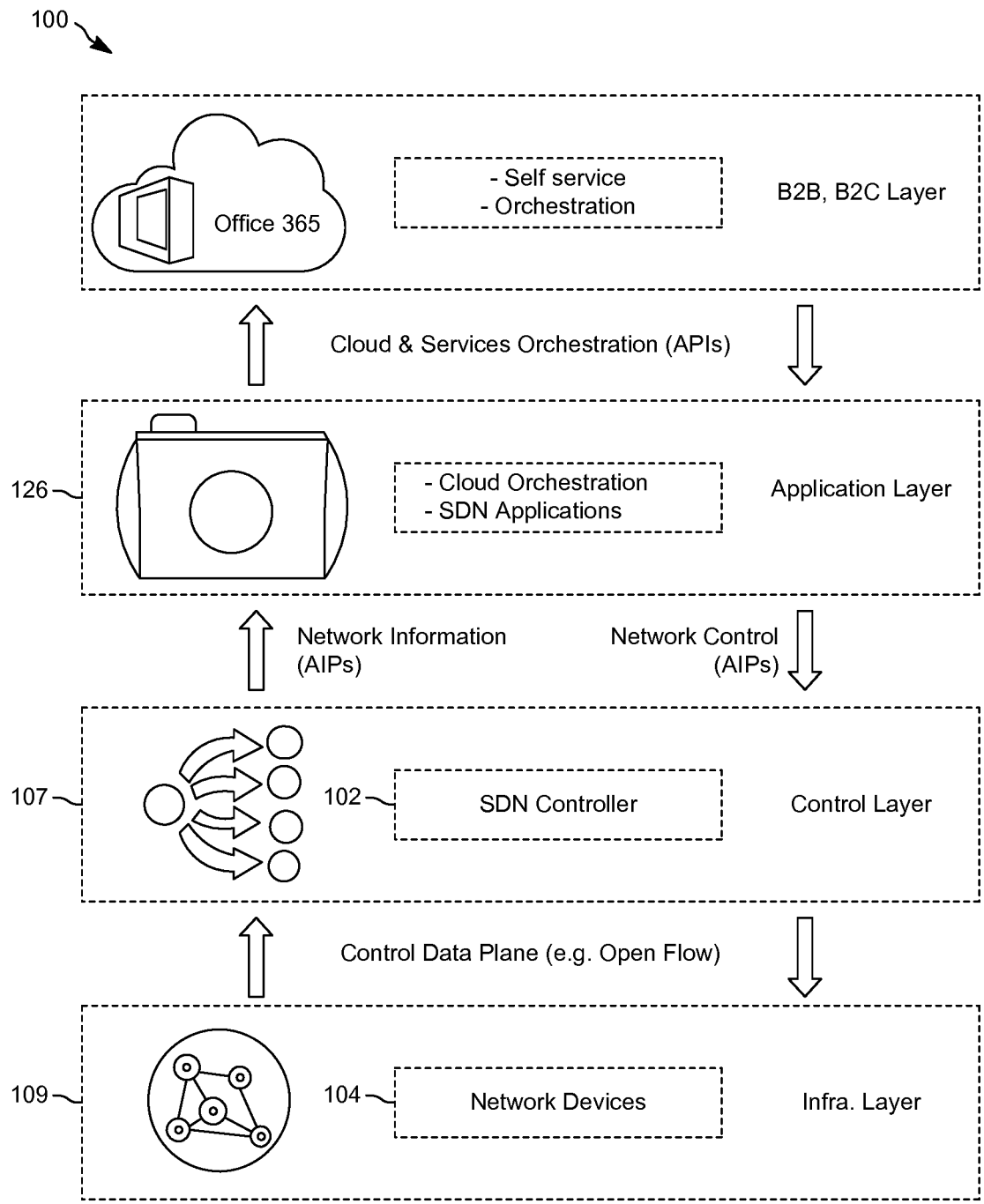
FIG. 2 is a block diagram illustrating details of the architecture of FIG. 1.
Figure 3:
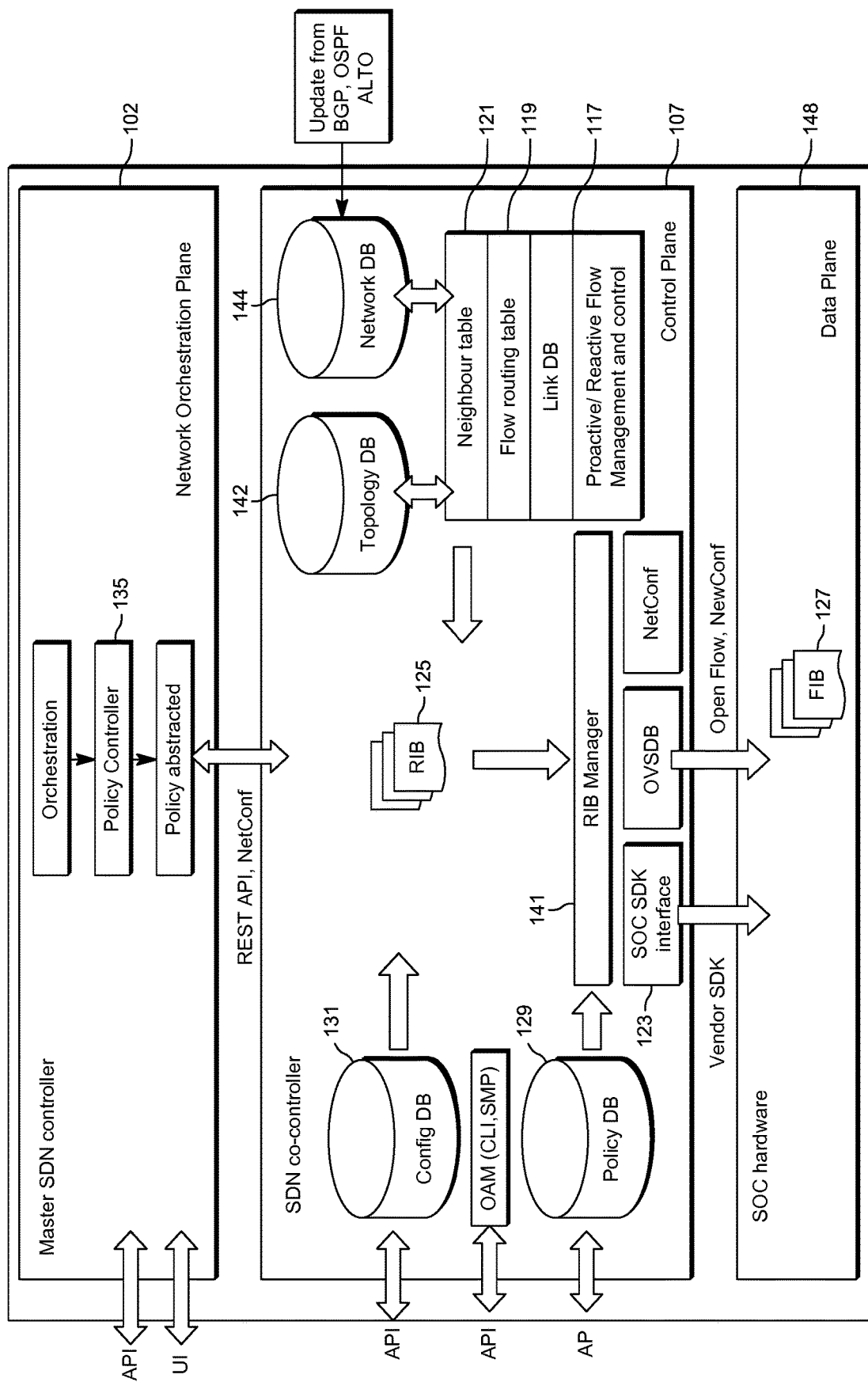
FIG. 3 is a block diagram illustrating details of the architecture of FIG. 1.

Referring to the drawings and initially to FIGS. 1 to 3, there is illustrated an SDN platform 100 in accordance with the present teaching. A master SDN controller 102 is configured to manage data flow control on the SDN network 103. The master SDN controller 102 is operable to generate routing flow data for a plurality of networked devices 104. The networked devices 104 may include but not limited to, network infrastructure equipment (NICs), amplifiers, servers, fibre nodes, cable modem termination systems (CMTS), Converged Cable Access Platforms (CCAP), Digital Subscriber Line Access Multiplexers (DSLAMs), optical line terminals (OLT), Optical Network Terminals (ONT), standalone WIFI access points, hand-held devices, or the like. The master SDN controller 102 has an end-to-end view of the entire SDN network 103, and information of all network paths and device capabilities. The master SDN controller 102 is operable to generate a plurality of SDN co-controller 105 each associated with a particular user. The master SDN controller 102 and the plurality of secondary SDN controllers 105 co-operate in order to calculate data paths based on both source and destination addresses; use different network paths for different traffic types and react to the condition of the network changes.

The SDN co-controller 105 are distributed by the master SDN controller 102 to the networked devices 104 associated with the respective users for controlling the devices 104 such that the devices 104 are operable to make local data routing decisions. Each SDN co-controller 105 includes configuration data and a routing engine. The distributed co-controllers 105 are installed on the networked devices 104 associated with particular end users. The discrete SDN co-controller 105 are configured to add network functions to the devices 105 which may include distributed routing, quality of service functions, access control lists functions and load balancing functions. These tasks would primarily have been done by the central SDN controller in SDN networks know heretofore.

Once installed on the devices 104 the distributed co-controllers 105 register with the master SDN controller 102 and are co-operable for controlling the routing of data from the networked devices over the SDN network 103. The distributed co-controllers 105 act as a distributed routing engine thereby removing hardware limitations such as Ternary Content Addressable Memory (TCAM) entries. Due to their lightweight implementation, the distributed co-controllers 105 may be installed on a range of devices, from low/highend switching platforms to Bare Metal, virtual machines and even network interface controllers (NICs). Both the master SDN controller 102 and the SDN co-controller 105 may be adapted to the topology needs of both the LAN (EastWest) and WAN (North South) with unified routing using the border gateway protocol (BGP). Topology management for service aware routing may be enabled through link discovery based on the link layer discovery protocol (LLDP)/bidirectional forwarding detection (BFD). The SDN co-controller 105 may be seamlessly integrated into a switch operating system such as LINUX or UNIX. The distributed co-controllers 105 are operable to run on the devices 104 as container instances and provide seamless integration with any legacy routing device or protocol.

The SDN platform 100 removes network complexity and ensures maximum QoS (Quality of Service) with real time programming of routes both within and between domains. The control plane of the SDN platform 100 is built on industry-standards with the benefit of removing the burden of vendor lock-in. The SDN platform 100 is provided with tools and feature-rich Application Programming Interfaces (API's) to empower users to tailor SDN applications and to define user specific policies, rules and optimisations for the SDN network 103. The SDN platform 100 integrates with public and private cloud configurations and reduces the provisioning time of application aware services to minutes instead of weeks, providing real operational cost savings. An intuitive web based interface dashboard enables users to quickly and seamlessly implement adds, moves and changes to the network 103 while combining programmatic network control with network state awareness to provide SLA (Service Level Agreement) assurance.

The SDN co-controller 105 comprises a repository of control and policy instructions for specific devices 104. The distributed SDN co-controller 105 are operable to make routing decisions locally on the devices 104 which alleviates delays that may occur if these routing decisions were made centrally rather than locally. Furthermore, the distributed SDN co-controller 105 facilitates individual granularity of setting specific policies for end users across a large number of devices 105, as to how their devices should be controlled and performance optimised. The SDN co-controller 105 also allows analytics to be gathered from the devices 104 in order to determine if the devices 105 are operating in an optimum fashion. If it is determined that the devices 105 are not operating efficiently, the platform 100 is able to dynamically modify the operational configuration of the devices 104 to improve efficient or the quality of service experienced by the user.

The SDN platform 100 provides full visibility of an entire network topology through a control plane 107, which unlike traditional SDN deployments, is both centralised using the master SDN controller 102, as well as being fully distributed, using distributed SDN co-controllers 105. The distributed co-controllers 105 are intelligent light weight routing engine which may be dispatched to any Openflow enabled CPE such as a switch, server, NIC, or the like. The control plane 107 may be built on industry-standards with the benefit of removing the burden of vendor lock-in. The architecture 100 provides the tools to tailor SDN applications and to define the user's own policies, rules, and optimisations for the network 110.

The master SDN controller 102 and the SDN co-controller 105 may be based on protocols, such as OpenFlow or NetConf/YANG, that allow a server to tell switches where to send packets. In an OpenFlow compatible switch the data path is separate from the control path. The data path is resident on the switch itself while the master SDN controller 102 provides the control path which makes the routing decisions. The OpenFlow protocol provides a means for the switch and master SDN controller 102 to communicate and provides information on the flows that are being programmed into the network. In addition the NetConf protocol with its use of YANG models may also be used to program specific network functions within the networked devices 105.

The control plane 107 is highly resilient, facilitated through a federation of distributed co-controllers 105, forming a virtualised single point of SDN control. Each federated individual controller in turn automatically dispatches a lightweight SDN controlling agent to each of the network devices 104 in an infrastructure layer 109, providing complete visibility of the network. The platform 100 includes an application layer 126 which integrates the orchestration of the Openstack cloud, to manage the delivery and configuration of cloud based virtual network services, applications and functions. Also residing in the application layer 126 are a series of tools and systems, interface portals which enable a service provider and their customers to operate, optimize and self-serve. The overall platform 100 integrates to the three layers of the SDN model providing a comprehensive suite of capabilities as graphically illustrated in FIG. 2.

Figure 4:
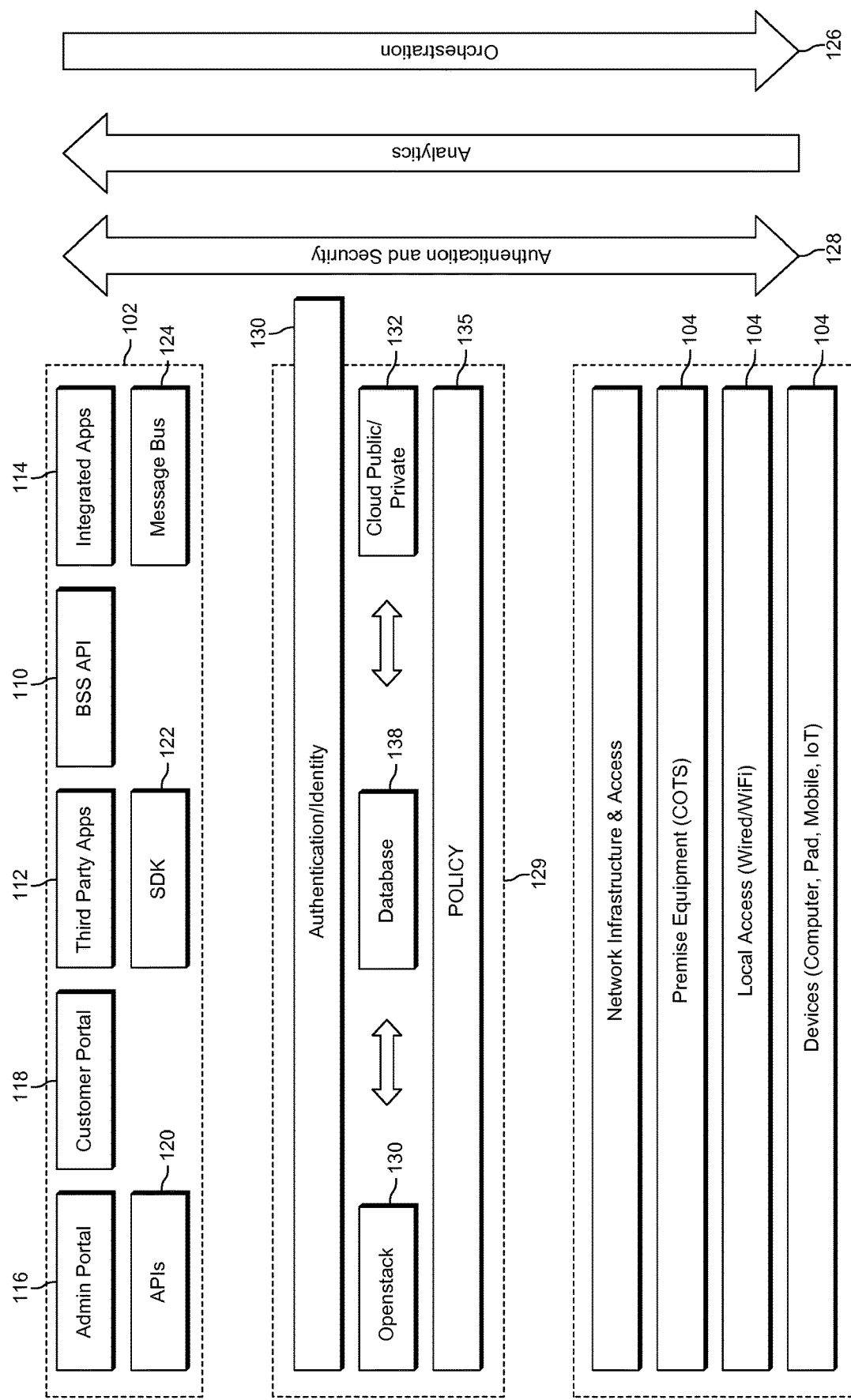
FIG. 4 is a block diagram illustrating details of the architecture of FIG. 1.

An exemplary architecture in accordance with the present teaching is illustrated in FIGS. 3 and 4. Portal interfaces to the orchestration architecture bring controls from business support systems (BSS) stacks 110, $3^{rd}$ party applications 112, control applications 114 which form part of the functions of an administrator portal 116 and a customer portal 118. These applications communicate via supported application programming interfaces (APIs) 120, software development kit (SDK) 122, message bus 124 and all communications are first identified and authenticated for access to an orchestration layer 126 at an authentication/identity layer 128. The lightweight directory access protocol (LDAP) may run on the authentication/identity layer 128. It provides a mechanism used to connect to, search, and modify Internet directories. The LDAP directory service is based on a client-server model. Upon validation a token is generated and this token is communicated through the layers to identify authorization for configuration of functional components of the architecture.

OpenStack 130 is fully integrated into the solution and its orchestration APIs are used to gather and signal the commutation of the authentication and identity tokens to all components in the system. In turn OpenStack 130 is used to host the administration system components within its hardware managed and orchestrated environment. Its cloud capabilities 132 are used for the hosting of customer services and for connection to public clouds through API controls.

A policy control engine 135 identifies and maps the appropriate configuration data to the device 104 which is being controlled. This is achieved through the querying of the live customer records within a database 138 which has gathered analytics using the distributed co-controllers 105. These analytics are gathered from the live customer, profiles etc. data structures in the Open-Data Database which has been populated with analytics from the SDN controlled devices 104 and from data obtained through the provisioning process based upon customer profiles and product profiles. All data is mapped into the database 138 in appropriately structured records for fast read and write. The policy controller 135 identifies and maps the customer's profile to the appropriate configurations required for the system-on-chip (SOC) of the device 104 based upon the customer's product profile and the role from the authentication and identity management token assigned by authentication/identity layer 128.

The master SDN controller 102 may reside in the control plane 107. The master SDN controller 102 comprises a primary control/orchestration component in communication with the customer portal 118 via the higher level orchestration and data layers and is configured for managing flow control on the SDN network 103. The control/orchestration component are operable to generate a plurality of discrete co-controllers 105 each associated with a particular end user and configured based on the network resources selected by the particular end user via the customer portal 118. The master SDN controller 102 is configured for dispatching the discrete SDN co-controller 105 to one or more local devices 104 of the respective end user for controlling thereof. The discrete SDN co-controller 105 are despatched via the orchestration solution when the need for a new layer of control is identified through analysis produced by the orchestration. The distributed co-controllers 105 are extremely light weight agents and may be populated into the firmware or BIOS of the devices 104. In one example the co-controllers 105 are binary de-ployable.

The primary control is handled by the orchestration plane 126 and handles administrative tasks like authentication, logging, discovery and configuration. The multi-layer co-controllers 105 are provided in the multi-component functions of the multi-functional control planes 107. These distributed co-controllers 105 administer the internal device operations and provide the instructions used by the routing engines to direct the packets via programming using NetConf/YANG, OpenFlow/OVSDB or direct programming via the system on chip (SOC) software development kit (SDK). It may also run the routing and switching protocols and feeds operational data back to the orchestration plane and reports back analytics via the master SDN controller 102 to the orchestration layer 126 and the control layer 107.

In addition the distributed co-controllers 105 build a topology database 142 and uses this to identify its neighbours and relevant paths. The topology database 142 is used to make forwarding decisions and to define proactive and reactive forwarding decisions. The co-controllers 105 build a network database 144 and use this to build a full network visibility of all known paths. This network database 144 is used to integrate into its neighbours and to relevant paths, the interfaces may include the exterior gateway protocol (EGP) and the interior gateway protocol (IGP). The network database 144 is used to construct forwarding decisions and to define proactive and reactive forwarding controls. In addition the SDN co-controller 105 may support Border Gateway Protocol (BGP), Open Shortest Path First (OSPF), Application-Layer Traffic Optimization (ALTO) and other EGPs and IGP to populate full network awareness for all forwarding decisions. Data gathered from these components is evaluated using the data created from a link database 117, network table 121, flow forwarding table 119 for the creation of reactive and proactive forwarding control. Forwarding control for the devices 104 are generated and added to the routing information base (RIB) 125 for the programming of devices 104 with a forwarding information base (FIB) 127 via available interfaces 123 such as SOC SDK, Open vSwitch Database (OVSDB) or Network Configuration Protocol (NetCOnf)/Yet Another Next Generation (YANG). An RIB manager 141 is operable to create a forwarding information base (FIB) on the devices 104 which is used by the operating system of the device 104 to find the proper interface to which the input interface should forward a data packet. Policy data is stored in a policy database 129 and configuration data is stored in a configuration database 131. These are generated from instructions received from the policy controller 135 from the higher level orchestration via the representational state transfer (REST) API. The data plane 148 is the engine room that moves packets through the device 104, using the flow routing table 119 supplied by the distributed co-controllers 105 to determine the output port. This is programmed and instructions sent using NetConf/YANG, OpenFlow/OVSDB or direct programming via the SOC SDK.

The master SDN controller 102 and the SDN co-controllers 105 cooperate to operate as an out-of-band controller that fetches and dynamically programmes the configuration of the devices 104 that the customer has selected using the customer portal 118. Flows are controlled from the devices 104 and a bespoke topological forwarding map is created for the customer environment to enable accurate forwarding decisions. The devices 104 are enabled with this lightweight out of band SDN controller that is integrated with a remote orchestration solution to receive instructions sets and to automatically deliver service flow control, analytics gathering and to trigger customer requested changes to the customer services in real time.

The distributed co-controllers 105 may be distributed as a lightweight controller on a range of low power, low CPU CPE's, network infrastructure equipment, NICs, amplifiers, Servers, fibre nodes, CMTS, CCAP, Amplifiers, DSLAMs, OLT, ONT, standalone WIFI access points, hand-held devices, etc and provision services at a highly reduced latency to enable high quality, value add Service-Level Agreement (SLA) delivery while significantly improving an organization's ability to quickly adapt to changing customer/network demands. The platform 100 provides complete end-to-end visualization of all NFV and SDN services that is both hierarchical and multi-layer. This visualization also includes integrated alarming, availability, performance, service quality, and SLA conformance information making it a single view for comprehensive assessment of service health. This brings a dynamic and accurate view and reachability of network and associated services, a consolidated view of the health of each service and resource management and the ability to quickly troubleshoot and identify impacted services.

In an exemplary embodiment, the SDN platform 100 may be used to eliminate boot file management of DOCSIS cable modems and automating service orchestration. The SDN platform 100 may be configured for provisioning and orchestration of the IP stack and distributed networking of in-home services in DOCSIS moderns. The platform 100 works as an out-of-band controller that fetches and dynamically programmes the boot-file from CMTS to cable modem without having the need to read as a kernel daemon thereby reducing the processing requirements of the cable modem (CM) as well as elimination of operators need to maintain multiple boot files. Currently millions of cable modems are being provisioned globally but one of the significant weaknesses that may be perceived in the DOCSIS provisioning model is the lack of a dynamic method of updating a service. Few of the key issues troubling multiple-system operators (MSO's) and subscribers can be described as:

Sharing personal content across router boundaries.
    Optimizing in-home network paths.
    MSO visibility and management of the home network.
    Consistently administering and enforcing policy—Firewall—Parental controls.
    Remote access.
    New services.

Many service providers operate their network with little or weak primary control over its configuration and management. This means that the network configuration and state is effectively stored in a giant distributed database. This is not inherently a bad state of affairs, but network operators aren't always good at getting the information in that giant database into a form that is usable for making business decisions that optimize the use of the network and the services that run over it. The boot file handles the DNA of any given DOCSIS cable modem and this can be made dynamic and programmable using the SDN platform 100 in accordance with the present teaching which overcomes the issues listed above. The operator is able to reduce the service provisioning process to a single transaction rather than a complex series of steps involving multiple systems and humans.

The SDN platform 100 may be used to abstract the service definition and topologies from the physical access and the devices used to provide the service. This abstraction allows for maximum flexibility in building a provisioning system that is agnostic to the access technologies being used. For example when complex services like L3 VPN (virtual private routed network) need to be offered to customers or a certain predefined Provider Edge (PE)-Customer Edge (CE) routing protocol configuration needs to be done to ensure correct routes are announced/filtered complex and chained services, such as providing inline firewall services, or providing access to cloud services from within a VPN are required to be done. Higher layer services like these are examples of services where the service definition may extend beyond attachment circuits and elements in the network participate in the routing protocol and require more state exchange between the end point and the network, so in these today's DOCSIS provisioning model may be inadequate and hence our combination of SDN to manage such orchestration via OpenFlow is extremely useful for rapid provisioning and service updates.

The customer portal 118 is the hub of information and self-service for the customer. It provides fast access to a broad range of reports and tools, which enable the customer to select and understand their services and more critically, how these are being used. Through an intuitive menu, the customer portal 118 enables the customer to access a wide portfolio of applications, services and upgrades, which can in real-time, be purchased, delivered and usable within minutes. For reporting, the customer is able to personalize individual portal access and information shown, detailing for example; usage, time of day, browsing activity and much more. The customer, now armed with this data has an informed choice as to what they then allow, prohibit and restrict. The customer portal 118 displays one or more performance enhancing options based on analytics gathered by the SDN co-controllers 105. The configuration data associated with the SDN co-controllers 105 is updated in response to the end user selecting one or more performance enhancing options. Thus, the performance of the devices 104 and the overall network 103 may be optimised based on input received from the end user through their customer portal 118. The mapping function enables the customer to have visibility of all the connected devices in their home, through a simple topology with click down statics on each user. The portal 118 also provides real time notifications and recommendations which may be of interest, based upon the customer profile and service usage. Extending the reach of the portal, these notifications can also be simply linked to mobile devices for off-line access to alerts.

The installed SDN co-controller 105 may use the updated configuration data to modify operational configuration of the networked devices 104. For example, the operational configuration of the networked devices may be modified to increase a quality of service parameter. The operational settings of the networked devices may be updated in real-time while the devices 105 are online. Alternatively, the operational configuration of the networked devices 105 may be updated while the devices 105 are in a sleep-mode. In an exemplary arrangement, the operational configuration of the networked devices 105 are updated by changing to an alternative communication channel to avoid cross-talk from neighbouring devices. The communication channel may be a WIFI channel, for example. In another example, the operational configuration of the networked device may be changed to reduce power consumption of the devices 105. In this way, the operational configuration of the networked device 105 maybe changed by reprogramming a power interface. In another example, the operational configuration of the networked device 105 maybe changed to increase priority to available bandwidth or decrease priority to available bandwidth. It is envisaged that the SDN co-controllers 105 may be configured to assign a first priority setting to a first set of network devices 104 and assigning a second priority setting a second set of network devices 104. The first priority setting may be associated with a first bandwidth limit, and the second priority setting may be associated with a second bandwidth limit.

Customer portal 118 is able to render real-time data on the network usage, performance and services selection, utilizing the comprehensive flow of information and control between the Orchestrator, Cloud and Agent. With a suite of tools, APIs, data and languages the customer portal 118 is able integrate and interact with the intelligence of an OpenFlow SDN Orchestrator to enable on-demand, real time self service provisioning from cloud to device 104. The ever-increasing demand from customers for service quality, high availability, choice and customer care is placing the Network Operations Centre (NOC), with its associated tools, process and resources under overwhelming pressure. With services migrating from supply to demand, there has never been such a focus on operational excellence. The days of operations being completely removed from the customer experience are gone. Migrating such tools into the Call Centre to be at the forefront of Customer Technology is evolving at pace, SDN challenges the norms of network integrated data/control plane, with Cloud and NFV abstracting the physical topologies. Meantime, Operations is expected as a minimum to keep up but stay ahead of the curve.

The administration portal 116 has been designed to provide a suite of tools and reports which allow insight and intervention from the physical through to the application layer. Couple this with the ability to apply applications to detect and react dynamically to network events thus tackling issues real-time, far faster than has been possible with legacy tools and process. Operations through various levels of access from Supervisor to user a selection of windows, which provide the full FCAPS (the recognized standard model and framework) suite of network management tools and reporting. It also allows the application of simple automated rules to proactively re-configure the network 103 and virtual services, minimizing outages and service failures predicated on certain conditions being collated back from the network/devices.

Figure 5:
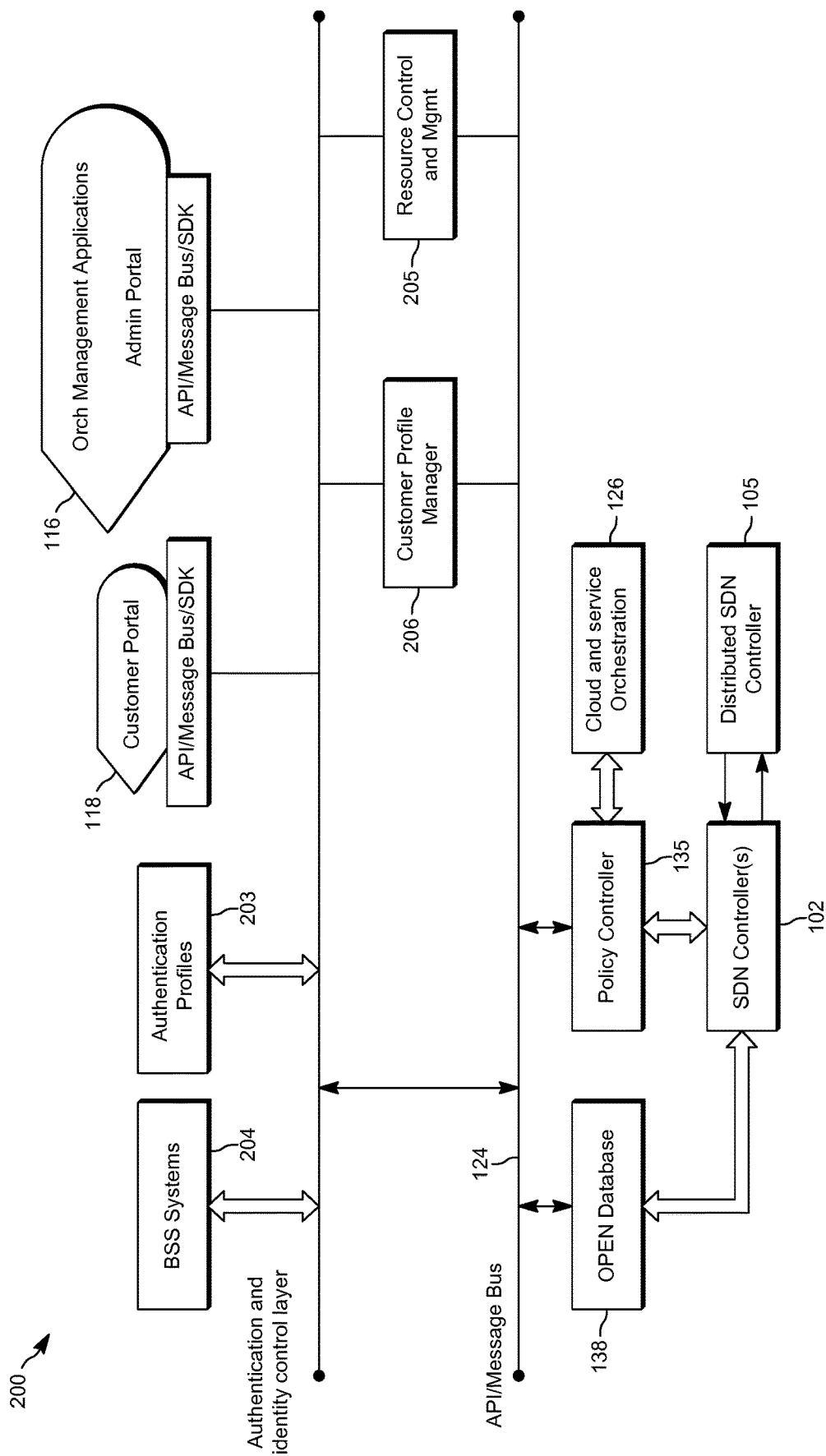
FIG. 5 is a block diagram illustrating another exemplary SDN platform in accordance with the present teaching.
Figure 6:
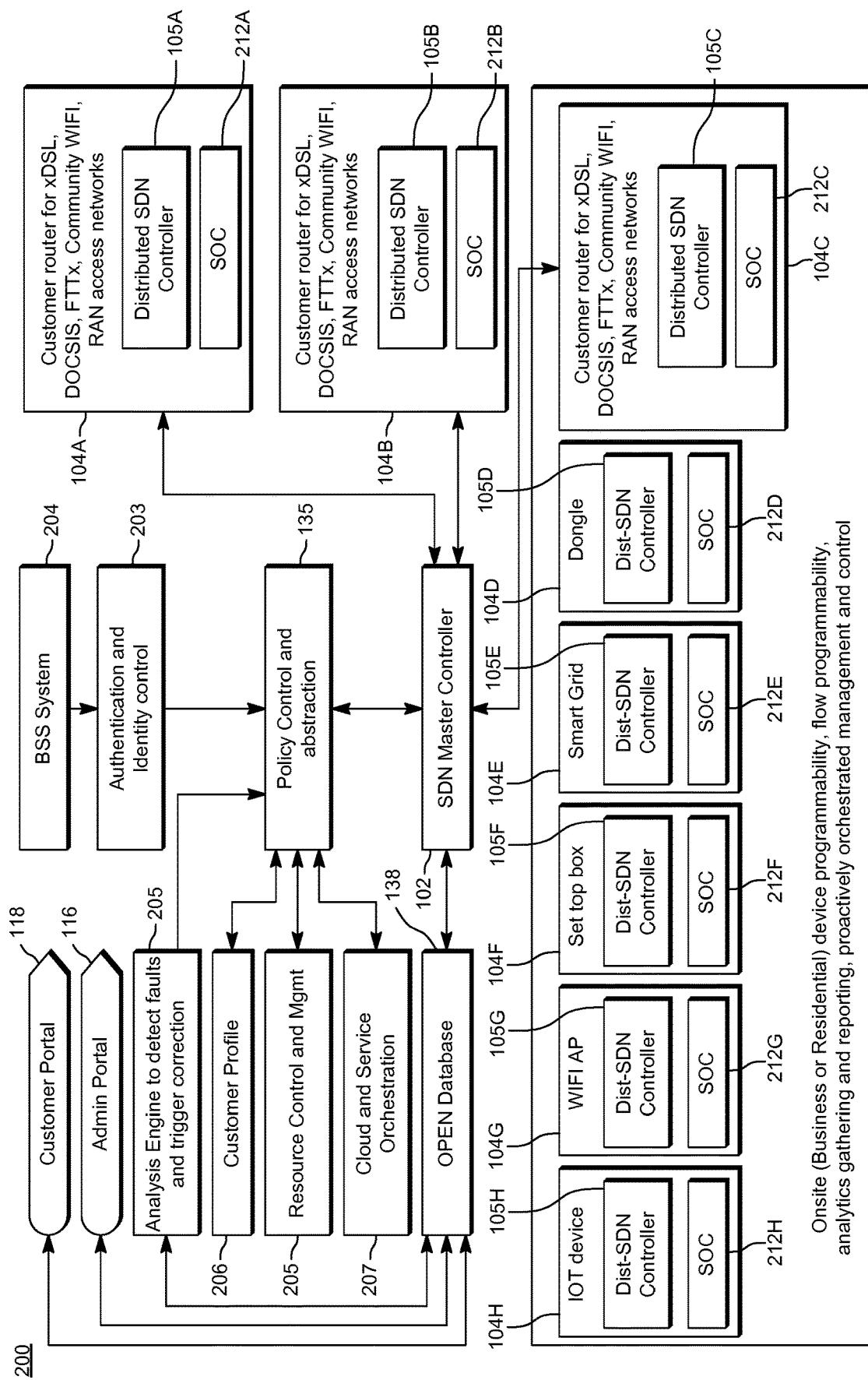
FIG. 6 is a block diagram illustrating details of the architecture of FIG. 5.
Figure 7:
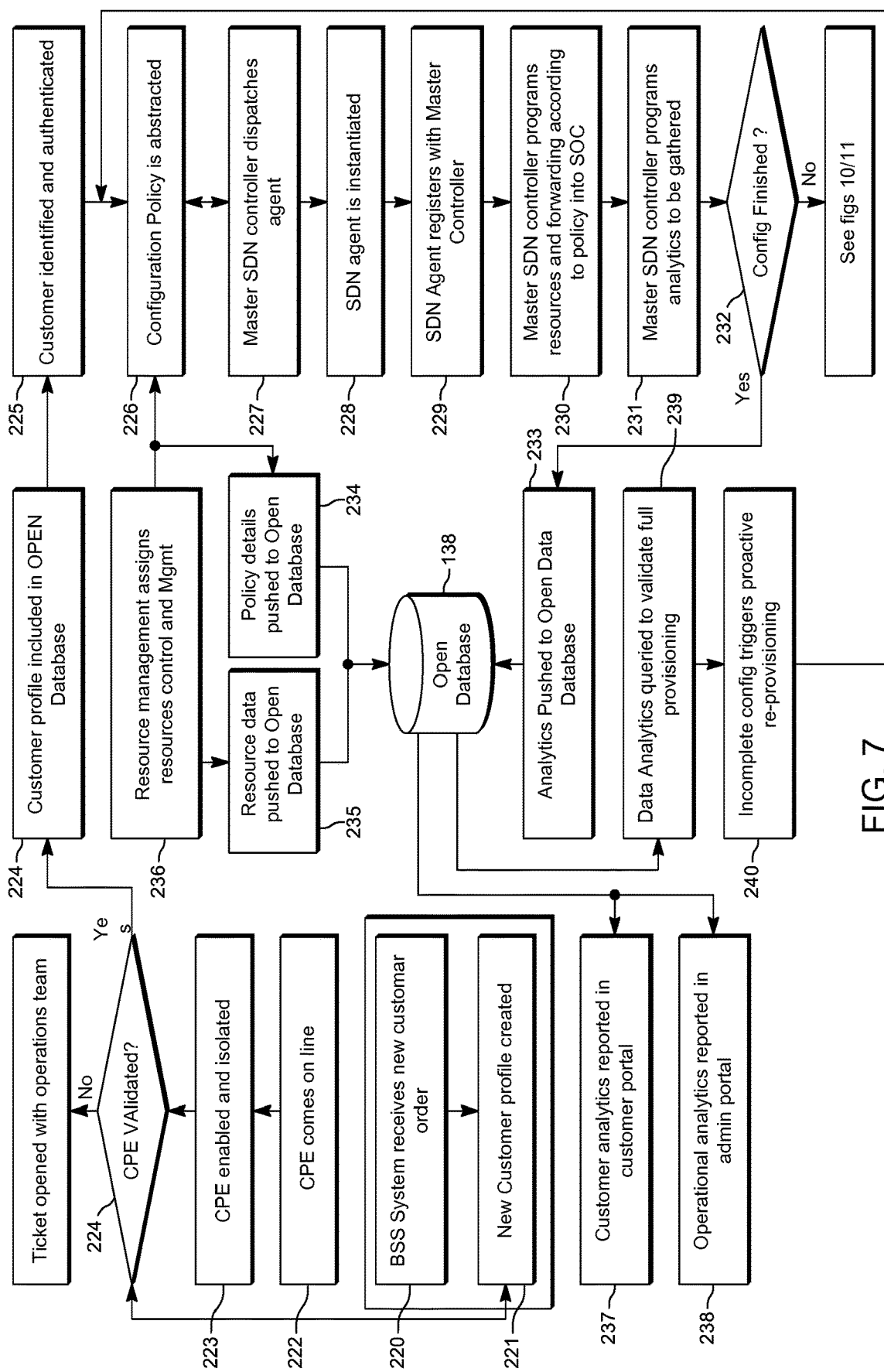
FIG. 7 is a flow chart illustrating exemplary steps during the operation of the SDN platform of FIG. 1 or FIG. 5.

Referring to now FIGS. 5-7 which illustrates an exemplary SDN platform 200 which is also in accordance with the present teaching. The SDN platform 200 is substantially similar to the SDN platform 100 and like elements are indicate by similar reference numerals. BSS system 204 receives a new customer order, step 220. A new customer profile is created by customer profile manager 206, step 221. A customer-premise equipment (CPE) device 104 comes on line, step 222. The CPE 104 is enabled and isolated, step 223. The CPE 104 is validated by authentication module 203, step 224. The new customer profile is stored in an open database 138, step 224. The customer is identified and authenticated by authentication module 203, step 225. Policy controller 135 communicates with a customer profile manager 206, resource controller 205 and orchestration module 207 and abstracts a configuration policy for the new customer, step 226. A master SDN controller 102 generates appropriate distributed co-controllers 105A-105H and dispatches the distributed co-controllers 105A-105H to the CPE devices 104 associated with the new customer, step 227. The SDN co-controller 105 are instantiated on the CPEs 105A-105H, step 228. The distributed co-controllers once installed on the CPEs 104A-104H register with the master SDN controller 102, step 229. The master SDN controller 102 programs appropriate resources and routing tables into the system on chips 212A-212H of each CPE 211A-211H using the distributed co-controllers 105A-105, step 230. After the co-controllers are installed they operate as local routing engines on the CPEs 104. The configuration of the CPEs 104A-104H is finished, step 232. The distributed SDN co-controller 105A-105H push analytics about their respective CPEs 104A-104H back to the open database 138 via the master SDN controller 102. Customer analytics from each CPE 104A-104H is accessible to customer from the open database 138 via their customer portal 118, step 237. Operational analytics from each CPE 104A-104H is accessible to the admin portal 116 from the open database 138, step 238. The resource controller 236 is operable to push resource data to the open database, step 235. Furthermore, the resource controller 236 is operable to push policy data to the open database 211, step 234. An analysis engine 205 is operable to analyse the data in the database 138, and modify the policy and control data for the respective CPEs 104. The modified policy and control data is pushed to the distributed co-controllers 105 by the master SDN controller 102 in order to reconfigure operational settings on the CPEs 104 to enhance the performance of the devices 104. Enhancing performance of the CPEs 104 may include, by way of example, improving the quality of service experienced by the end user. In this way, it will be appreciated by those skilled in the art that the health of the CPEs 104 are continuously being monitored by the co-controllers 105, and if a problem is detected the co-controllers 105 are able to rectify the problem by reconfiguring the CPEs 104 in real-time.

Figure 8:
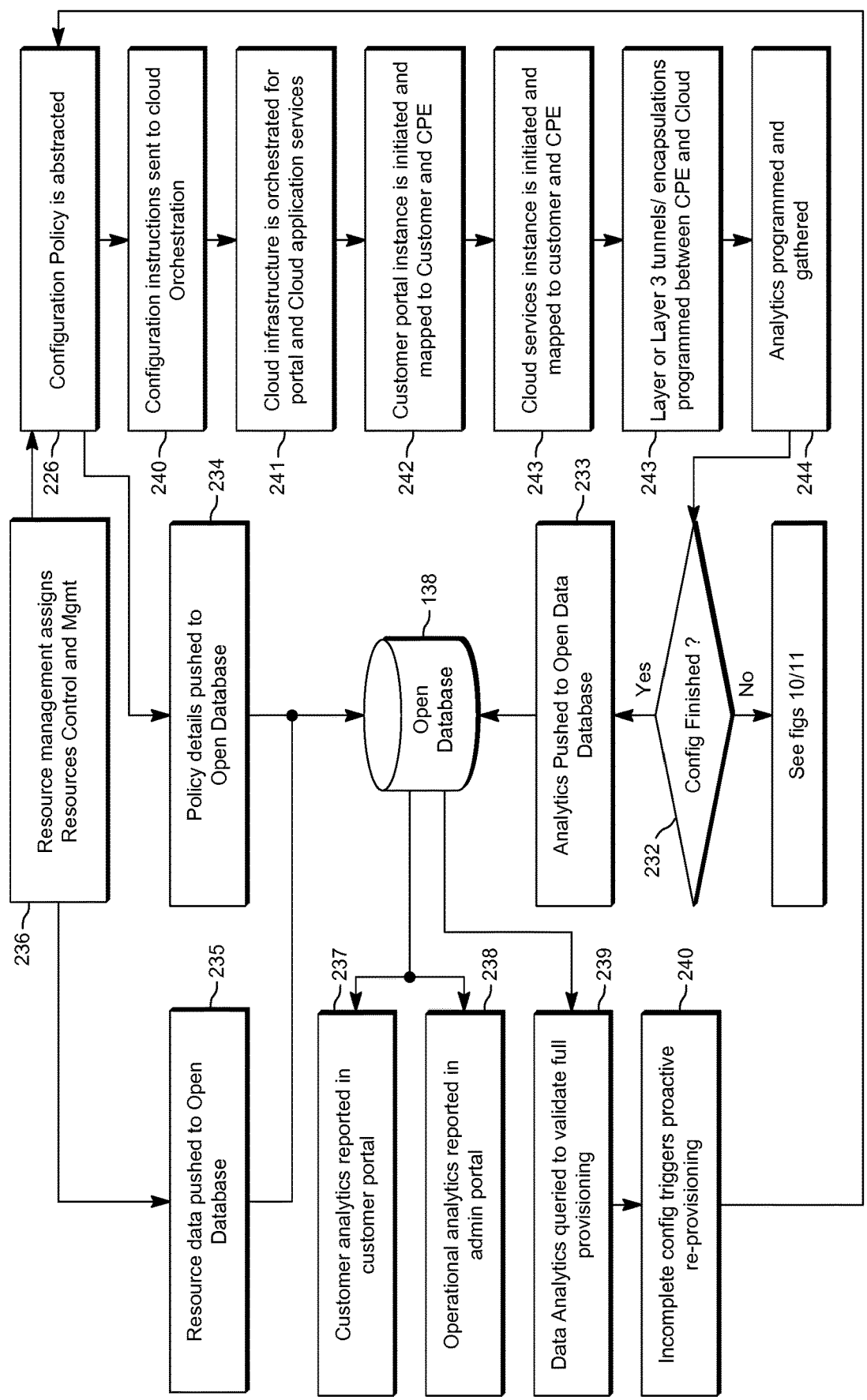
FIG. 8 is a flow chart illustrating exemplary steps during the operation of the SDN platform of FIG. 1 or FIG. 5.

Referring to now FIG. 8 which illustrates a flowchart showing exemplary steps of the SDN platform in operation which is also in accordance with the present teaching. The flow chart of FIG. 8 is substantially to the flow chart 7 and like elements are identified by similar reference numerals. The main difference is that steps 240-244 of FIG. 8 replaces steps 227-231 of FIG. 7 while the remaining steps are substantially similar. After the configuration policy is abstracted in step 226, configuration instructions are sent to a cloud orchestration, step 240. Cloud infrastructure is orchestrated for portal and cloud application services, step 241. A customer portal instance is initiated and mapped to the customer and the CPE 104, step 243. Communication tunnels are opened between the CPE 104 and the cloud service instance, step 243. Analytics is programmed and gathered from the CPEs, step 244. The operation of the remaining steps is as previously described with reference to FIG. 7.

Figure 9:
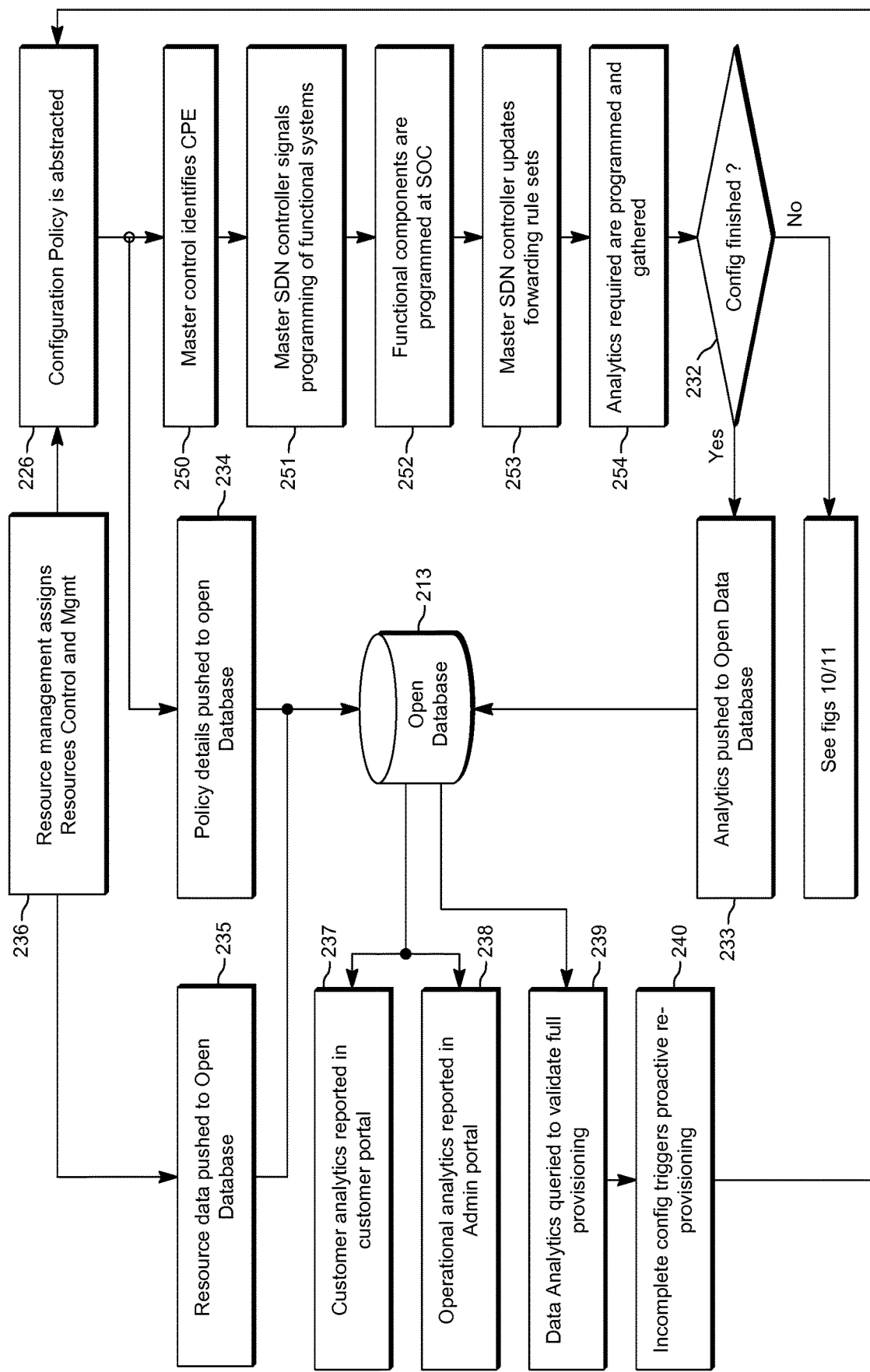
FIG. 9 is a flow chart illustrating exemplary steps during the operation of the SDN platform of FIG. 1 or FIG. 5.

Referring to FIG. 9 which illustrates another flowchart showing exemplary steps of the SDN platform in operation which is also in accordance with the present teaching. The flow chart of FIG. 9 is substantially to the flow chart of FIG. 7 and like elements are identified by similar reference numerals. The main difference is that steps 250-254 of FIG. 9 replaces steps 227-231 of FIG. 7 while the remaining steps are substantially similar. After the configuration policy is abstracted in step 226, the primary control identifies the CPE 211A-211H, step 250. The master SDN controller 102 initiates programming of system functions, step 251. Functional components are programmed at SOC, step 252. The co-controllers 105 update forwarding rules sets for the respective CPE 211A-211H. The required analytics are programmed into the CPE 211A-211H and gathered. The operation of the remaining steps is as previously described with reference to FIG. 7.

Figure 10:
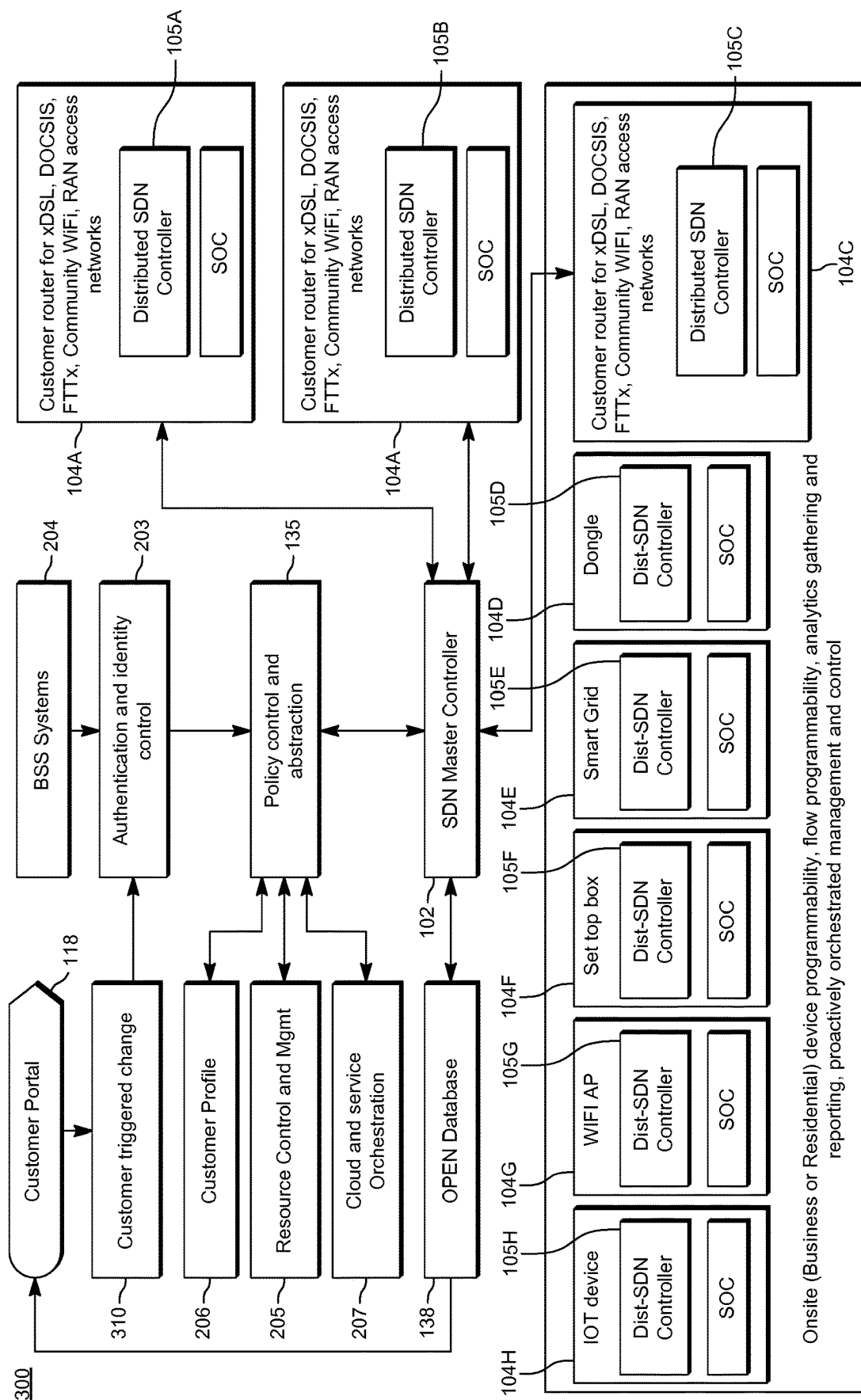
FIG. 10 is a block diagram illustrating another exemplary SDN platform in accordance with the present teaching.

Referring to FIG. 10 there is illustrated another SDN platform 300 which is also in accordance with the present teaching. The SDN platform 300 is substantially similar to the SDN platform 100 and like components are indicated by similar reference numerals. The main difference is that only one portal is provided, namely customer portal 118, which allows a customer to trigger a change to the policy and/or control data, step 310. The change of policy and/or control data are implemented on the CPE 104A-104H by the co-controllers 105 in a manner as previously described. Otherwise the operation of the SDN platform 300 operates in a similar fashion to the SDN 100.

Figure 11:
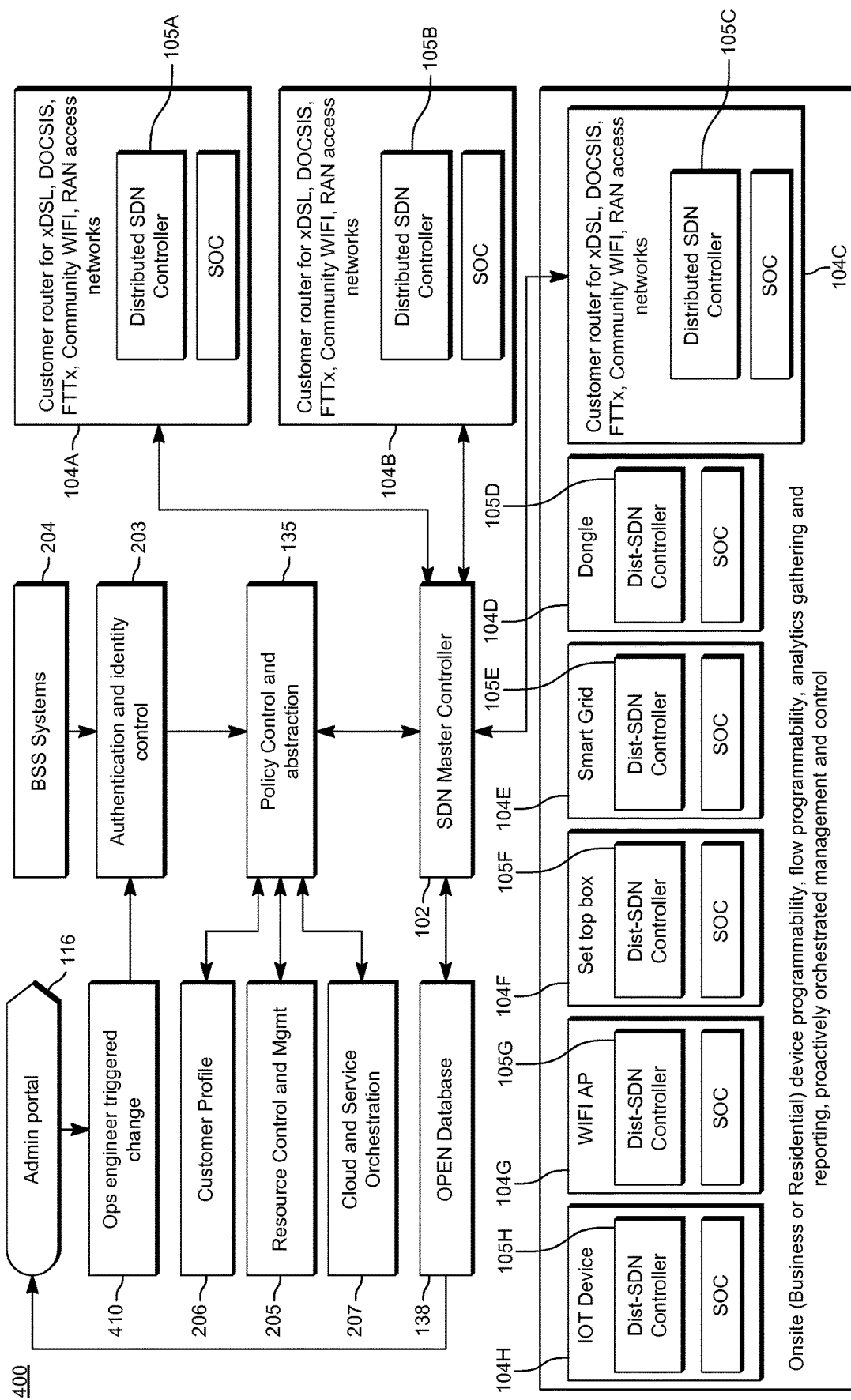
FIG. 11 is a block diagram illustrating another exemplary SDN platform in accordance with the present teaching.

Referring to FIG. 11 there is illustrated another SDN platform 400 which is also in accordance with the present teaching. The SDN platform 400 is substantially similar to the SDN platform 100 and like components are indicated by similar reference numerals. The main difference is that only one portal is provided, namely administration portal 118, which allows an operator to trigger a change to the policy and/or control data, step 410. The change of policy and/or control data are implemented on the CPE 104A-104H by the co-controllers 105 in a manner as previously described. Otherwise the operation of the SDN platform 400 operates in a similar fashion to the SDN 100.

Figure 12A:
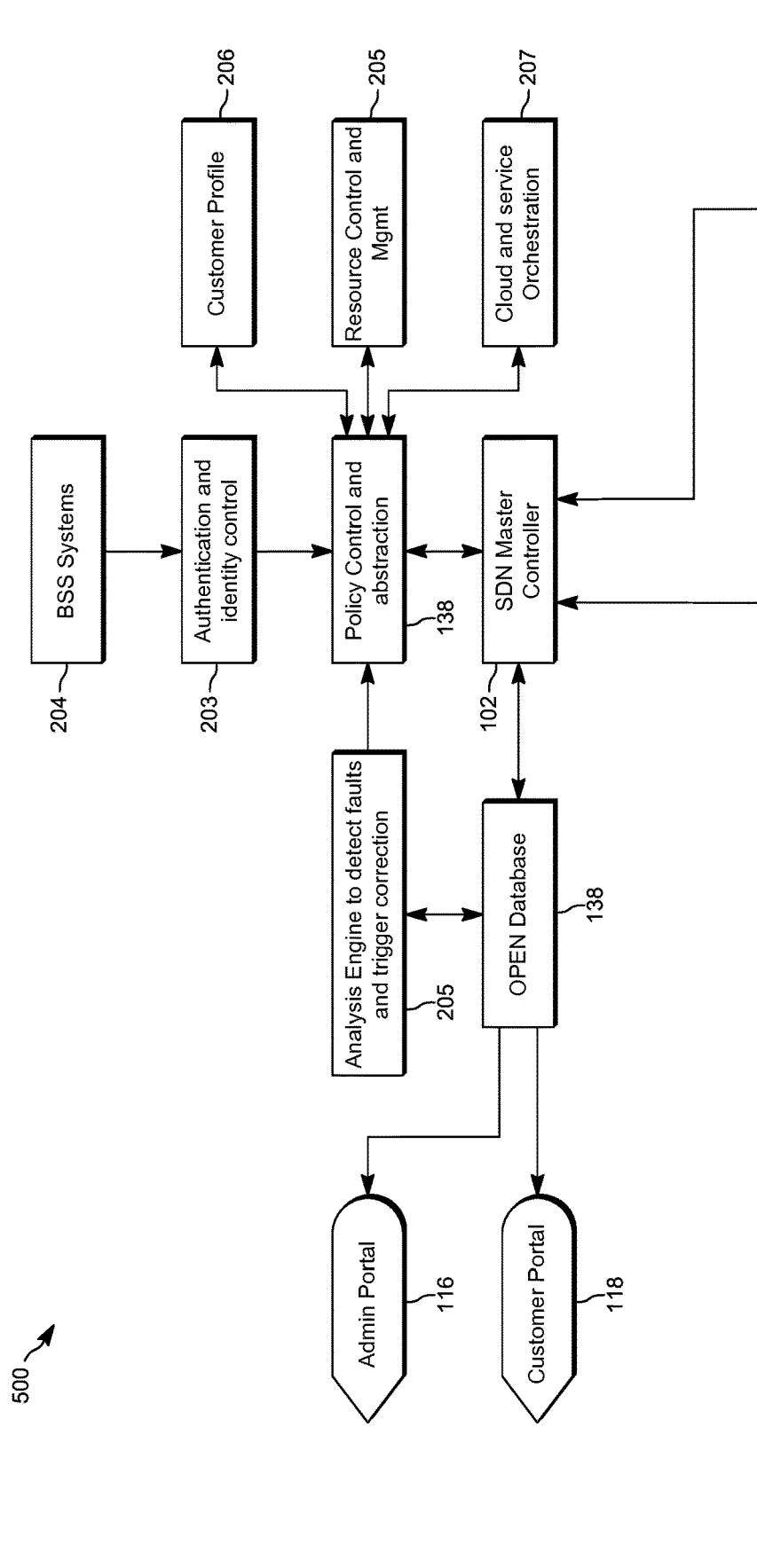
FIG. 12A is a block diagram illustrating another exemplary SDN platform in accordance with the present teaching.
Figure 12B:
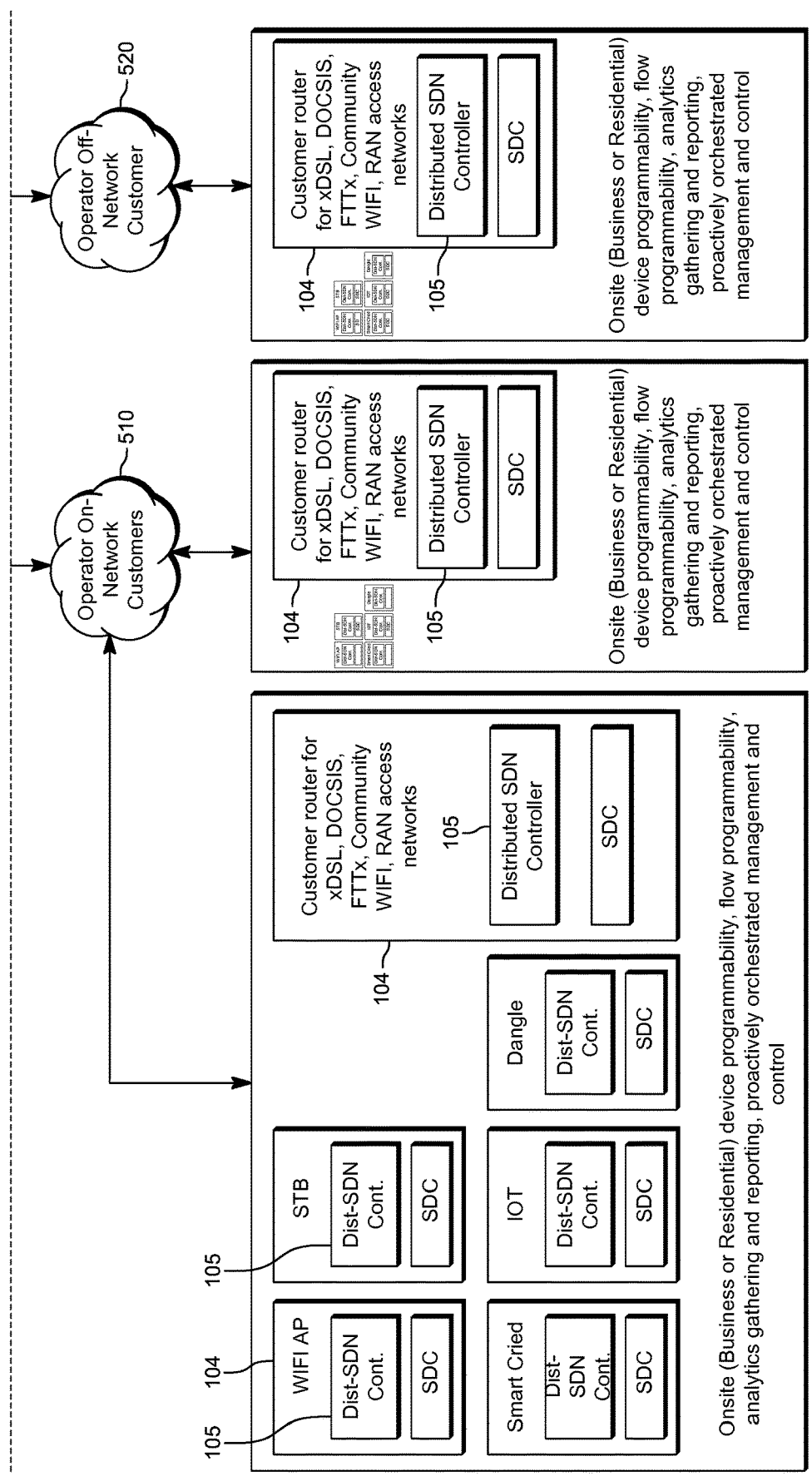
FIG. 12B is a block diagram illustrating another exemplary SDN platform in accordance with the present teaching.

Referring to FIG. 12 there is illustrated another SDN platform 500 which is also in accordance with the present teaching. The SDN platform 500 is substantially similar to the SDN platform 100 and like components are indicated by similar reference numerals. The main difference is that the co-controllers 105 are distributed to CPEs 104 on two separate networks, namely, first network 510 and second network 520. Otherwise the operation of the SDN platform 500 operates in a similar fashion to the SDN 100.

Figure 13:
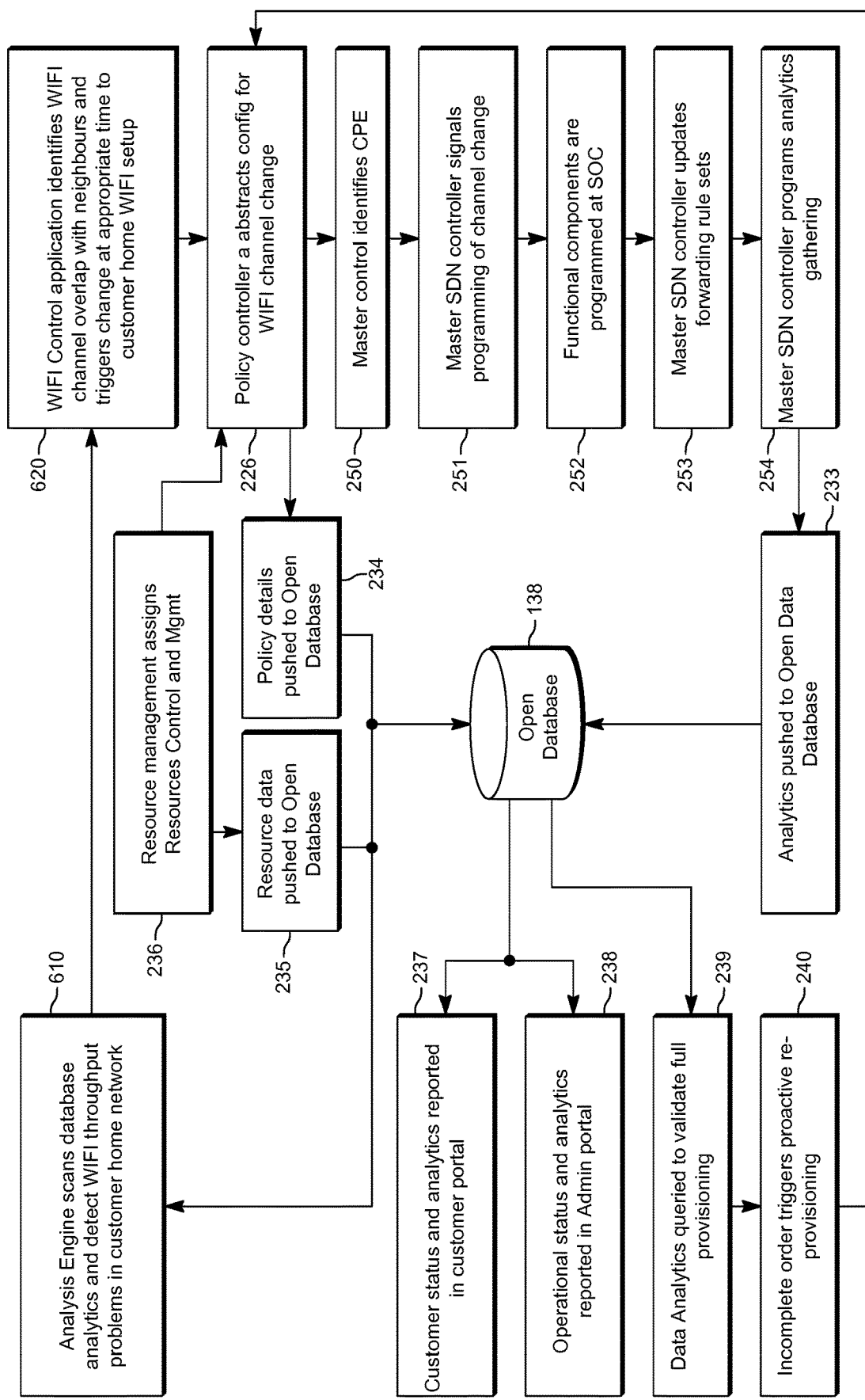
FIG. 13 is a flow chart illustrating exemplary steps during the operation of the SDN platform of FIG. 1, FIG. 5, FIG. 11, FIG. 12A or FIG. 12B.

Referring to FIG. 13 which illustrates another flowchart showing exemplary steps of the SDN platform in operation which is also in accordance with the present teaching. The flow chart of FIG. 13 is substantially to the flow chart of FIG. 9 and like elements are identified by similar reference numerals. In this exemplary embodiment, the analysis engine 205 scans the analytics stored in the database 138 which have been haverested from the CPEs 104 by the co-controllers 105. The analysis engine is operable to detect WIFI throughput problems in a customer's home network, step 610. A WIFI control application is in communication with the analysis engine and is operable to interpret the output from the analysis engine. In this example, the WIFI control application identifies a WIFI channel overlap with neighbours and triggers a change to the customer's home WIFI setup at an appropriate time by modifying policy/configuration data for the customer, step 620. The policy control engine 135 abstracts configuration data for a WIFI channel change, step 226. The change of configuration is implemented on the WIFI router by the appropriate co-controllers 105 in a manner as previously described. In this example, the SDN platform seamlessly updates the WIFI channel without requiring any input from the user. The remaining steps are similar to those previously described with reference to FIG. 9.

Figure 14:
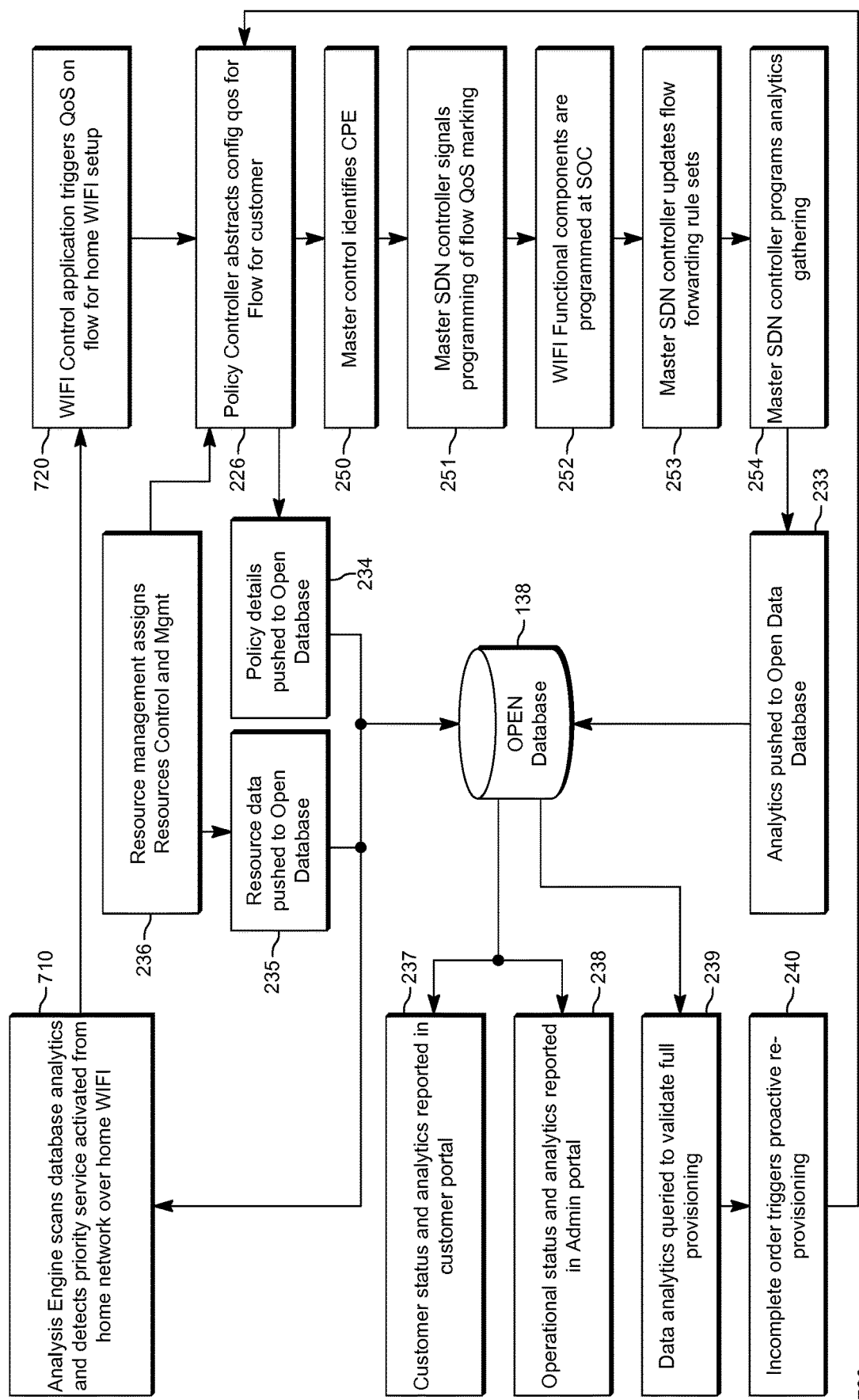
FIG. 14 is a flow chart illustrating exemplary steps during the operation of the SDN platform of FIG. 1, FIG. 5, FIG. 11, FIG. 12A or FIG. 12B.

Referring to FIG. 14 which illustrates another flowchart showing exemplary steps of the SDN platform in operation which is also in accordance with the present teaching. The flow chart of FIG. 14 is substantially to the flow chart of FIG. 9 and like elements are identified by similar reference numerals. In this exemplary embodiment, the analysis engine 205 scans the analytics stored in the database 138 which have been haverested from the CPEs 104 by the co-controllers 105. The analysis engine 205 is operable to detect selected priority services activated from a home network over general home WIFI, step 710. The selected priority service may assign a higher bandwidth limit to certain devices over other devices. A WIFI control application is in communication with the analysis engine and is operable to interpret the output from the analysis engine 205. In this example, the WIFI control application triggers quality of service changes to the customer's home WIFI setup by modifying policy/configuration data for the customer, step 720. The policy control engine 135 abstracts configuration data for a QoS change, step 226. The master controller 102 identifies the appropriate CPE 104 that requires reconfiguration in view of the QoS change, step 250. The change of configuration is implemented on the appropriate CPE 104 by the appropriate co-controllers 105 in a manner as previously described. The remaining steps are similar to those previously described with reference to FIG. 9.

Figure 15:
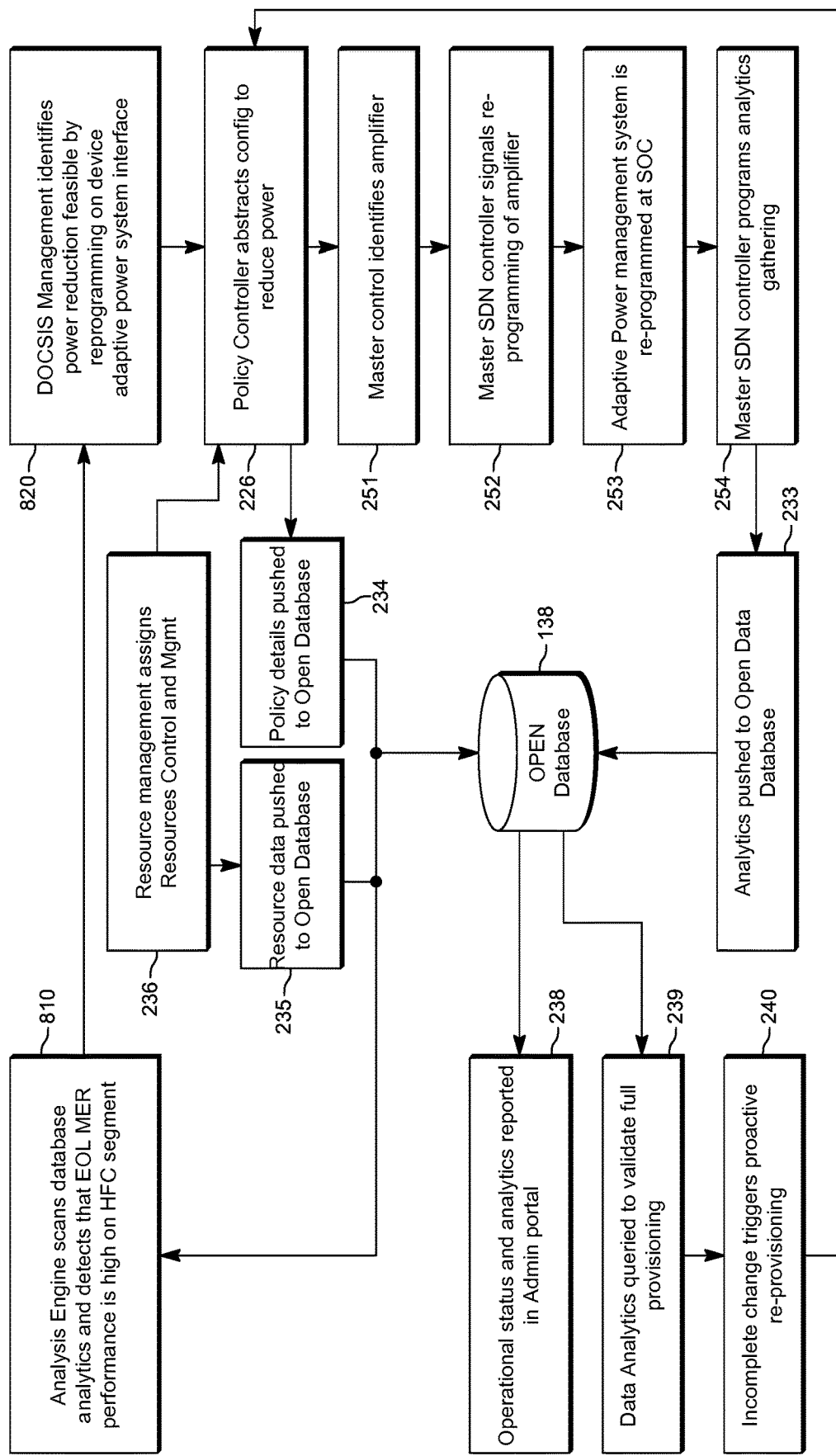
FIG. 15 is a flow chart illustrating exemplary steps during the operation of the SDN platform of FIG. 1, FIG. 5, FIG. 11, FIG. 12A or FIG. 12B.

Referring to FIG. 15 which illustrates another flowchart showing exemplary steps of the SDN platform in operation which is also in accordance with the present teaching. The flow chart of FIG. 15 is substantially to the flow chart of FIG. 9 and like elements are identified by similar reference numerals. In this exemplary embodiment, the analysis engine 205 scans the analytics stored in the database 138 which have been haverested from the CPEs 104 by the co-controllers 105. The analysis engine 205 is operable to detect that the end of line (EOL) modulation error rate (MER) performance is high on the hybrid fiber coaxial (HFC) segment. A DOCSIS management application is in communication with the analysis engine and is operable to interpret the output from the analysis engine 205. In this example, the DOCSIS management application identifies that power reduction is feasible by reprogramming a power interface of the CPEs 104. The policy control engine 135 abstracts configuration data for implementing the reduction in power, step 226. The master controller 102 identifies the appropriate amplifier 104 that requires reprogramming to implement power reduction. The change of configuration is implemented on the appropriate amplifier by the appropriate co-controllers 105 in a manner as previously described. The remaining steps are similar to those previously described with reference to FIG. 9.

Figure 16A:
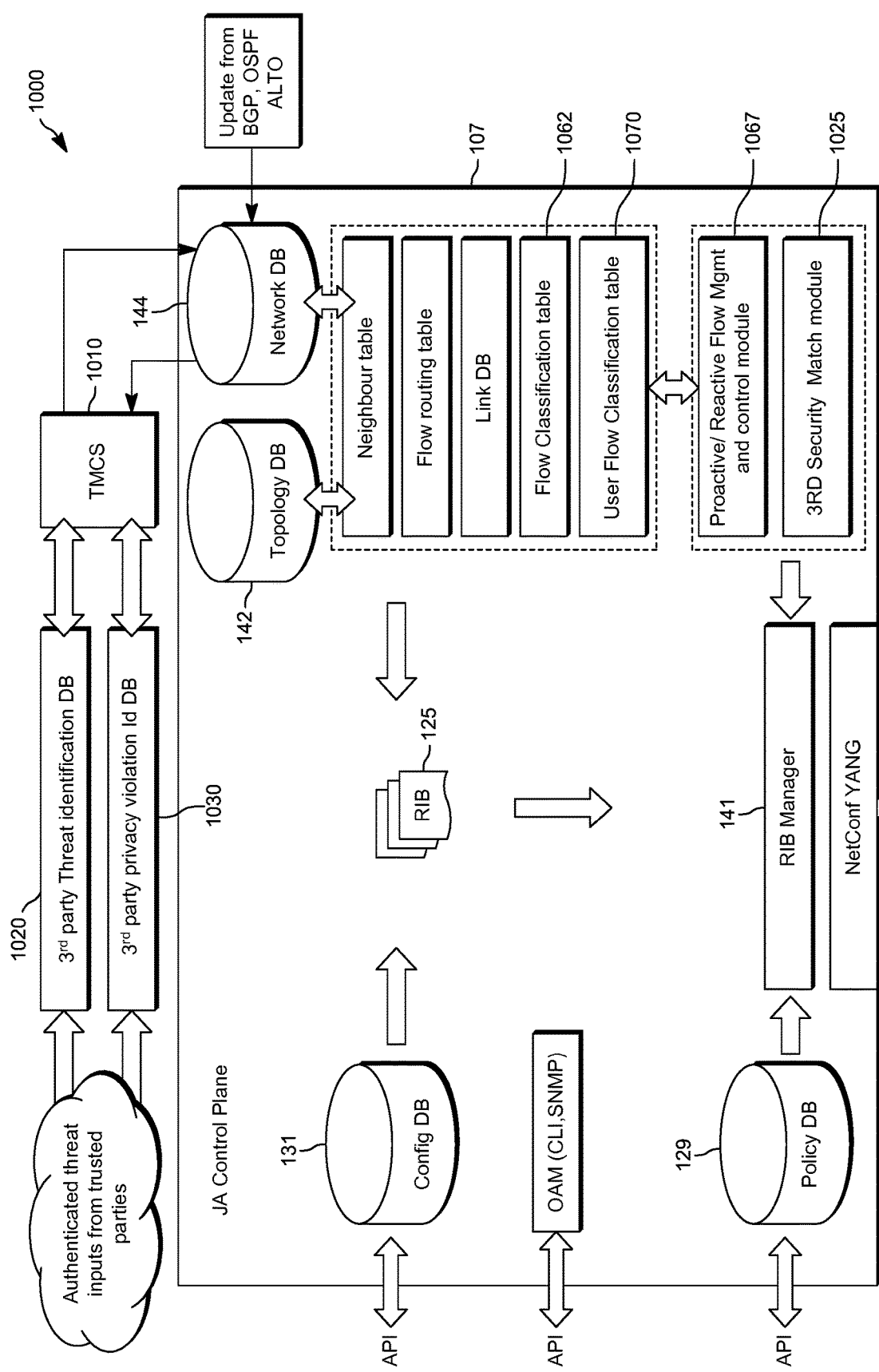
FIGS. 16A and 16B is a block diagram illustrating details of an SDN architecture which is also in accordance with the present teaching.
Figure 16B:
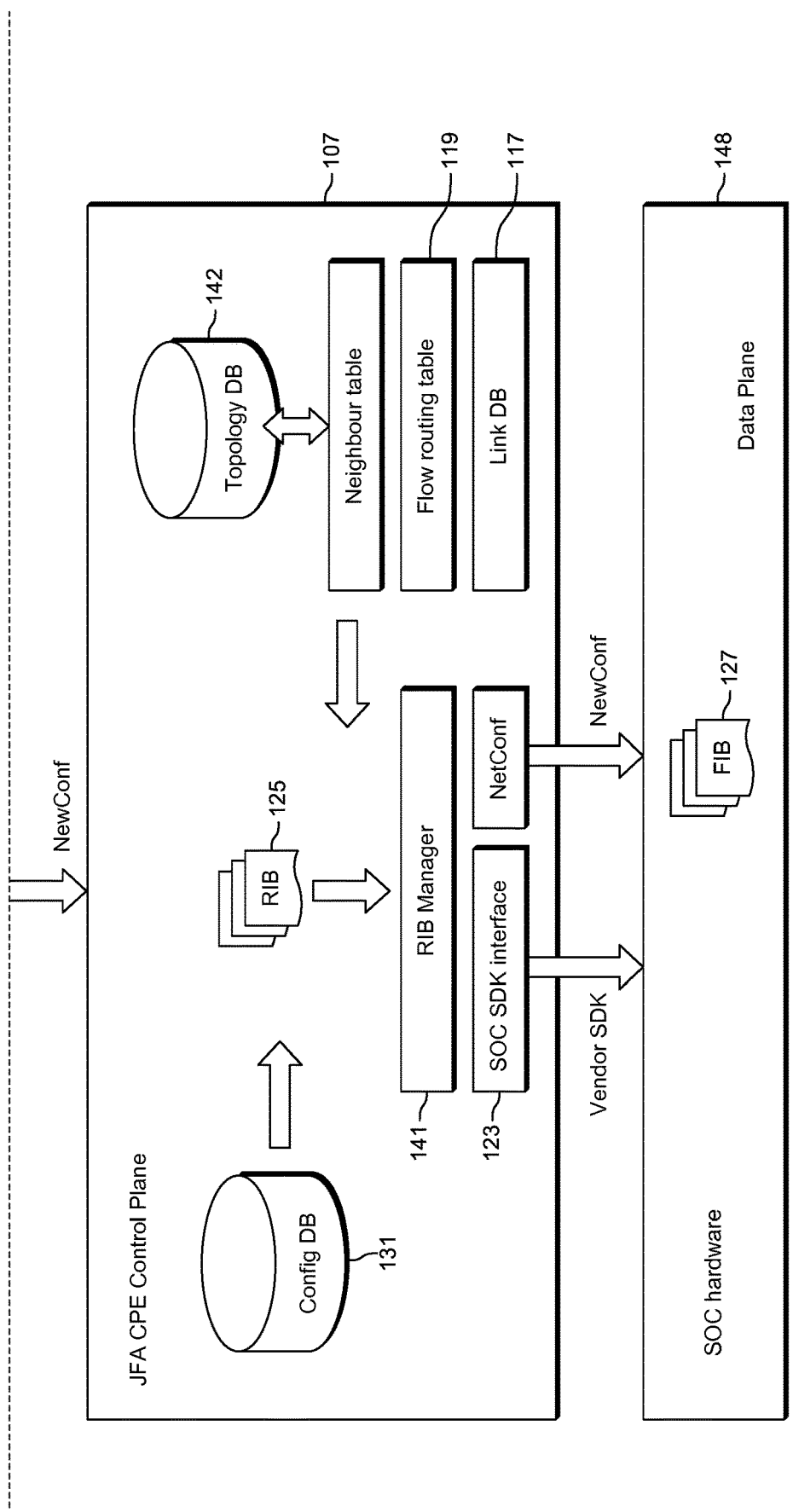
Figure 17:
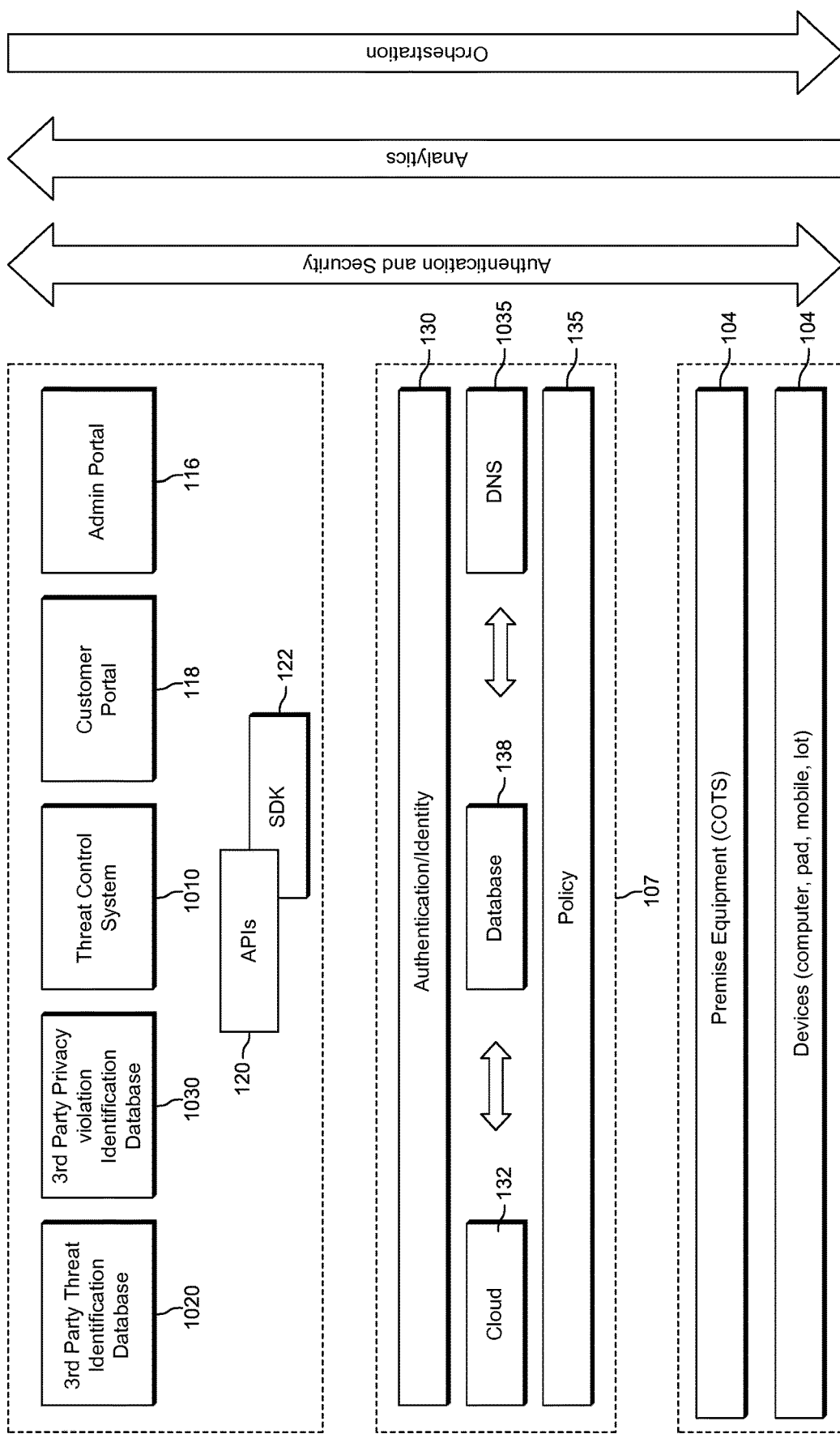
FIG. 17 is a block diagram illustrating details of the SDN architecture of FIGS. 16a and 16B.
Figure 18:
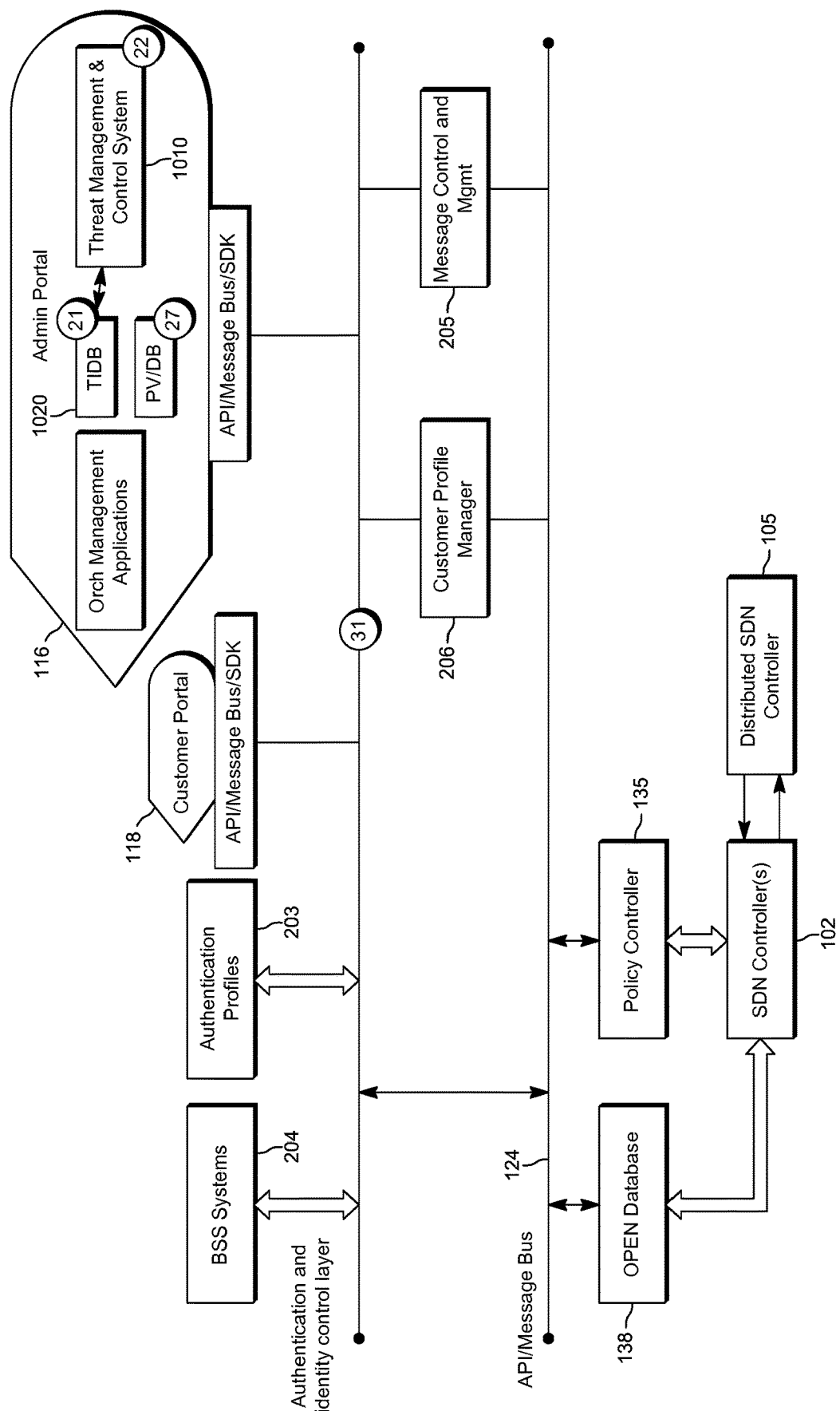
FIG. 18 is a block diagram illustrating details of the SDN architecture of FIGS. 16A and 16B.

An exemplary architecture 1000 in accordance with the present teaching is illustrated in FIGS. 16A-B, 17 and 18. The architecture 1000 enables security threats and privacy violations to be addressed by leveraging the programmability of flow control on SDN devices to identify and to not forward identified traffic which contain threats or privacy violations. Flow based forwarding is programmed on the end user device 104 to limit the forwarding of threat traffic or privacy violation traffic. FIGS. 16A-17 include many similar components previously described with reference FIGS. 3-5 and like elements are indicated by similar reference numerals. These like elements operate in a similar fashion as previous described. The architecture 1000 includes a master SDN controller 102 configured for managing data flow control on the SDN network. The master SDN controller is operable to generate routing data for the networked devices 104. The master SDN controller 102 is configured to generate a plurality of discrete co-controllers 105 each associated with a particular end user. Each SDN co-controller 105 includes routing data for an associated networked device 104. The SDN co-controller 105 are dispatched by the master SDN controller 102 to the networked devices 104 associated with the respective end users for controlling thereof. The networked devices 104 may request access to a destination on the SDN network, for example, a uniform resource locator (URL). In response a domain name system (DNS) 1035 initiates an interaction with the requesting networked device 104. The DNS 1035 relays the DNS data associated with the requested URL to a threat management control system (TMCS) 1010. The TMCS 1010 is configured to determine if the requested URL has an associated security criteria. The TMCS 1010 communicates the threat status to the SDN co-controller 105 associated with the requesting networked device 104. The SDN co-controller 105 is operable to generate routing data for the requesting networked device 104 on which it is installed based on the threat status to allow or deny access to the requested URL.

In the exemplary embodiment the TMCS 1010 is in communication with a threat identification database (TIDB) 1020 and a privacy violation identification database (PVIDB) 1030. The TIDB 1020 stores particulars of destinations which are classified as having a malicious threat criteria associated with them. The PVIDB 1030 stores particulars of destinations which are classified as having a privacy threat associated with them. For example, such destinations are known to harvest private data from users without the user knowledge. The TMCS 1010 is configured to process and validate the destination requests against the threat identification database (TIDB) 1020 and the PVIDB 1030 and is operable to ensure that users do not connect to malicious destinations. For example, malicious destinations may include suspect websites, content delivery networks (CDN)s, website and CDN IP addresses, domains, URLs etc. The TMCS 1010 permits for the acceptance and inputs from a DNS query where it then checks and validates the user and applies the rules of associated with a user profile. Once the TIDB 1020 has been queried for a particular route and the user profile validated against it the TMCS 1010 communicated with the SDN orchestration system database 138. The master SDN controller 102 then propagates a message to the SDN co-controller 105 on the CPE 104 with a appropriate routing data for the requesting device 104. A SDN security match module 1025 within the device 104 validates whether the route is to be applied. If it is to be applied then a forwarding entry is inserted by the SDN co-controller 105 in the forwarding table, otherwise an entry is included to forward the traffic to a quarantine destination. The TMCS 1010 reports to the database 138 such that data may be extracted and used for reporting threats and/or privacy violations to the customer portal 118 and/or the administration portal 116.

The TIDB 1020 may be a private internet security company's database which stores data on dangerous and suspect websites, CDNs, website and CDN IP addresses, domains, URLs etc. This data is gathered by various companies and organizations around the world on known threats concerning security topics around anti-phishing, malware and domain control etc. Such databases are already in use by government security agencies, financial service firms, and e-commerce, technology companies, social networking and Internet Service Providers (ISPs) to help support themselves in the fight against attacks.

The function of the PVIDB 1030 is to store data on internet companies who use their applications to harvest private data from users once the applications are installed on end user devices 104. This is specifically relevant for where an internet service or product being supplied by an internet company does not comply with local regulations for the individual countries on the gathering of data from a subscriber. The PVIDB 1030 may be an extension of the TIDB 1020 or a separate system. The function of the PVIDB 1030 is to ensure that the consumer are protected against privacy violations from companies who do not comply to certain criteria, for example, expectations of decency and local regulations by blocking all traffic from subscriber of the platform 1000 to their systems on a flow basis. The PVIDB 1030 permits subscribers to decide what data they may wish to send to the internet instead of on-net parties deciding for themselves what they will take, irrelevant of whether the customer is aware or not.

The architecture 1000 utilises a highly resilient control layer 107 which facilitates the distribution of control through a federation of distributed SDN co-controllers 105. Each customer is able to select a security and/or a privacy policy by selecting configuration options via the customer portal 118 and this is then transmitted using an API 120 or the SDK 122 through the control plane 107 where the user is first authenticated by authentication module 203 before a policy is applied by the policy controller 135 for known IP address and devices which are gathered from the databases 1020, 1030. The policy controller 135 abstracts the appropriate policy and applies the policy to the distributed SDN co-controllers 105 which are installed on the devices 104.

Figure 19:
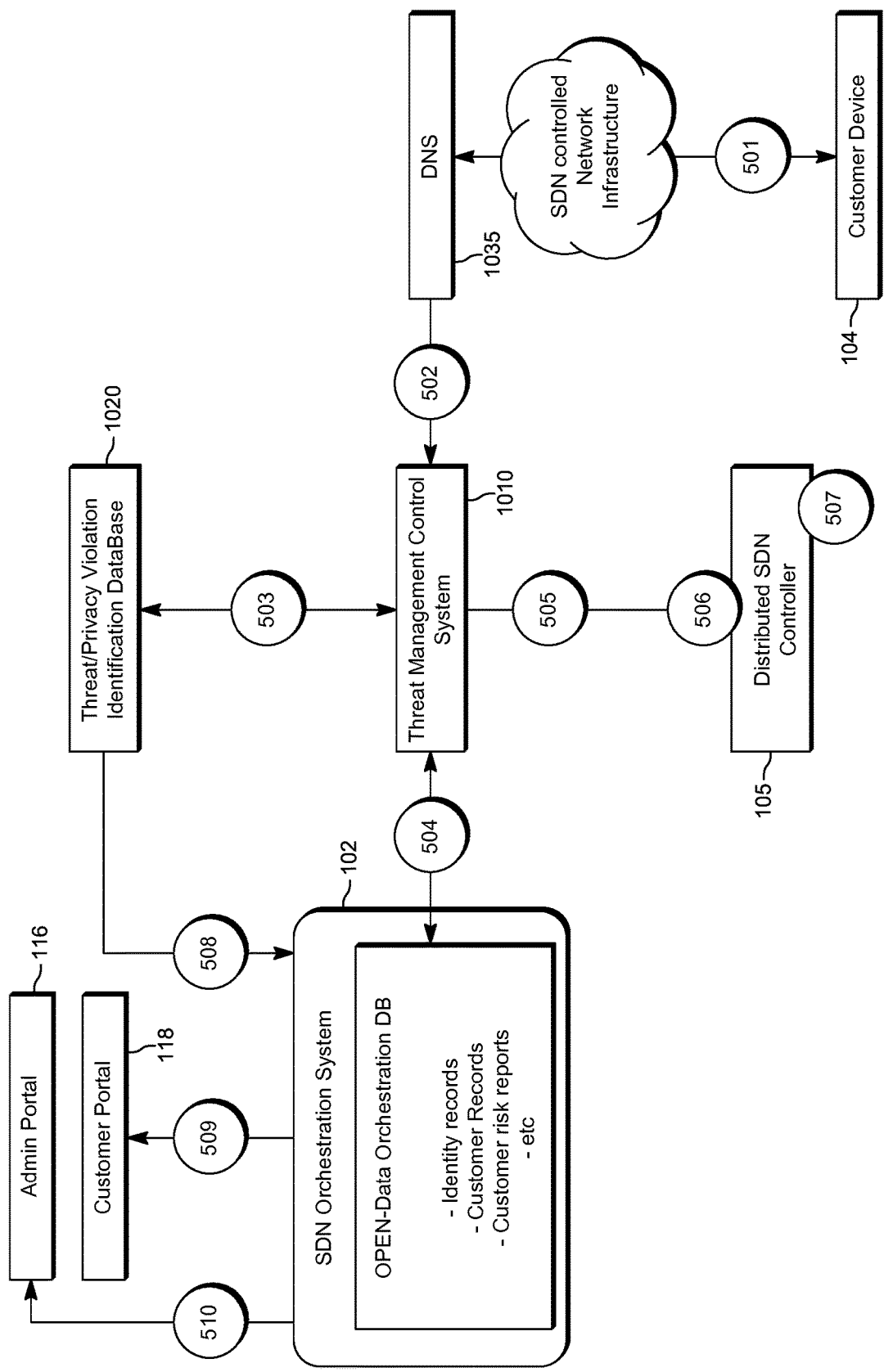
FIG. 19 is a flow diagram illustrating exemplary steps during the operation of the SDN platform of FIGS. 16A-18.

FIG. 19 illustrates a flow chart detailing exemplary steps implemented by the architecture 1000. In this exemplary example, a customer device 104 requests access to a URL. This request to a URL may be triggered by the customer themselves or it may be triggered by traffic generated by Adware, Malware, BotNet, privacy violation, traffic on the users device 104. In this scenario a DNS query/response interaction is initiated between a subscriber application on the device 104 and an operator's domain name system (DNS) 1035, step 501. The DNS 1035 initiates a lookup up process and also transmits a message containing a subscriber IP, destination IP and URL over a secure API to the TMCS 1010, step 502.

The receipt of the message from the DNS 1035 triggers the TMCS 1010 to query the PVIDB 1030 and/or TIDB 1020 (or cache) to identify if the URL contained in the message has a threat/privacy status associated with it, step 503. The TMCS 1030 may also request the subscriber identity classification in order to validate the user profile classification, step 504. Upon receipt of a response from the TIDB 1020 and the PVIDB 1030 (user identification and classification) and (security/privacy classification), step 503, the TMCS 1010 sends the SDN co-controller 105 the URL threat status and customer classification, step 505. Table 1 and table 2 define exemplary definitions of the user and risk classifications identifiers which may be transmitted between the various systems to aid an understanding of the nature of the attack type and to define what expectations exist for the control of the traffic belonging to the end customer. The information provided in table 1 and table 2 are provided by way of example only and it is not intended to limit the present teaching to the exemplary values provided.

TABLE 1

Examplanary Threat/Privacy Violation classification

| Risk type | Definition | Traffic Type | Classification |
|---|---|---|---|
| Infection | Virus | Outbound Virus generated traffic | #A |
| User Under Attack | DDOS, BotNet, port scan | Inbound DOS traffic | #B |
| User data theft | Adware, Malware, etc | Outbound traffic | #C |
| User initiating attack | DDOS, port scan, BotNet | Outbound DOS traffic (user joining BotNet due to infection) | #D |
| Privacy Violation | Adware, Malware, etc | Outbound traffic | #E |
| Toxic Website | Website identified by TIDB as risky | Incoming traffic | #F |
| Toxic CDN | CDN identified by TIDB as risky | Incoming traffic | #G |
| Phished website | Website identified as being hijacked | User trying to access websites which have been hijacked | #H |
| Infrastructure under attack | Operator device under attack | Incoming traffic | #J |
| Privacy Violation traffic | Identified destination for invasive companies traffic | Outbound traffic | #K |

TABLE 2

Examplanary User profile classifications

| User profile classification | Action | Flow Classifications |
|---|---|---|
| Very limited internet access as per white list generated by TIDB | TMCS applies profile 1 | #1 |
| Medium internet access as per white list generated by TIDB | TMCS applies profile 2 | #2 |
| User defined TOD Domains to be blocked | TMCS applies profile 2 with TOD | #3 |

TABLE 2-continued

Examplanary User profile classifications

| User profile classification | Action | Flow Classifications |
|---|---|---|
| Adult with security protection | TMCS applies profile 4 | #4 |
| No protection, completely open | TMCS applies profile 5 | #5 |
| Permitted to Communicate only with authenticated users | TMCS applies profile 2 + blocking of incoming calls on approved communications applications (one for us to discuss with SKYPE) | #6 |
| Tunnel blocking | TMCS applies profile X + profile 7 | #7 |
| Privacy violation | TMCS applies profile 8 | #8 |

The SDN co-controller 105 has a security match module 1025 which is operable to define the appropriate forwarding decision in the device 104 for the user profile dependant on the risk classification, step 506. The forwarding decision may be to send the traffic to a quarantine destination (black-holed) or to permit the traffic to be forwarded to the destination as requested by the user. The SDN co-controller 105 then sets a forwarding entry in the flow routing table 119, step 507, against the requesting subscriber IP address dependant on the information received from step 506. If the URL is indicated as a risk site the TMCS 1010 generates a report, step 508, which is entered in the open database 138 which may be accessed by the customer via the customer 118. The report may be signalled by transmitting the IP address of the subscriber, the user profile identifier and the risk classification identifier to the database 138. The database 138 uses the IP address of the subscriber to map the security alert report to the customer record. This data is then imported into the relevant customer portal 118 to indicate a summary of the necessary security/privacy action that may be taken to alleviate the threat.

In addition to provide fuller information on the security/privacy risk the risk classification is analysed against the TIDB 1020, step 509, and a full detailed report may be generated on the risk which is reported to the customer portal 118. The detailed report includes information extracted from the database 138. The database 138 uses the IP address of the subscriber to map the security alert report to the customer record. In addition the detailed report may identify the risk, describe the effects of the risk and what action should be taken to address it.

The administration portal 116 is operable to compute regular security/privacy reports by running queries against the open database 138, step 510. These reports can also be accessed by the ISPs product, marketing and sales teams to permit them to create new products, to create promotions on the dangers of not being protected and to target individuals with promotions who are seriously infected. For the ISP a sales promotion may be used to get a customer to clean up their systems therefore removing unnecessary load from the network and to create marketing trend about the ISP itself being a safe network provider.

Figure 20A:
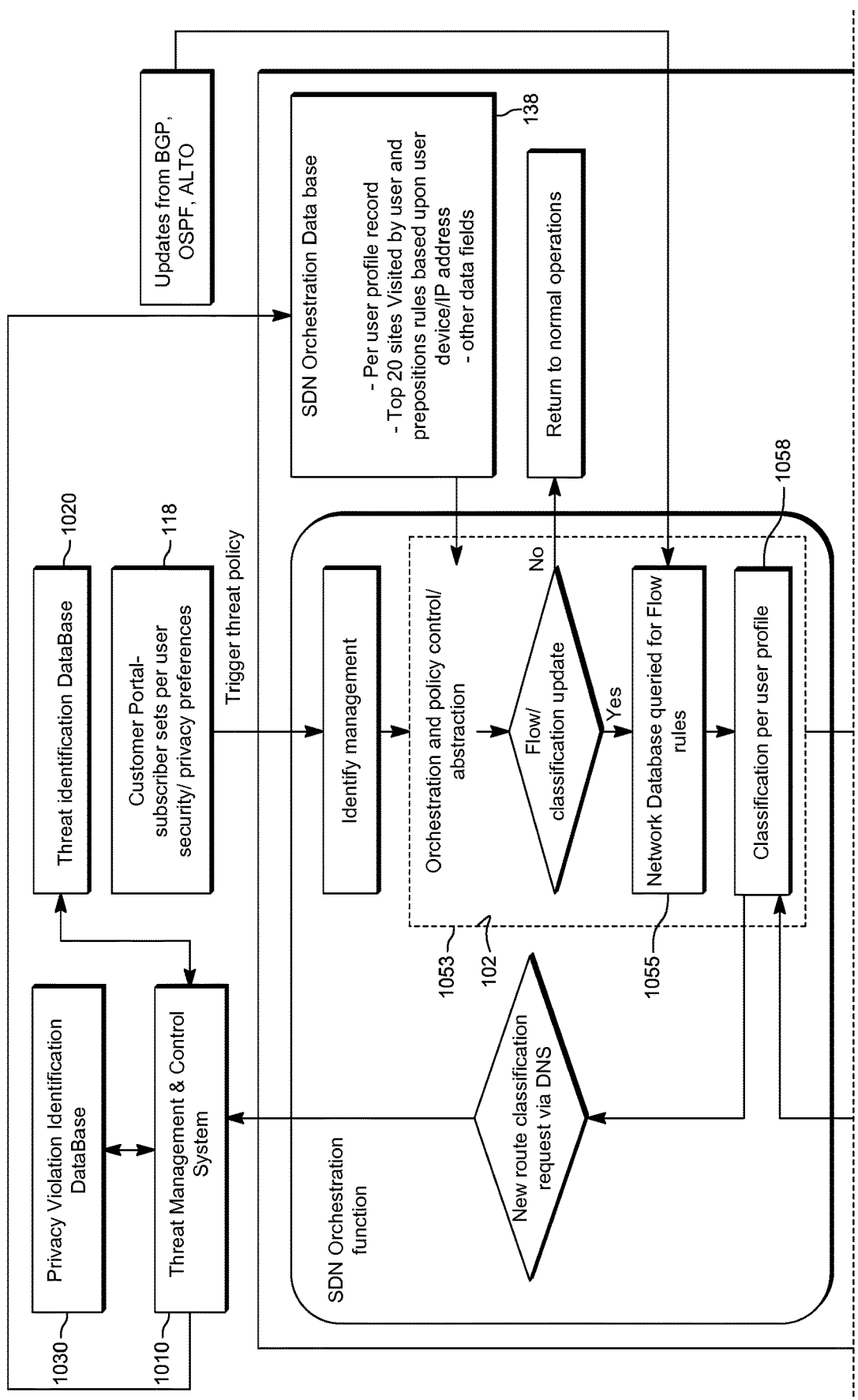
FIG. 20 is a flow diagram illustrating exemplary steps during the operation of the SDN platform of FIGS. 16A-18.
Figure 20B:
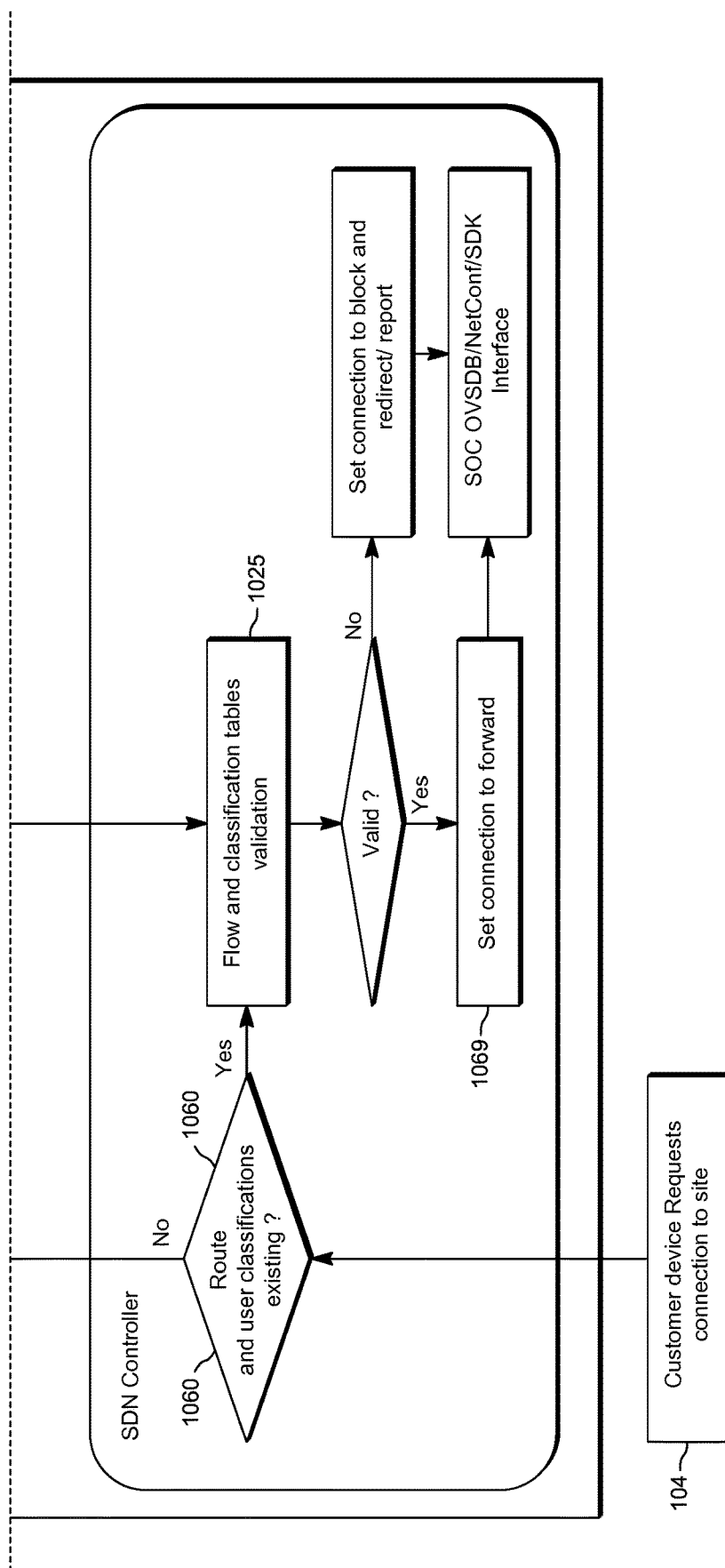

An exemplary work flow in accordance with the present teaching is illustrated in FIGS. 20A and 20B. The customer identifies the policy on a per user basis through configuration options provided in the customer portal 118 through the orchestration control layer 107 where the user is first authenticated and a policy is then applied, block 1053. For this policy to be applied data is extracted e.g. IP address and device ID, security or privacy policy chosen by customer via customer portal 118 from the open database 138. Also extracted from the open database 138 is a list of well known and commonly used sites by the customer. These forwarding entries are collated, block 1055 and classified, block 1058, before being communicated from the master SDN controller 102 to the SDN co-controller 105, block 1060. The SDN security match module 1025 matches for both privacy and threats, block 1062. The security match module 1025 matches the customer profile identifier in the user flow classification table 1065 against the risk and then a control module 1067 sets the forwarding path, block 1069, according to the decision made by the SDN security match module 1025. The flow classification table 1062 stores the threat classification as per the examples identified in Table 1. The user flow classification table 1070 stores the user profile classification as per the examples identified in Table 2.

Figure 21A:
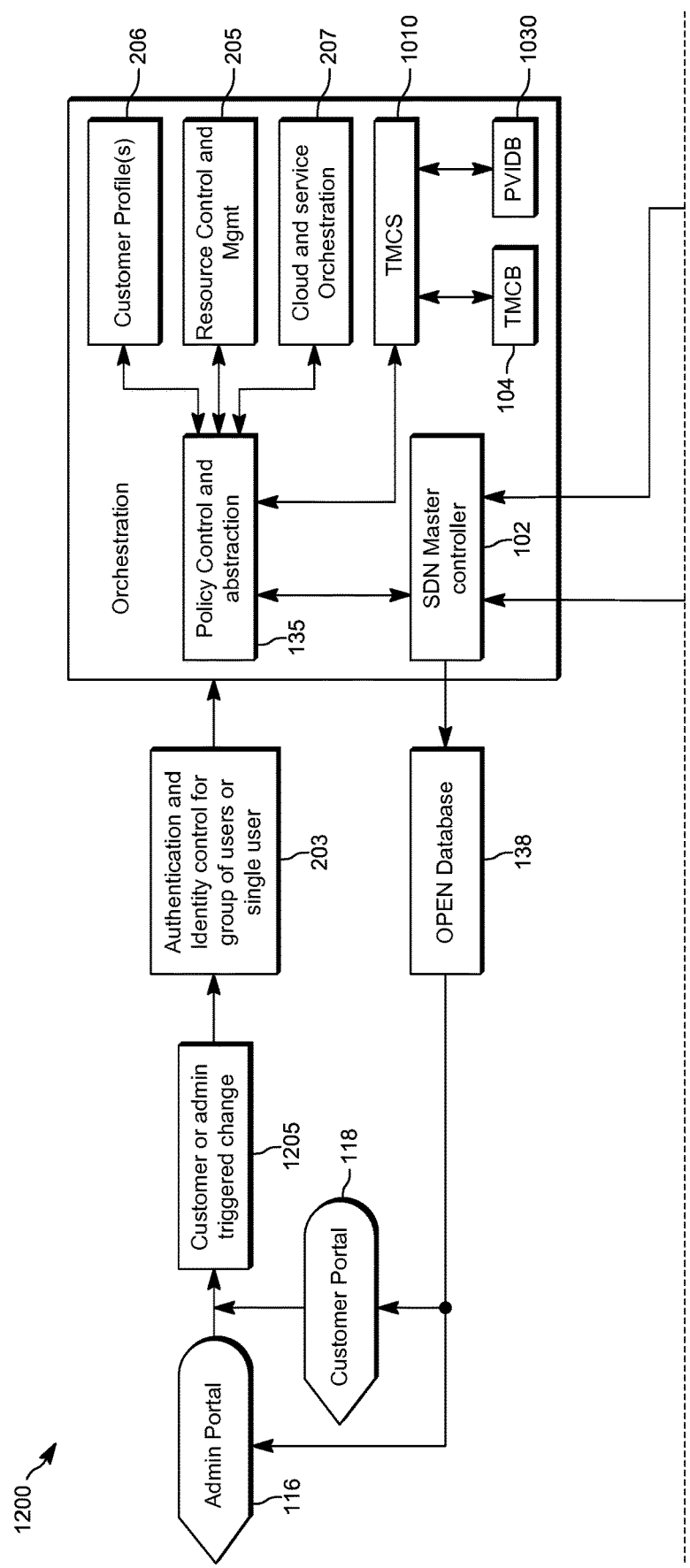
FIG. 21 is a block diagram illustrating details of an SDN architecture which is also in accordance with the present teaching.
Figure 21B:
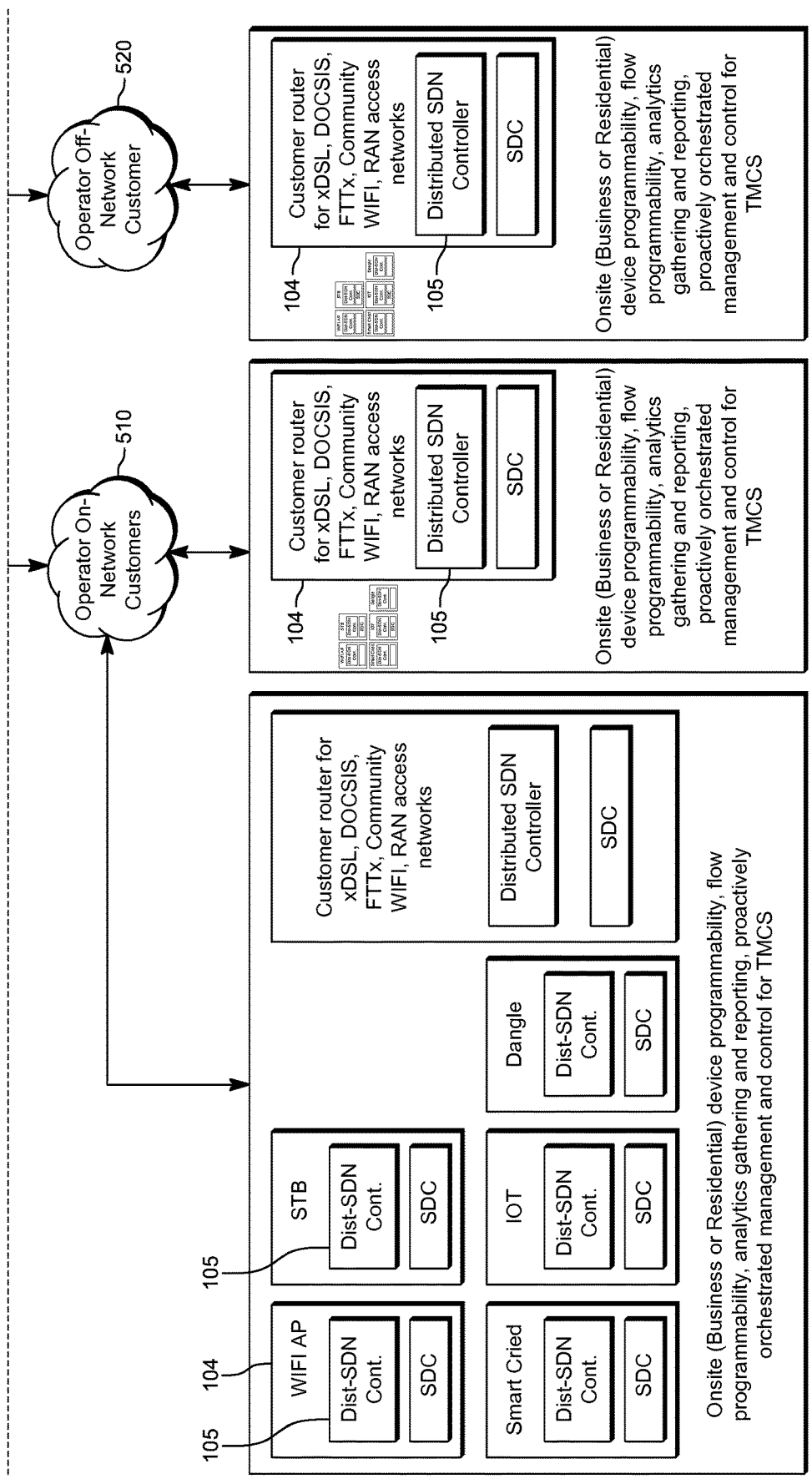

Referring to FIGS. 21A and 21B there is illustrated another SDN platform 1200 which is also in accordance with the present teaching. The SDN platform 1200 is substantially similar to the SDN platform 500 of FIG. 12 and like components are indicated by similar reference numerals. The main difference is that that the SDN platform 1200 includes the TMCS 1010, TIDB 1020 and the PVIDB 1030 as described with reference to FIGS. 16-21. The SDN platform 1200 illustrates the flow process implemented when a customer triggers a change in block 1205 to the threat or privacy policy that is applied to the settings used to protect their home/business. FIGS. 21A and 21B illustrates that an orchestrated control plane solution can deliver a policy change to enable a security or privacy policy change. In this example such a change can be triggered from the Admin portal 116 to protect in-home/IOT devices across access networks which operate on a variety of differing access technologies. Where the light weight SDN co-controller 105 is configured on the IOT device security and privacy policies can be applied to these devices directly.

This method permits network operators to control and orchestrate network environments using orchestrated and distributed SDN co-controllers 105 operate for both ON-Net and OFF-Net customer environments. By reducing the need for the CPE to be multi-purpose and cheap this allows the operator to focus on acquiring a CPE which delivers premium packet forwarding and control. By enabling the check against multiple 3rd party TIDB 1020/PVIDB 1030 this ensures greater awareness of threats and privacy violations at the earliest moment. As TIDB 1020/PVIDB 1030 are fed with the latest threats and privacy data this ensures that the controls applied, are the most relevant. In addition a cloud controlled solution enables full control for all devices without causing load on the end device and enables the rules for all devices to be applied consistently across all customer premises devices. This approach to security is particularly relevant for IOT as it permits for cloud control of all data coming from the customer premises. Specific flow based forwarding rules can be created for all IOT systems therefore ensuring that even if these devices are hacked that the light weight SDN co-controller 105 does not forward traffic to any other system. This delivers control and enhances protection of the end user from the malicious intent of some organisations and individuals. It supports the consumer in dealing with the complexity of security and privacy issues created across the internet and enables wide spread policy updates to be created when new attack vectors are identified and updated into the TIDBs 1020 and PVIDBs 1030.

Figure 22:
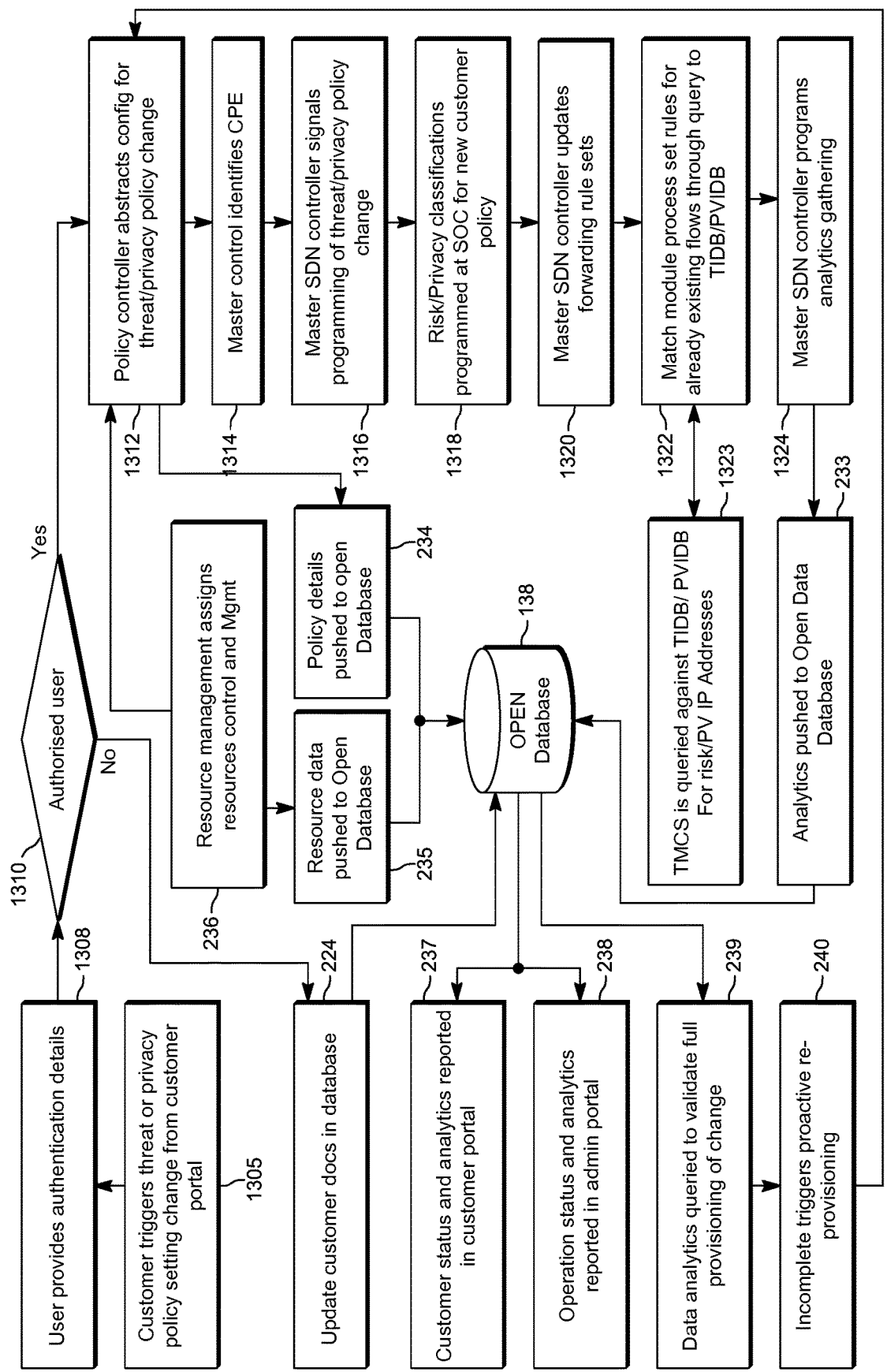
FIG. 22 is a flow diagram illustrating exemplary steps during the operation of the SDN platform of FIGS. 16A and 16B or FIG. 21.

Referring to FIG. 22 which illustrates another flowchart showing exemplary steps of the SDN platform in operation which is also in accordance with the present teaching. The flow chart of FIG. 22 is substantially to the flow chart of FIG. 9 and like elements are identified by similar reference numerals. In this exemplary embodiment, a customer triggers a threat or privacy policy settings change from customer portal 118, step 1305. The user provides authentication details via the customer portal 118, step 1308. The user is authenticated by the authentication module, step 1310. The policy controller 135 abstracts configuration data for the threat/privacy policy change, step 1312. The master SDN controller 102 identifies the appropriate device 104, step 1214. The master SDN controller 102 signals programming of the threat/privacy policy change to the SDN co-controller 105, step 1316. The risk/privacy classifications is programmed at the SOC on the CPE 104 for the customer policy by the SDN co-controller 105, step 1318. The master SDN controller 102 updates forwarding rule sets, step 1320. The security match module 1025 processes the set rules for already existing flows by querying the TIDB 1020 and/or PVIDB 1030, step 1322. The security match module 1025 queries the TMCS 1010 queried against TIDB/PVIDB for risky addresses, step 1323. The master SDN controller 102 cooperates with the SDN co-controller 105 to program an analytics gathering module on the CPE 104, step 1324. The SDN co-controller pushes the analytics to the open database 138, step 233. The remaining steps are similar to those previously described with reference to FIG. 9.

The advantages of the present teaching are many In particular, by moving to a SDN controlled flow forwarding solution this allows for new forwarding look ups from a customer, to be off-line processed against the privacy/security rules defined within the customer setting, using the TMCS 1010. This off-loads the security applications processing from the end device 104 and reduces the processing load on the multiple end CPE 104. Furthermore, this reduces the need to run security applications on the CPE 104, therefore reducing costs. In addition as security applications are no longer required to be loaded onto the CPE 104 this reduces processing and memory resources required by the CPE 104.

Where the SDN controlled CPE solution orchestrates a residential environment, this permits controls to be applied against a user in a granular fashion to ensure that controls can be quickly applied without the need to first rewrite the software and to send out updates and patches to individual systems. An example of one such policy push is that where a BotNet is identified as having been trigger that a policy push is made to any CPE which requests a route to the destination under attack. This ensures that the CPE do not join in the attack. In addition the orchestrated SDN control CPE is then identified as being infected with that particular BotNet. A report is then made to the consumer with a report of the device, its MAC address and other relevant information gathered. They are informed of the infection and told to address it. The same mechanism is used to control infections such as adware or malware etc. where known destinations are held in the TMCS 1010.

When any device within the consumer's environment requests such a destination, the lookup is checked against the TMCS 1010 and where a path is identified or considered to be questionable the flow based forwarding path is not fulfilled until further validation of the requested path is confirmed. The customer is notified of the nature of the possible violation and no forwarding path is installed until the path is fully verified to be safe and when the control system is sure that the route being requested is not something that was generated by an application that could cause a security breach.

This present method utilises a light weight and distributed SDN co-controller 105 that may be installed on any hardware, either through embedding the light weight SDN controller within the firmware or on an open CPE. This light weight SDN controlled solution breaks the proprietary nature of CPE and permits for the solution to be applied and controlled across multiple vendors' CPE solutions. The light weight SDN co-controller 105 programs the forwarding table of the CPE/consumer device 104 through using a route orchestration component which is either regionalised of centralised. This is used to set a defined list of policy rules generated from either multiple or a single threat database which has been populated with details of identified threats. These policies are communicated using open standard protocols and set within the forwarding rules of the CPE/consumer device or where the volume is to great, they reside in the lookup table of the route orchestration component which is either regionalised of centralised, depending on the scaling of the network. These security initiated forwarding rules, then drop traffic destined to these destinations for the devices that are required to be protected within the premises of the consumer. Not all rules are required to be stored on the device as when a new route is requested form the central route orchestration function and a check can be made to the 3rd party database to validate if the route is infact a non-toxic destination. This could be a route requested via DNS or another other standards based approach e.g. ARP for IPv4.

A person skilled in the art would appreciate that the end devices distributed to consumers do not have the capability to analyse or store the large volumes of data used required for the processing of the complex security rules. This inability to process these complex rules sets and the limitations of on-device based applications restricts the ability of today's applications to better protect the end customer, thus leaving the consumer unprotected and vulnerable. Computing of the full known threat control system data base, or multiple threat control system databases is done off-line. An example of where the threats data base or data bases could be processed is within a cloud environment. These third party databases would contain known data on BOTNETS, ADWARE, DDOS, MALWARE, Privacy Intrusion, firewalling, parental control etc. Multiple matching tupels of data will be identified and forwarding rules set which ensure traffic generated within the home is not sent to destinations on the internet. In addition the threat control system will interface to multiple sources of threats to ensure that it remains up-to-date on the latest security threat incarnations that are taking place on the internet.

In addition where DDOS attacks are being generated to a known destination on the internet flow based control can be used to granularly eliminate the attack flows from the traffic traversing the network. Today destinations under attack tend to have to deal with the attack by taking the site offline or by utilising high end and costly hardware which is difficult to effectively scale. In effect the solutions known heretofore deliver to the attacker the desired effect as the company hosting the site is put under considerable pressure and in many cases has to withdraw the site form visibility on the internet to relieve itself from the attack.

Figure 23:
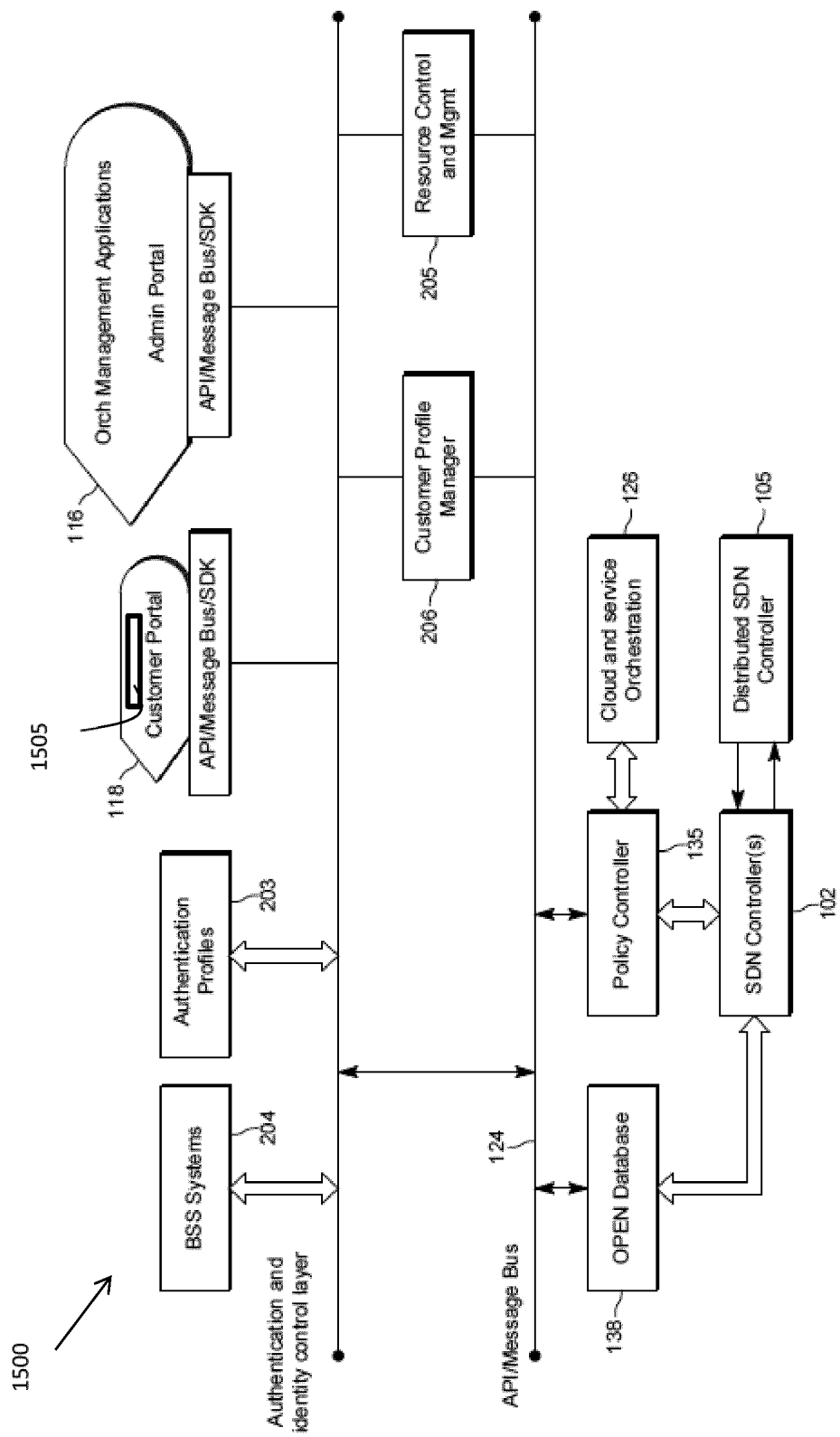
FIG. 23 is a block diagram illustrating another exemplary SDN platform in accordance with the present teaching.

Referring to FIG. 23 there is illustrated another SDN platform 1500 which is also in accordance with the present teaching. The SDN platform 1500 is substantially similar to the SDN platform 200 or 100 and like components are indicated by similar reference numerals. The main difference is that the customer portal 118 includes an input module 1505 operable to receive data associated with a device during installation of the device to a SDN network. The input module 1505 is configured to receive data such as brand type; serial number; MAC address; text data; alphanumeric data; image data; etc which is associated with the device being installed on the SDN network. The data received via the input module 1505 is used to validate the device during installation to ensure that it is safe to install the device on network. The SDN platform 1500 includes one or more modules operable to receive data associated with the device during installation; validate the device using the received data; provide a master SDN controller for controlling the SDN network; generate a co-controller by a master SDN controller containing device validation data; dispatch the co-controller to the device during installation; and control installation of the device to the software defined network based on the device validation data. The SDN platform 1500 may operate as a network controller for a software defined network (SDN).

The device validation data may include machine readable instructions for denying the device access to one or more services associated with the SDN network. Alternatively; the device validation data may include machine readable instruction for allowing the device access to one or more services associated with the SDN network. In one example; the device validation data includes machine instructions for powering off the device. In another example; the device validation data includes machine readable instructions for preventing the exchange of data from the device to the SDN network.

The step of validating the device may comprise comparing the brand type against pre-stored brand type data. Alternatively; validating the device may comprise comparing the model type against pre-stored model type data. In one example; validating the device comprises comparing the model serial number against prestored serial number data. In another example; validating the device comprises comparing the MAC address against pre-stored MAC address data. The pre-stored data may be stored in the database 138; for example.

In an exemplary arrangement; the co-controller 105 may limit access to at least some services if a positive match is not determined during the brand data comparison. Alternatively; the co-controller 105 may limit access to at least some services if a positive match is not determined during the model data comparison. In one example; the co-controller 105 may limit access to at least some services if a positive match is not determined during the serial data comparison. In another example; the co-controller 105 may limit access to at least some services if a positive match is not determined during the MAC address data comparison.

In an exemplary arrangement; the geo-location of the device 104 being installed is recorded. The step of validating the device may include comparing the recorded geo-location against pre-stored geo location data. The co-controller 105 may limits access to at least some services if a positive match is not determined during the geo-location comparison.

The SDN platform 1505 facilitates on-premises provisioning support of consumer infrastructure. The input module 1505 facilitates a consumer in supplying accurate information to ensure that an internet service provider (ISP) is properly and fully informed as to the CPE device make, model, brand, version, etc. This data which is input by the user while installing the device to the network is transmitted back to the ISP orchestration solution to permit the device and/or customer to be validated. The information which is input by the user may include an identification of CPE firmware and configuration which enables the appropriate firmware and configuration to be pushed out to the CPE 104 vy the co-controller 105 to best serve the consumers environment for internet connectivity.

Figure 24:
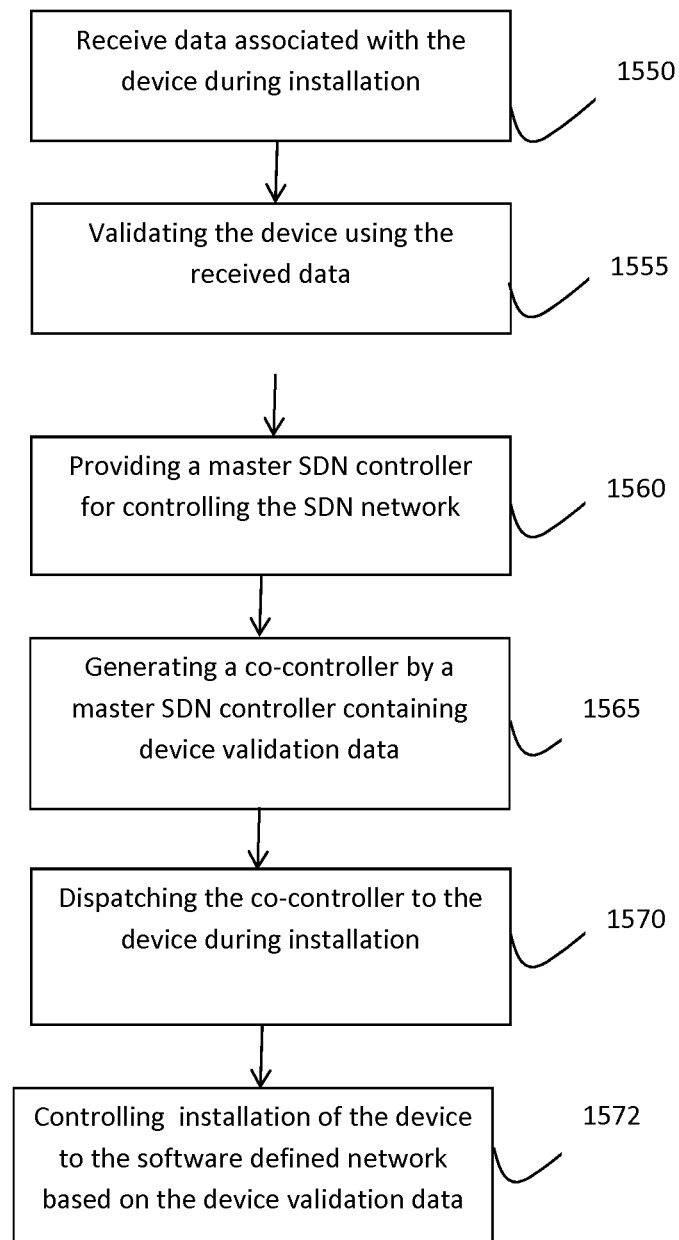
FIG. 24 is a flow chart illustrating exemplary steps implemented by the SDN platform of FIG. 23.

FIG. 24 illustrates exemplary steps for implementing installation control on an SDN network using the SDN platform 1500. Block 1550 receives data associated with a device 1702 during installation to the SDN network. The device is validated using the received data; block 1555. A master SDN controller 102 is provided for controlling the SDN network; block 1560. A co-controller 105 is generated by the master SDN controller 102 containing device validation data. The co-controller 105 is dispatched by the master controller 102 to the device during installation; block 1570. The installation of the device to the software defined network is controlled based on the device validation data; block 1572.

Figure 25:
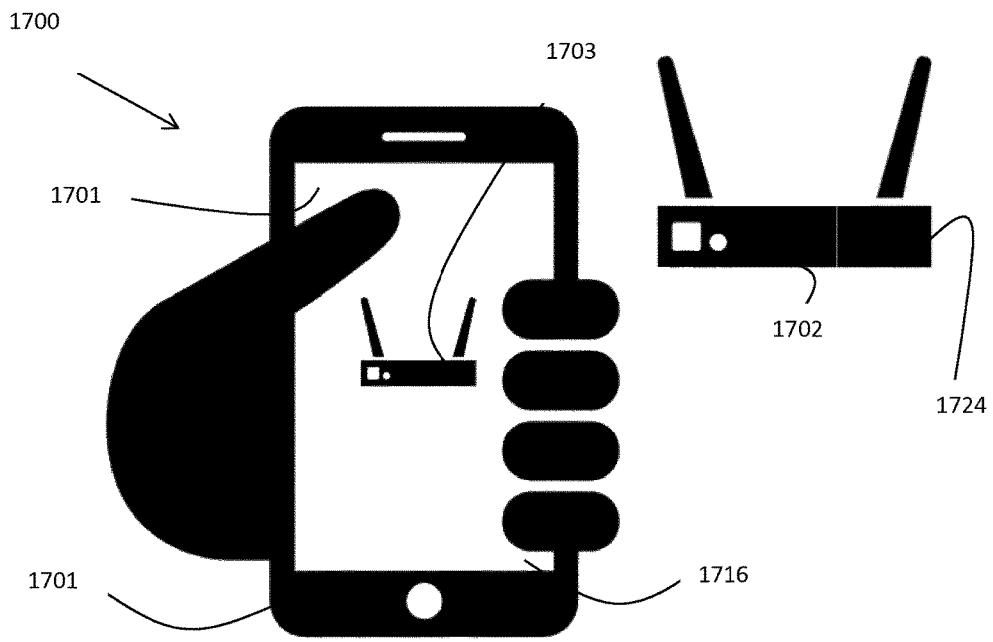
FIG. 25 illustrates details of the SDN platform of FIG. 23.
Figure 26:
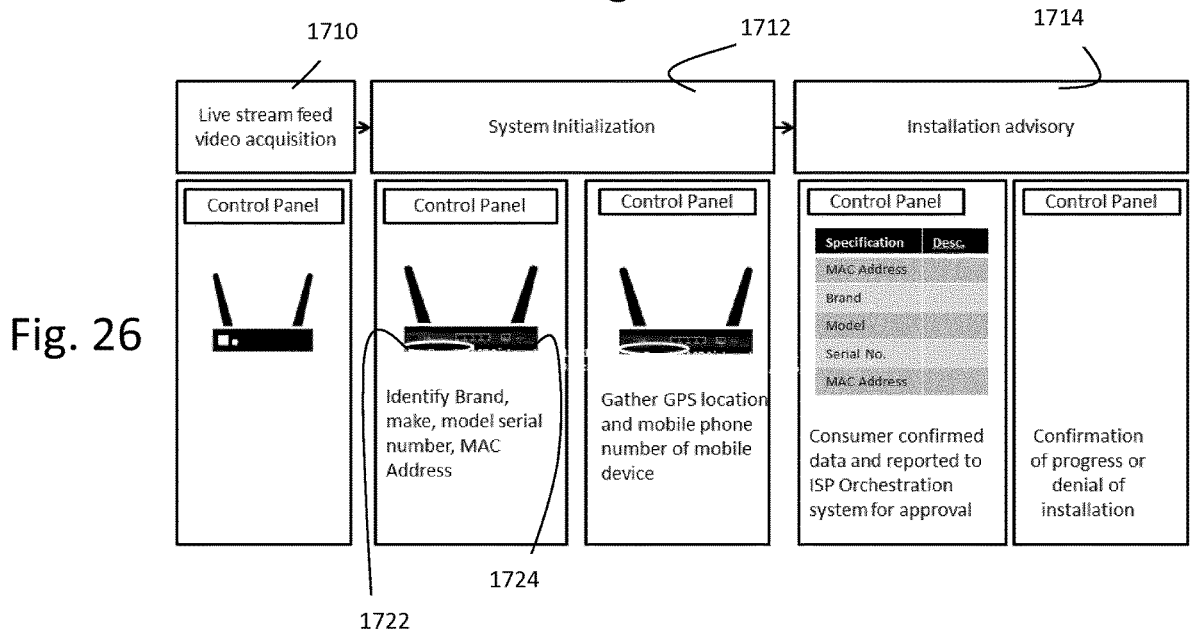
FIG. 26 illustrates details of the SDN platform of FIG. 23.

FIGS. 25 and 26 illustrate further details of the SDN platform 1500 which is configured for controlling access of devices 1702 to an SDN network. FIG. 25 illustrates a client device such as a smart phone 1701 which has an image capture device for capturing video streams. It is not intended to limit the input data to image data as other forms of data may be used such as but not limited to text data; alphanumeric data; numeric data; voice data, sensor data. In the exemplary arrangement; the image capture device of the smart phone 1701 is used to scan the device 1702 and generate a video feed containing a visual representation 1703 of the networked device 1702. The video stream captured by the smart phone 1701 is analysed to determined if the device 1702 should be permitted to have access to the network. The system 1700 includes a live video stream acquisition mode 1710, a system initialization mode 1712 and an installation advisory mode in 1714. In the live video stream acquisition mode 1710, the user turns on the camera on the mobile device 1701. A live video stream of the CPE 1702 is obtained and presented on a display 1716. In the system initialization mode 1712, the display 1714 shows indicia 1722 to guide the CPE 1702 to be placed in a predetermined manner in order to visually capture CPE data provided on a casing 1724. The captured CPE data may include but not limited to brand type, model serial number, Mac address, etc. The captured data is analysed by the master controller 102 which determines whether the device 1702 should be permitted access to the network or denied access. When analysis is completed the consumer is advised in the installation advisory mode if the device 1702 is permitted or denied access to the network.

Figure 27:
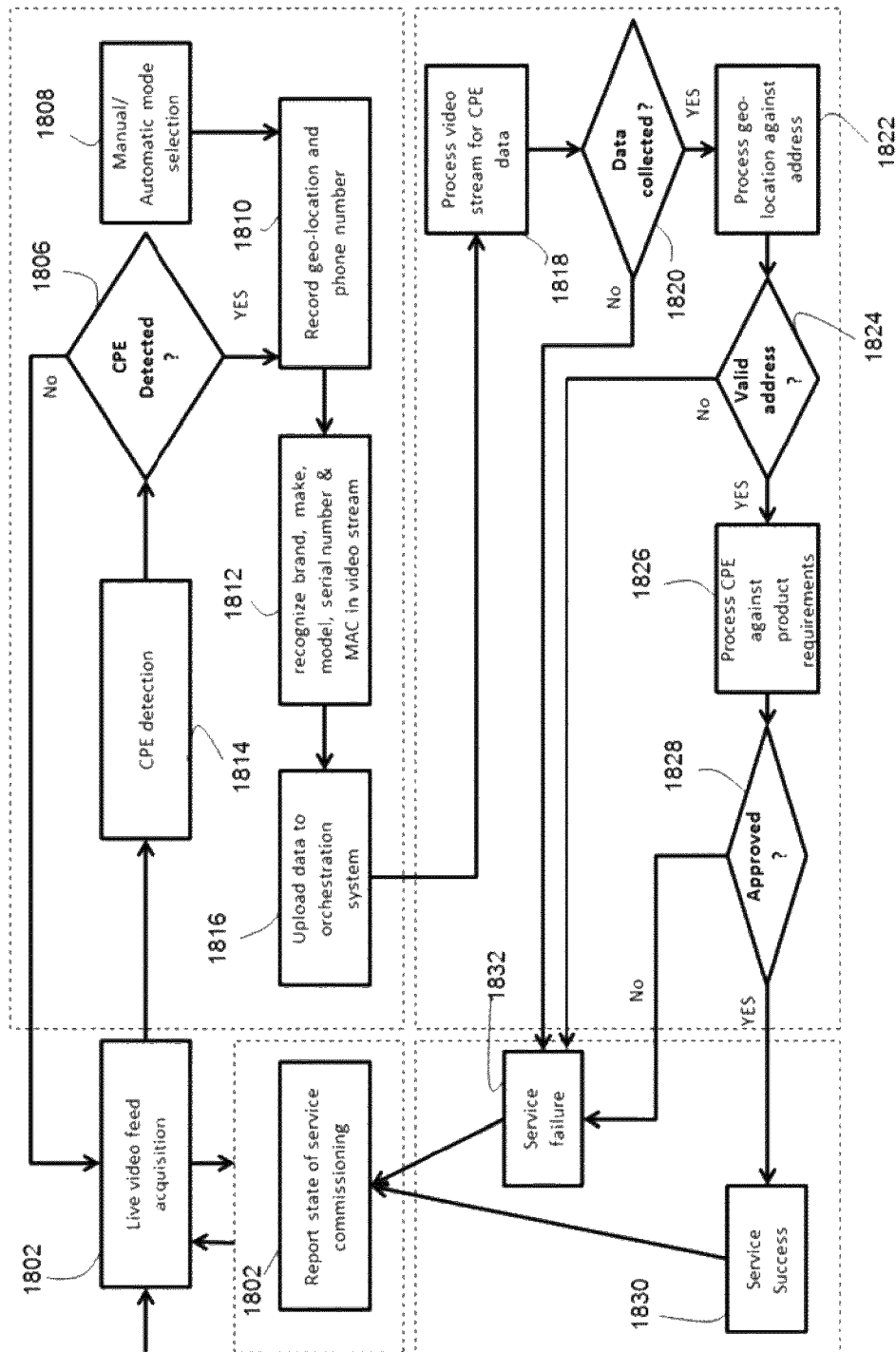
FIG. 27 illustrates a flow chart detailing exemplary steps implemented by the SDN platform of FIG. 23.

Referring now to the flow chart of FIG. 27 which illustrates exemplary steps implemented by the system 1700. The mobile device 1701 acquires a video stream of CPE 1702, block 1802. A provisioning app is installed on the smart phone 1701 and is operable to visually analyse the captured video stream to detect the CPE 1702, block 1814. If the CPE 1702 is not detected, block 1806, the process returns to block 1802. The provisioning app may have a manual mode or an automatic mode for capturing CPE data, block 1808. When the automatic mode is selected the provisioning app automatically detects CPE contours and determines the key features of the device 1702. If the manual mode is selected, indicia are provided on the display as guides to instruct the user to move the CPE 1702 to a predetermined position on the display 1716. The provisioning app records the geo-location and/or phone associated with the CPE 1702, block 1810. CPE data is extracted from the video stream or input manually by a user. The CPE data may include but not limited to brand type, make, model, serial number, MAC number, bock 1812. The CPE data in the exemplary embodiment is provided on the outer casing of the CPE 1702. The CPE data is uploaded to the database 138 of the SDN platform 1500, block 1816. The video stream may be processed using a back end image processing module, block 1818. The CPE data is collected, block 1820. The collected geo-location data of the CPE 1702 is processed against a pre-stored valid geo-address data, block 1822. If the collected geo-location address is not valid, the master controller 102 prevents the CPE 1702 from accessing services over the SDN platform 1500. One or more co-controllers 105 may be installed on the CPE 1702 which together with the master controller 105 control access to the SDN network. If the geo-location is deemed valid, block 1826 processes the CPE data against predetermined product requirements. The product requirements may include but not limited to brand type, make, model, serial number, MAC number. The processed CPE data is either approved or rejected, block 1828. If the CPE data is approved the CPE 1702 is permitted to access services over the network. If the CPE data is not approved, the CPE 1702 is prevented from accessing services, 1832.

Figure 28:
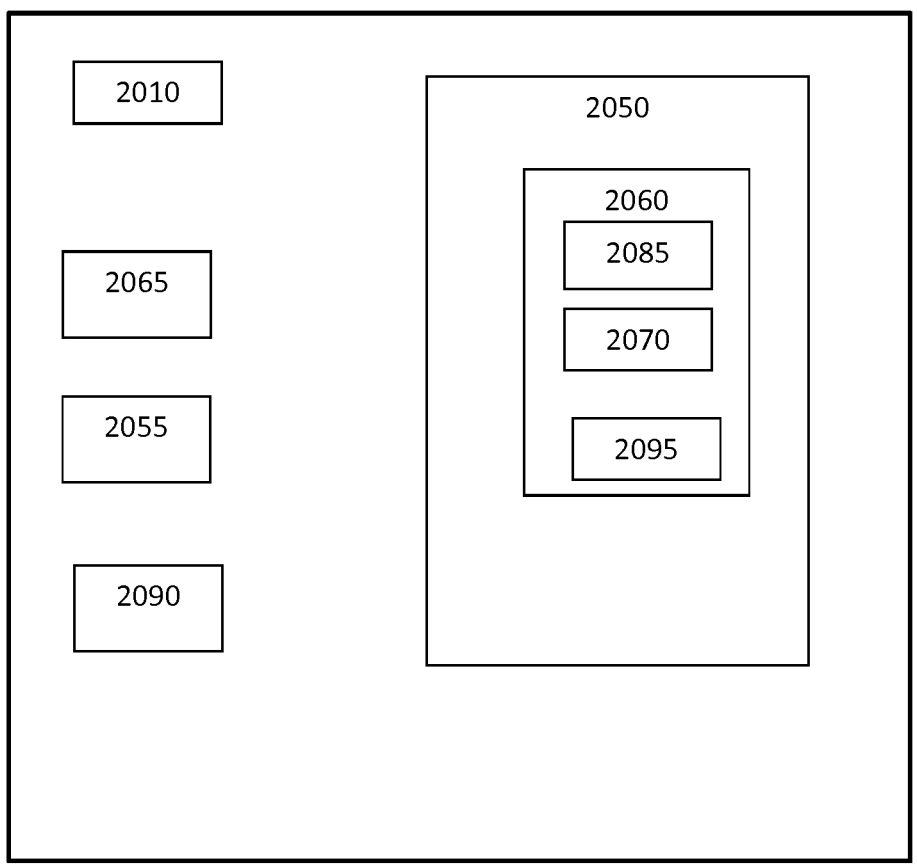
FIG. 28 illustrates a block diagram of an exemplary client device.

FIG. 28 is a block diagram illustrating a configuration of an exemplary smart phone 1701. The smart phone 1701 includes various hardware and software components that function to perform the methods according to the present disclosure. The smart phone 1701 comprises a user interface 2050, a processor 2055 in communication with a memory 2060, and a communication interface 2065. The processor 2055 functions to execute software instructions that can be loaded and stored in the memory 2060. The processor 2055 may include a number of processors, a multi-processor core, or some other type of processor, depending on the particular implementation. The memory 2060 may be accessible by the processor 2055, thereby enabling the processor 2055 to receive and execute instructions stored on the memory 2060. The memory 2060 may be, for example, a random access memory (RAM) or any other suitable volatile or non-volatile computer readable storage medium. In addition, the memory 2060 may be fixed or removable and may contain one or more components or devices such as a hard drive, a flash memory, a rewritable optical disk, a rewritable magnetic tape, or some combination of the above.

One or more software modules 2070 may be encoded in the memory 2060. The software modules 2070 may comprise one or more software programs or applications having computer program code or a set of instructions configured to be executed by the processor. Such computer program code or instructions for carrying out operations for aspects of the systems and methods disclosed herein may be written in any combination of one or more programming languages.

The software modules 2070 may include provisioning app 2010 and one or more modules configured to be executed by the processor 2055. During execution of the software modules 2070, the processor 2055 configures the smart phone 1701 to perform various operations relating to determining an optimum position for an electronic device according to embodiments of the present disclosure.

Other information and/or data relevant to the operation of the present systems and methods, such as a database 2085, may also be stored on the memory 2060. The database 2085 may contain and/or maintain various data items and elements that are utilized throughout the various operations of the provisioning application 2010. It should be noted that although the database 2085 is depicted as being configured locally to the smart phone 1701, in certain implementations the database 2085 and/or various other data elements stored therein may be located remotely. Such elements may be located on a remote device or server—not shown, and connected to the smart phone through a network in a manner known to those skilled in the art, in order to be loaded into a processor and executed.

Further, the program code of the software modules 2070 and one or more computer readable storage devices (such as the memory 2060) form a computer program product that may be manufactured and/or distributed in accordance with the present disclosure, as is known to those of skill in the art.

The communication interface 2065 is also operatively connected to the processor 2055 and may be any interface that enables communication between the smart phone 1701 and external devices, machines and/or elements. The communication interface 2065 is configured for transmitting and/or receiving data. For example, the communication interface 2065 may include but is not limited to a Bluetooth, or cellular transceiver, a satellite communication transmitter/receiver, an optical port and/or any other such, interfaces for wirelessly connecting the smart phone 1701 to a server or other devices.

The user interface 2050 is also operatively connected to the processor 2055. The user interface may comprise one or more input device(s) such as switch(es), button(s), key(s), and a touchscreen. The user interface 2050 functions to allow the entry of data. The user interface 2050 functions to facilitate the capture of commands from the user such as an on-off commands or settings related to operation of the above-described method.

The display 1716 is operatively connected to the processor 2055. The display 1716 may include a screen or any other such presentation device that enables the user to view the video stream and/or an indicia overlay. The display 1716 may be a digital display such as an LED display. The user interface 2050 and the display 1716 may be integrated into a touch screen display. The operation of the smart phone 1701 and the various elements and components described above will be understood by those skilled in the art with reference to the method and system for control access to a network.

Figure 29:
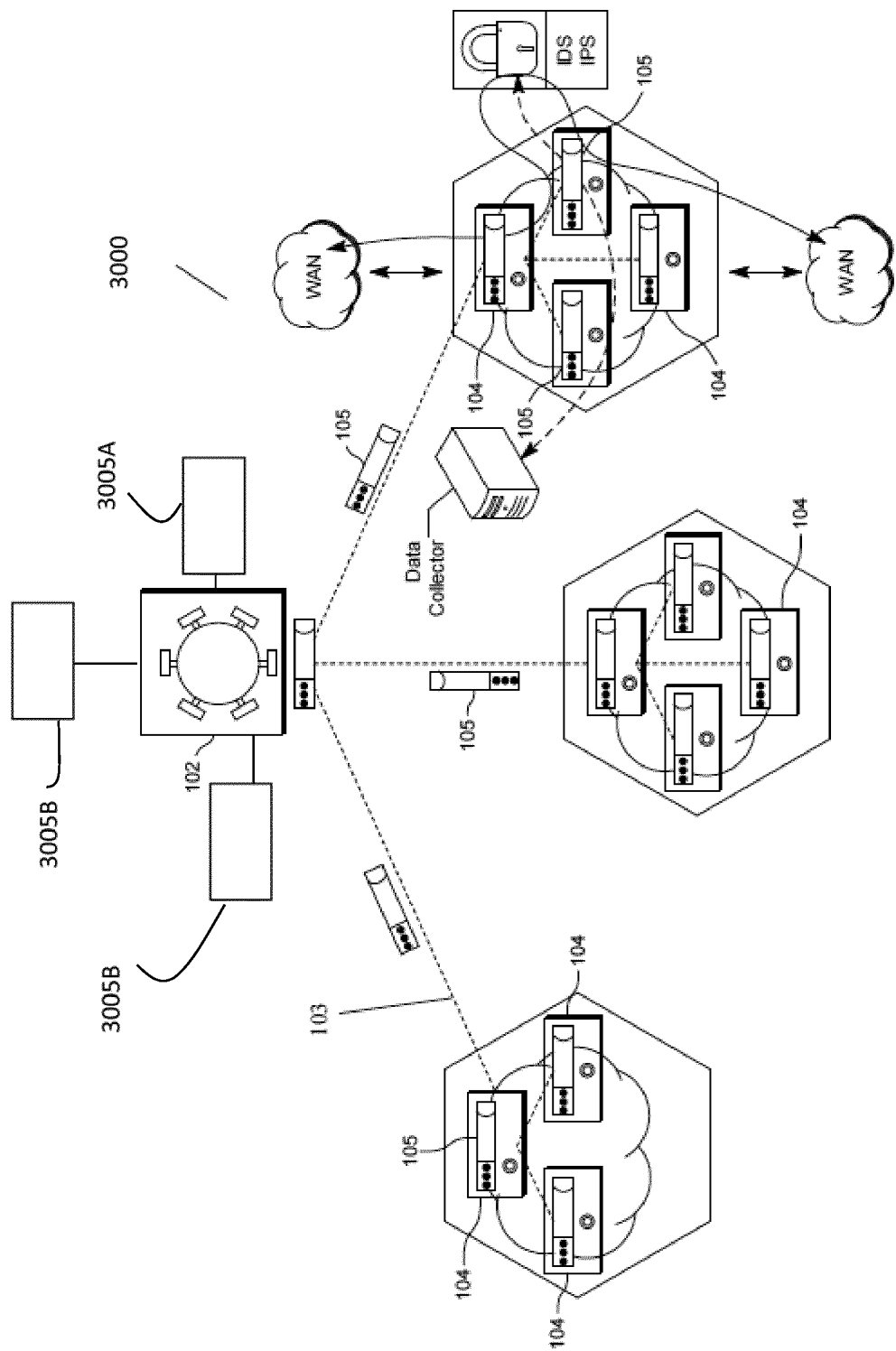
FIG. 29 is a block diagram illustrating another exemplary SDN platform in accordance with the present teaching.

Referring now to the FIG. 29 there is illustrated another SDN platform 3000 which is also in accordance with the present teaching. The SDN platform 3000 is substantially similar to the SDN platform 100 or 200 and like components are indicated by similar reference numerals. The main difference is that the SDN platform 3000 includes sensors 3005A, 3005B and 3005C which sense environmental stimulus which is relayed to the master SDN controller 102 and is used by the master controller 102 to control the devices 104 via the distributed co-controllers 105. The SDN platform 3000 provides a method for controlling the devices 104 in response to environmental data. The sensors 3005A, 3005B, 3005C may be operable to sense one or more of temperature data; atmospheric pressure; moisture data; gas data; airborne pollutants data; radiation data; water quality data; audio noise data; electrical noise data; electromagnetic data; hazardous data; lighting data; chemical data; smoke detection data; pressure data; fire detection data; audio data and PH data. While three sensors are illustrated it is not intended to limit the present teaching to a particular number of sensors. It is envisaged that any desired number of sensors may be used. The environmental data may be associated with an area in which the device is located. The area may include for example but not limited to a room; a zone; a volume; and a space. In one example, the sensors are provided in an hollow interior region of a device housing.

The environmental data is communicated to the master SDN controller 104 from the sensors 3005A-3005C. Any suitable mode of communicating the environmental data from the sensors 3005A-3005C to the master controller 102 may be used, such as Bluetooth, or cellular transceiver, a satellite communication transmitter/receiver, an optical port and/or any other such, communication interface as will be understood by those skilled in the art.

Figure 30:
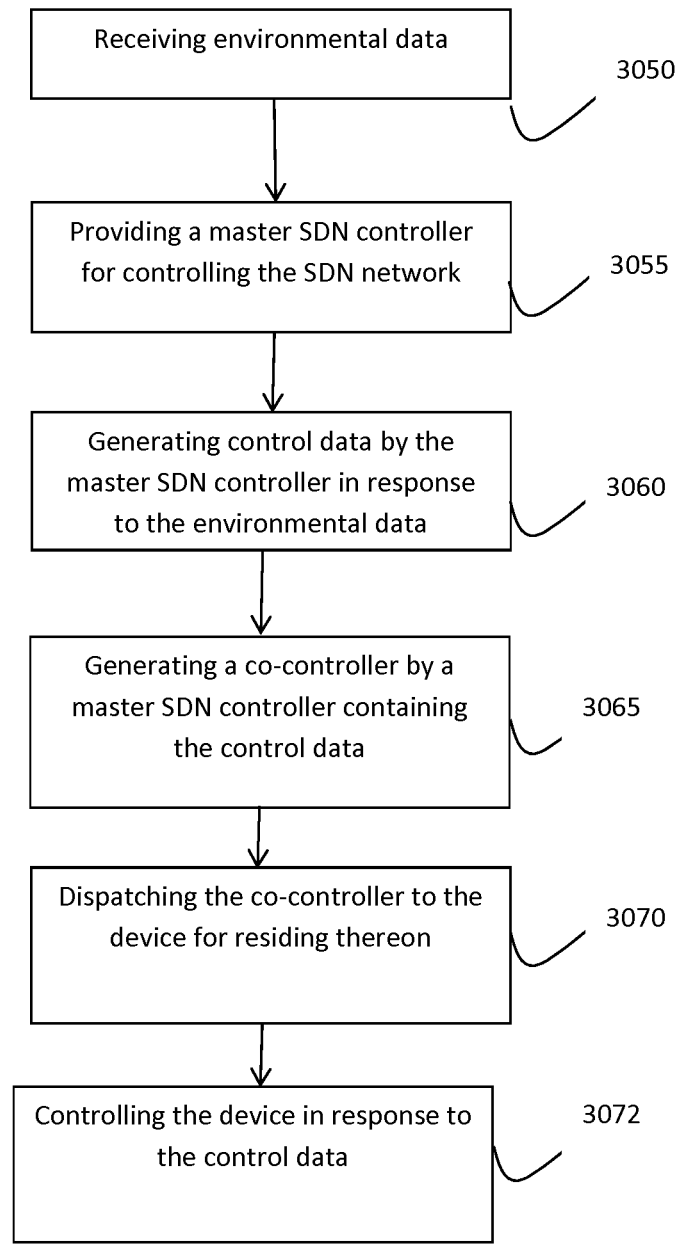
FIG. 30 illustrates a flow chart detailing exemplary steps implemented by the SDN platform of FIG. 29.

Referring now to the flow chart of FIG. 30 which illustrates exemplary steps implemented by the platform 3000. Environmental data is received by the master controller 102; block 3050. The master SDN controller is operable for controlling the SDN network; block 3055. Control data is generated by the master SDN controller in response to the environmental data; block 3060. A co-controller 105 is generated by a master SDN controller 102 containing the control data; block 3065. The co-controller 105 is dispatched to the device for residing thereon; block 3070. The device 104 is controlled in response to the control data; 3072.

The techniques introduced here can be embodied as special purpose hardware (e.g. circuitry), or as programmable circuitry appropriately programmed with software and/or firmware, or as a combination of special-purpose and programmable circuitry. Hence various embodiments may include a machine-readable medium having stored thereon instructions which may be used to program a computer (or other electronic devices) to perform a process. The machine readable medium may include, but is not limited to, optical disks, compact disk read-only memories (CD-ROMs), and magneto-optical disk, ROMs, erasable programmable read-only memories (EPROMs), electrically erasable programmable read-only memories (EEPROMs), magnetic or optical cards, flash memory, Solid State Drives (SSDs) or other type of media/machine-readable medium suitable for storing electronic instructions.

It will be understood that what has been described herein is an exemplary system for controlling an SDN network. While the present teaching has been described with reference to exemplary arrangements it will be understood that it is not intended to limit the teaching to such arrangements as modifications can be made without departing from the spirit and scope of the present teaching.

It will be understood that while exemplary features of a system in accordance with the present teaching have been described that such an arrangement is not to be construed as limiting the invention to such features. The method of the present teaching may be implemented in software, firmware, hardware, or a combination thereof. In one mode, the method is implemented in software, as an executable program, and is executed by one or more special or general purpose digital computer(s), such as a personal computer (PC; IBM-compatible, Apple-compatible, or otherwise), personal digital assistant, workstation, minicomputer, or mainframe computer. The steps of the method may be implemented by a server or computer in which the software modules reside or partially reside.

Generally, in terms of hardware architecture, such a computer will include, as will be well understood by the person skilled in the art, a processor, memory, and one or more input and/or output (I/O) devices (or peripherals) that are communicatively coupled via a local interface. The local interface can be, for example, but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the other computer components.

The processor(s) may be programmed to perform the functions of the method for controlling an SDN network. The processor(s) is a hardware device for executing software, particularly software stored in memory. Processor(s) can be any custom made or commercially available processor, a primary processing unit (CPU), an auxiliary processor among several processors associated with a computer, a semiconductor based microprocessor (in the form of a microchip or chip set), a macro-processor, or generally any device for executing software instructions.

Memory is associated with processor(s) and can include any one or a combination of volatile memory elements (e.g., random access memory (RAM, such as DRAM, SRAM, SDRAM, etc.)) and non-volatile memory elements (e.g., ROM, hard drive, tape, CDROM, etc.). Moreover, memory may incorporate electronic, magnetic, optical, and/or other types of storage media. Memory can have a distributed architecture where various components are situated remote from one another, but are still accessed by processor(s).

The software in memory may include one or more separate programs. The separate programs comprise ordered listings of executable instructions for implementing logical functions in order to implement the functions of the modules. In the example of heretofore described, the software in memory includes the one or more components of the method and is executable on a suitable operating system (O/S).

The present disclosure may include components provided as a source program, executable program (object code), script, or any other entity comprising a set of instructions to be performed. When a source program, the program needs to be translated via a compiler, assembler, interpreter, or the like, which may or may not be included within the memory, so as to operate properly in connection with the O/S. Furthermore, a methodology implemented according to the teaching may be expressed as (a) an object oriented programming language, which has classes of data and methods, or (b) a procedural programming language, which has routines, subroutines, and/or functions, for example but not limited to, C, C++, Pascal, Basic, Fortran, Cobol, Perl, Java, and Ada.

When the method is implemented in software, it should be noted that such software can be stored on any computer readable medium for use by or in connection with any computer related system or method. In the context of this teaching, a computer readable medium is an electronic, magnetic, optical, or other physical device or means that can contain or store a computer program for use by or in connection with a computer related system or method. Such an arrangement can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this disclosure, a "computer-readable medium" can be any means that can store, communicate, propagate, or transport the program for use by or in connection with the instruction execution system, apparatus, or device. The computer readable medium can be for example, but not limited to, an electronic, magnetic, optical, electromagnetic, infrared, or semiconductor system, apparatus, device, or propagation medium. Any process descriptions or blocks in the Figures, should be understood as representing modules, segments, or portions of code which include one or more executable instructions for implementing specific logical functions or steps in the process, as would be understood by those having ordinary skill in the art.

The above detailed description of embodiments of the disclosure is not intended to be exhaustive nor to limit the disclosure to the exact form disclosed. While specific examples for the disclosure are described above for illustrative purposes, those skilled in the relevant art will recognize various modifications are possible within the scope of the disclosure. For example, while processes and blocks have been demonstrated in a particular order, different implementations may perform routines or employ systems having blocks, in an alternate order, and some processes or blocks may be deleted, supplemented, added, moved, separated, combined, and/or modified to provide different combinations or sub-combinations. Each of these processes or blocks may be implemented in a variety of alternate ways. Also, while processes or blocks are at times shown as being performed in sequence, these processes or blocks may instead be performed or implemented in parallel or may be performed at different times. The results of processes or blocks may be also held in a non-persistent store as a method of increasing throughput and reducing processing requirements.

In general, the terms used in the following claims should not be construed to limit the disclosure to the specific examples disclosed in the specification, unless the above detailed description explicitly defines such terms. Accordingly, the actual scope of the disclosure encompasses not only the disclosed examples, but also all equivalent ways of practicing or implementing the disclosure under the claims.

From the foregoing, it will be appreciated that specific embodiments of the disclosure have been described herein for purposes of illustration, but that various modifications may be made without deviating from the spirit and scope of the disclosure. Accordingly the disclosure is not limited.

The invention claimed is:

1. A computer implemented method for controlling a device plurality of networked devices on a software defined network (SDN) in response to environmental data; the method comprising:
receiving input from one or more users via one or more client portals, the client portals being configured for facilitating user control of the networked devices;
receiving environmental data;
providing a master SDN controller for controlling the SDN, the master SDN controller being operable to generate routing data for the networked devices;
generating control data by the master SDN controller in response to the environmental data;
generating configuration data based on the input received from the one or more users;
generating by the master SDN controller a plurality of discrete SDN co-controllers each associated with a particular one of the one or more users; each SDN co-controller including the generated configuration data and the generated routing data for an associated one of the networked devices;
dispatching the SDN co-controllers by the master SDN controller to the networked devices associated with the respective end users for controlling thereof;
installing the SDN co-controllers on the networked devices;
registering the installed SDN co-controllers with the master SDN controller for controlling the routing of data from the networked devices and for controlling the configuration of the networked devices; and
controlling the networked devices in response to the control data.

2. The method of claim 1, wherein the environmental data is provided by one or more sensors.

3. The method of claim 1, wherein the environmental data comprises temperature data.

4. The method of claim 1, wherein the environmental data comprises atmospheric pressure data.

5. The method of claim 1, wherein the environmental data comprises moisture data.

6. The method of claim 1, wherein the environmental data comprises gas data.

7. The method of claim 1, wherein the environmental data comprises airborne pollutants data.

8. The method of claim 1, wherein the environmental data comprises radiation data.

9. The method of claim 1, wherein the environmental data comprises water quality data.

10. The method of claim 1, wherein the environmental data comprises audio noise data.

11. The A method of claim 1, wherein the environmental data comprises electrical noise data.

12. The A method of claim 1, wherein the environmental data comprises electromagnetic data.

13. The method of claim 1, wherein the environmental data comprises hazardous data.

14. The method of claim 1, wherein the environmental data comprises lighting data.

15. The method of claim 1, wherein the environmental data comprises chemical data.

16. The method of claim 1, wherein the environmental data comprises smoke detection data.

17. The method of claim 1, wherein the environmental data comprises pressure data.

18. The method of claim 1, wherein the environmental data comprises fire detection data.

19. The method of claim 1, wherein the environmental data comprises audio data.

20. The method of claim 1, wherein the environmental data is associated with area in which the device is located.

21. The A method of claim 1, wherein the environmental data is provided in a machine readable format.

22. A network controller for a software defined network (SDN), the network controller comprising one or more modules operable to:
- receive input from one or more users via one or more client portals, the client portals being configured for facilitating user control of a plurality of networked devices on the SDN;
- receive environmental data;
- provide a master SDN controller for controlling the SDN, the master SDN controller being operable to generate routing data for the networked devices;
- generate control data by the master SDN controller in response to the environmental data;
- generate configuration data based on the input received from the one or more users;
- generate by the master SDN controller a plurality of discrete SDN co-controllers each associated with a particular one of the one or more users; each SDN co-controller including the generated configuration data and the generated routing data for an associated one of the networked devices;
- dispatch the SDN co-controllers by the master SDN controller to the networked devices associated with the respective end users for controlling thereof;
- install the SDN co-controllers on the networked devices;
- register the installed SDN co-controllers with the master SDN controller for controlling the routing of data from the networked devices and for controlling the configuration of the networked devices; and
- control the networked devices in response to the control data.

23. An article of manufacture comprising a processor-readable medium having embodied therein executable program code that when executed by a processing device causes the processing device to perform:
- receiving input from one or more users via one or more client portals, the client portals being configured for facilitating user control of the networked devices;
- receiving environmental data;
- providing a master SDN controller for controlling the SDN, the master SDN controller being operable to generate routing data for the networked devices;
- generating control data by the master SDN controller in response to the environmental data;
- generating configuration data based on the input received from the one or more users;
- generating by the master SDN controller a plurality of discrete SDN co-controllers each associated with a particular one of the one or more users; each SDN co-controller including the generated configuration data and the generated routing data for an associated one of the networked devices;
- dispatching the SDN co-controllers by the master SDN controller to the networked devices associated with the respective end users for controlling thereof;
- installing the SDN co-controllers on the networked devices;
- registering the installed SDN co-controllers with the master SDN controller for controlling the routing of data from the networked devices and for controlling the configuration of the networked devices; and
- controlling the networked devices in response to the control data.

* * * * *